(12) United States Patent
Cho et al.

(10) Patent No.: US 11,996,865 B2
(45) Date of Patent: May 28, 2024

(54) DATA STORAGE DEVICE

(71) Applicant: SK hynix Inc., Gyeonggi-do (KR)

(72) Inventors: Kyoung Lae Cho, Gyeonggi-do (KR);
Soo Jin Kim, Gyeonggi-do (KR);
Naveen Kumar, San Jose, CA (US);
Aman Bhatia, San Jose, CA (US);
Yi-Min Lin, San Jose, CA (US);
Chenrong Xiong, San Jose, CA (US);
Fan Zhang, Fremont, CA (US); Yu Cai, San Jose, CA (US); Abhiram Prabahkar, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/185,163

(22) Filed: Mar. 16, 2023

(65) Prior Publication Data

US 2023/0231579 A1 Jul. 20, 2023

Related U.S. Application Data

(63) Continuation of application No. 16/987,977, filed on Aug. 7, 2020, now Pat. No. 11,611,359, which is a
(Continued)

(30) Foreign Application Priority Data

May 29, 2015 (KR) .................. 10-2015-0076165
Sep. 25, 2015 (KR) .................. 10-2015-0136362
Nov. 25, 2016 (KR) .................. 10-2016-0158369

(51) Int. Cl.
*H03M 13/00* (2006.01)
*G06F 3/06* (2006.01)
(Continued)

(52) U.S. Cl.
CPC ...... *H03M 13/3707* (2013.01); *G06F 3/0619* (2013.01); *G06F 3/064* (2013.01);
(Continued)

(58) Field of Classification Search
None
See application file for complete search history.

(56) References Cited

U.S. PATENT DOCUMENTS

| | | | | |
|---|---|---|---|---|
| 4,993,029 A | * | 2/1991 | Galbraith | ......... G11B 20/10009 |
| | | | | 714/769 |
| 2007/0083491 A1 | | 4/2007 | Walmsley et al. | |

(Continued)

OTHER PUBLICATIONS

Final Office Action on the U.S. Appl. No. 17/193, 135 issued by the USPTO dated Sep. 1, 2023.

*Primary Examiner* — Anhtai V Tran
(74) *Attorney, Agent, or Firm* — IP & T GROUP LLP

(57) ABSTRACT

A data processing system includes a storage medium, and a controller including a data processing block, configured to receive data from a host, transmit the received data to the storage medium, read data from the storage medium in response to a read request from the host, and decode the read data by the data processing block according to multiple decoding modes. The data processing block includes a first decoder and a second decoder, and is configured to manage the first decoder and the second decoder to run the decoding for the read data, and activate a fast decoding having shorter latency than a normal decoding after a fast decoding condition is satisfied.

29 Claims, 44 Drawing Sheets

Related U.S. Application Data continuation-in-part of application No. 14/873,975, filed on Oct. 2, 2015, now Pat. No. 11,182,339, and a continuation-in-part of application No. 15/620,909, filed on Jun. 13, 2017, now Pat. No. 10,741,212, and a continuation-in-part of application No. 16/517,144, filed on Jul. 19, 2019, now Pat. No. 11,184,033, which is a continuation of application No. 16/138,512, filed on Sep. 21, 2018, now Pat. No. 10,396,827, which is a continuation-in-part of application No. 15/016,443, filed on Feb. 5, 2016, now Pat. No. 10,102,066, said application No. 16/987,977 is a continuation-in-part of application No. 16/549,930, filed on Aug. 23, 2019, now Pat. No. 11,177,835, which is a continuation-in-part of application No. 15/674,134, filed on Aug. 10, 2017, now Pat. No. 10,432,363, said application No. 16/549,930 is a continuation-in-part of application No. 15/607,260, filed on May 26, 2017, now Pat. No. 10,419,024, and a continuation-in-part of application No. 16/517,144, filed on Jul. 19, 2019, now Pat. No. 11,184,033.

(60) Provisional application No. 62/374,692, filed on Aug. 12, 2016.

(51) Int. Cl.
- *G06F 11/10* (2006.01)
- *H03M 13/37* (2006.01)
- *H03M 13/11* (2006.01)

(52) U.S. Cl.
CPC .......... *G06F 3/0659* (2013.01); *G06F 3/0679* (2013.01); *G06F 11/1048* (2013.01); *G06F 11/1076* (2013.01); *H03M 13/1108* (2013.01); *H03M 13/1111* (2013.01)

(56) References Cited

U.S. PATENT DOCUMENTS

| | | | |
|---|---|---|---|
| 2008/0123979 A1 | 5/2008 | Schoner | |
| 2011/0219284 A1* | 9/2011 | Uchikawa | H03M 13/05 714/763 |
| 2011/0311002 A1* | 12/2011 | Li | H03M 13/1111 375/341 |
| 2012/0272017 A1* | 10/2012 | Lee | G11C 7/1006 711/E12.001 |
| 2012/0287719 A1 | 11/2012 | Mun et al. | |
| 2015/0169406 A1* | 6/2015 | Li | G06F 11/1012 714/763 |
| 2016/0292426 A1 | 10/2016 | Gibart et al. | |

\* cited by examiner

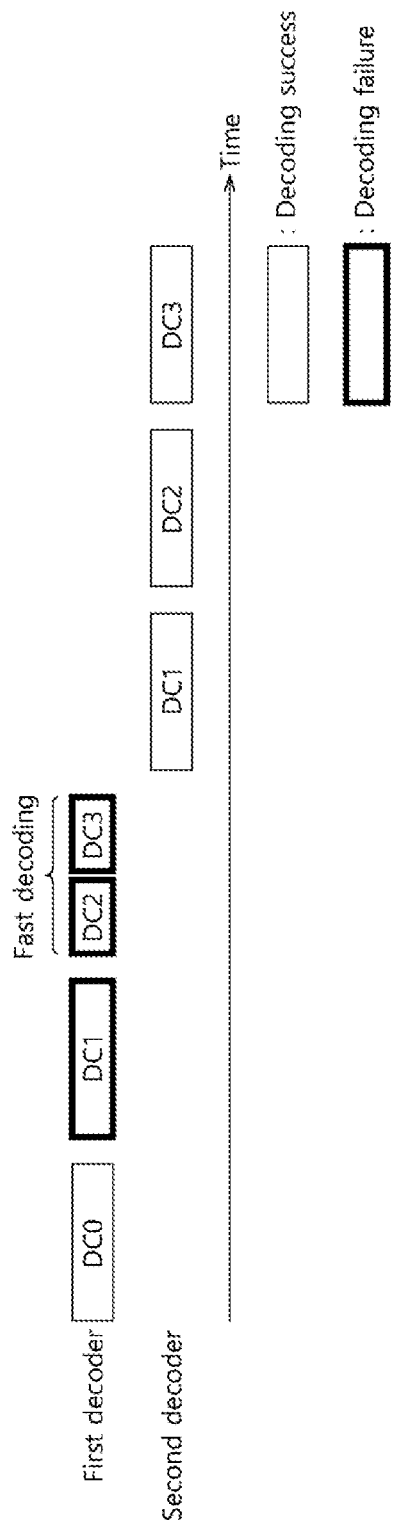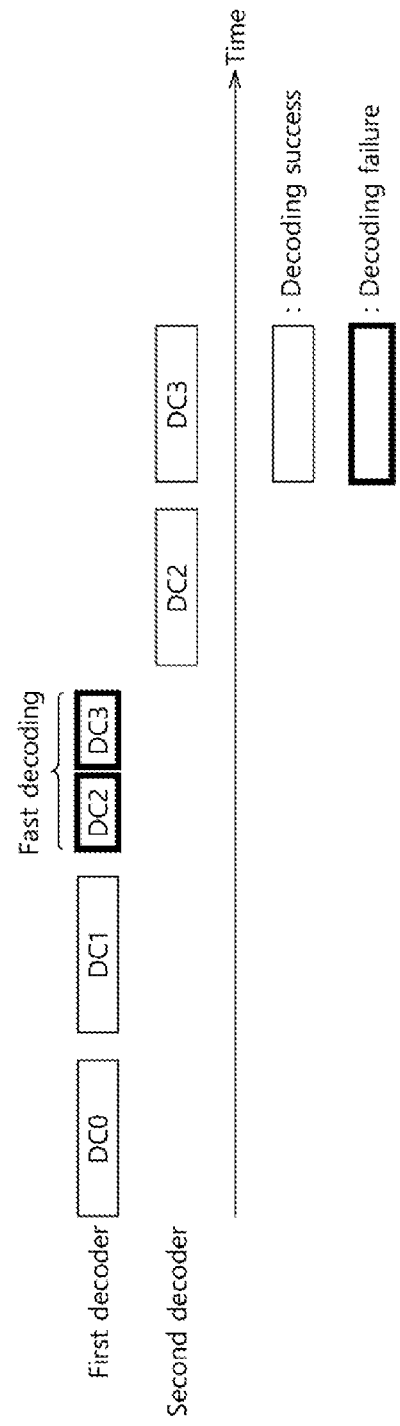

FIG. 29

| ITERATIVE OPERATION STEPS (CLOCK CYCLE) | BIT VALUES OF INPUTTED ORIGINAL DATA | LFSR (311D) | LFSR (312D) | LFSR (313D) | LFSR (314D) | LFSR (315D) | LFSR (316D) | LFSR (317D) | LFSR (318D) | FEEDBACK DATA |
|---|---|---|---|---|---|---|---|---|---|---|
| STEP 1 | 0 | 0 | 0 | 0 | 0 | 0 | 0 | 0 | 0 | 0 |
| STEP 2 | 1 | 0 | 0 | 0 | 0 | 0 | 0 | 0 | 0 | 0 |
| STEP 3 | 1 | 1 | 1 | 1 | 0 | 1 | 0 | 0 | 0 | 1 |
| STEP 4 | 0 | 1 | 0 | 0 | 1 | 1 | 1 | 0 | 0 | 1 |
| STEP 5 | 1 | 0 | 1 | 0 | 0 | 1 | 1 | 1 | 0 | 0 |
| STEP 6 | 0 | 1 | 1 | 0 | 0 | 1 | 1 | 1 | 1 | 1 |
| STEP 7 | 1 | 0 | 1 | 0 | 0 | 0 | 1 | 1 | 1 | 1 |
|  |  | 1 | 0 | 0 | 0 | 0 | 1 | 1 | 1 | 0 |

FIG. 30

| BIT POSITION | FIRST BIT (MSB) | SECOND BIT | THIRD BIT | FOURTH BIT | FIFTH BIT | SIXTH BIT | SEVENTH BIT (LSB) |
|---|---|---|---|---|---|---|---|
| ARBITRARY VARIABLE | G00 | F00 | E00 | D00 | C00 | B00 | A00 |
| EXAMPLE | 1 | 0 | 1 | 0 | 1 | 1 | 0 |

FIG. 31

| LFSR | XOR-EQUATION |
|---|---|
| LFSR(311D) | 0 |
| LFSR(312D) | 0 |
| LFSR(313D) | 0 |
| LFSR(314D) | 0 |
| LFSR(315D) | 0 |
| LFSR(316D) | 0 |
| LFSR(317D) | 0 |
| LFSR(318D) | 0 |

FIG. 32

| LFSR | XOR-EQUATION (FEEDBACK DATUM=0⊕A00=A00) |
|---|---|
| LFSR(311D) | A00 |
| LFSR(312D) | A00 |
| LFSR(313D) | A00 |
| LFSR(314D) | 0 |
| LFSR(315D) | A00 |
| LFSR(316D) | 0 |
| LFSR(317D) | 0 |
| LFSR(318D) | 0 |

FIG. 33

| LFSR | XOR-EQUATION (FEEDBACK DATUM=0⊕B00=B00) |
|---|---|
| LFSR(311D) | B00 |
| LFSR(312D) | A00 ⊕ B00 |
| LFSR(313D) | A00 ⊕ B00 |
| LFSR(314D) | A00 |
| LFSR(315D) | 0⊕B00 = B00 |
| LFSR(316D) | A00 |
| LFSR(317D) | 0 |
| LFSR(318D) | 0 |

FIG. 34

| LFSR | XOR-EQUATION (FEEDBACK DATUM=0⊕C00=C00) |
|---|---|
| LFSR(311D) | C00 |
| LFSR(312D) | B00 ⊕ C00 |
| LFSR(313D) | A00 ⊕ B00 ⊕ C00 |
| LFSR(314D) | A00 ⊕ B00 |
| LFSR(315D) | A00 ⊕ C00 |
| LFSR(316D) | B00 |
| LFSR(317D) | A00 |
| LFSR(318D) | 0 |

FIG. 35

| LFSR | XOR-EQUATION (FEEDBACK DATUM=0⊕D00=D00) |
|---|---|
| LFSR(311D) | D00 |
| LFSR(312D) | C00 ⊕ D00 |
| LFSR(313D) | B00 ⊕ C00 ⊕ D00 |
| LFSR(314D) | A00 ⊕ B00 ⊕ C00 |
| LFSR(315D) | A00 ⊕ B00 ⊕ D00 |
| LFSR(316D) | A00 ⊕ C00 |
| LFSR(317D) | B00 |
| LFSR(318D) | A00 |

FIG. 36

| LFSR | XOR-EQUATION (FEEDBACK DATUM=A00⊕E00) |
|---|---|
| LFSR(311D) | A00 ⊕ E00 |
| LFSR(312D) | D00 ⊕ A00 ⊕ E00 |
| LFSR(313D) | C00 ⊕ D00 ⊕ A00 ⊕ E00 |
| LFSR(314D) | B00 ⊕ C00 ⊕ D00 |
| LFSR(315D) | A00 ⊕ B00 ⊕ C00 ⊕ A00 ⊕ E00 |
| LFSR(316D) | A00 ⊕ B00 ⊕ D00 |
| LFSR(317D) | A00 ⊕ C00 |
| LFSR(318D) | B00 |

FIG. 37

| LFSR | XOR-EQUATION (FEEDBACK DATUM=B00⊕F00) |
|---|---|
| LFSR(311D) | B00 ⊕ F00 |
| LFSR(312D) | A00 ⊕ E00 ⊕ B00 ⊕ F00 |
| LFSR(313D) | D00 ⊕ A00 ⊕ E00 ⊕ B00 ⊕ F00 |
| LFSR(314D) | C00 ⊕ D00 ⊕ A00 ⊕ E00 |
| LFSR(315D) | B00 ⊕ C00 ⊕ D00 ⊕ B00 ⊕ F00 |
| LFSR(316D) | A00 ⊕ B00 ⊕ C00 ⊕ A00 ⊕ E00 |
| LFSR(317D) | A00 ⊕ B00 ⊕ D00 |
| LFSR(318D) | A00 ⊕ C00 |

FIG. 38

| LFSR | XOR-EQUATION (FEEDBACK DATUM=A00⊕C00⊕G00) |
|---|---|
| LFSR(311D) | A00 ⊕ C00 ⊕ G00 |
| LFSR(312D) | B00 ⊕ F00 ⊕ A00 ⊕ C00 ⊕ G00 |
| LFSR(313D) | A00 ⊕ E00 ⊕ B00 ⊕ F00 ⊕ A00 ⊕ C00 ⊕ G00 |
| LFSR(314D) | D00 ⊕ A00 ⊕ E00 ⊕ B00 ⊕ F00 |
| LFSR(315D) | C00 ⊕ D00 ⊕ A00 ⊕ E00 ⊕ A00 ⊕ C00 ⊕ G00 |
| LFSR(316D) | B00 ⊕ C00 ⊕ D00 ⊕ B00 ⊕ F00 |
| LFSR(317D) | A00 ⊕ B00 ⊕ C00 ⊕ A00 ⊕ E00 |
| LFSR(318D) | A00 ⊕ B00 ⊕ D00 |

FIG. 39

| LFSR | XOR-EQUATION | SIMPLIFIED XOR-EQUATION WITHOUT DUPLICATE VARIABLES | PARITY BIT VALUES (EXAMPLE) |
|---|---|---|---|
| LFSR(311D) | A00 ⊕ C00 ⊕ G00 | A00 ⊕ C00 ⊕ G00 | 0 ⊕ 1 ⊕ 1 = 0 |
| LFSR(312D) | B00 ⊕ F00 ⊕ A00 ⊕ C00 ⊕ G00 | B00 ⊕ F00 ⊕ A00 ⊕ C00 ⊕ G00 | 1 ⊕ 0 ⊕ 0 ⊕ 1 ⊕ 1 = 1 |
| LFSR(313D) | A00 ⊕ E00 ⊕ B00 ⊕ F00 ⊕ A00 ⊕ C00 ⊕ G00 | E00 ⊕ B00 ⊕ F00 ⊕ C00 ⊕ G00 | 1 ⊕ 1 ⊕ 0 ⊕ 1 ⊕ 1 = 0 |
| LFSR(314D) | D00 ⊕ A00 ⊕ E00 ⊕ B00 ⊕ F00 | D00 ⊕ A00 ⊕ E00 ⊕ B00 ⊕ F00 | 0 ⊕ 0 ⊕ 1 ⊕ 1 ⊕ 0 = 0 |
| LFSR(315D) | C00 ⊕ D00 ⊕ A00 ⊕ E00 ⊕ A00 ⊕ C00 ⊕ G00 | D00 ⊕ E00 ⊕ G00 | 0 ⊕ 1 ⊕ 1 = 0 |
| LFSR(316D) | B00 ⊕ C00 ⊕ D00 ⊕ B00 ⊕ F00 | C00 ⊕ D00 ⊕ F00 | 1 ⊕ 0 ⊕ 0 = 1 |
| LFSR(317D) | A00 ⊕ B00 ⊕ C00 ⊕ A00 ⊕ E00 | B00 ⊕ C00 ⊕ E00 | 1 ⊕ 1 ⊕ 1 = 1 |
| LFSR(318D) | A00 ⊕ B00 ⊕ D00 | A00 ⊕ B00 ⊕ D00 | 0 ⊕ 1 ⊕ 0 = 1 |

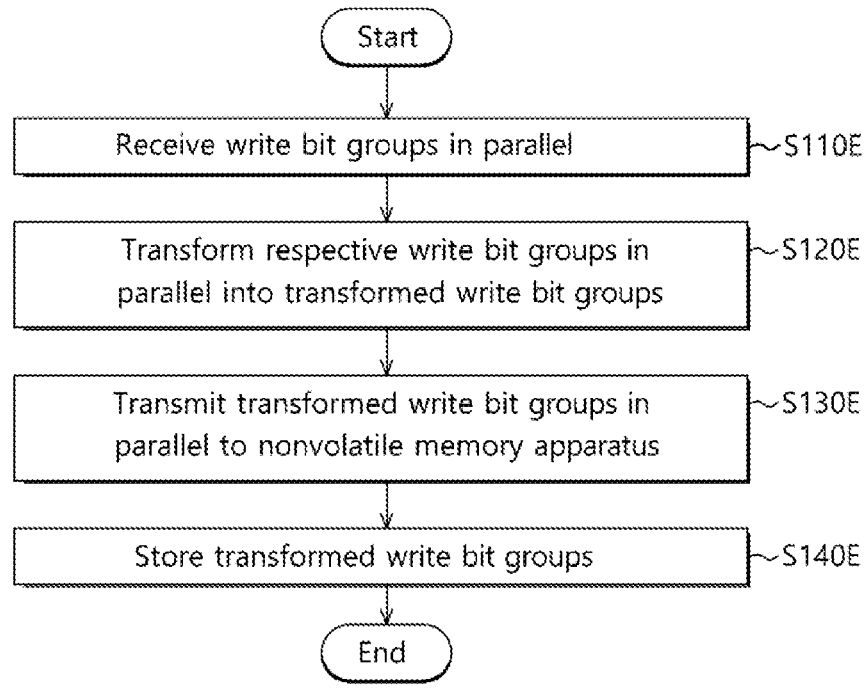
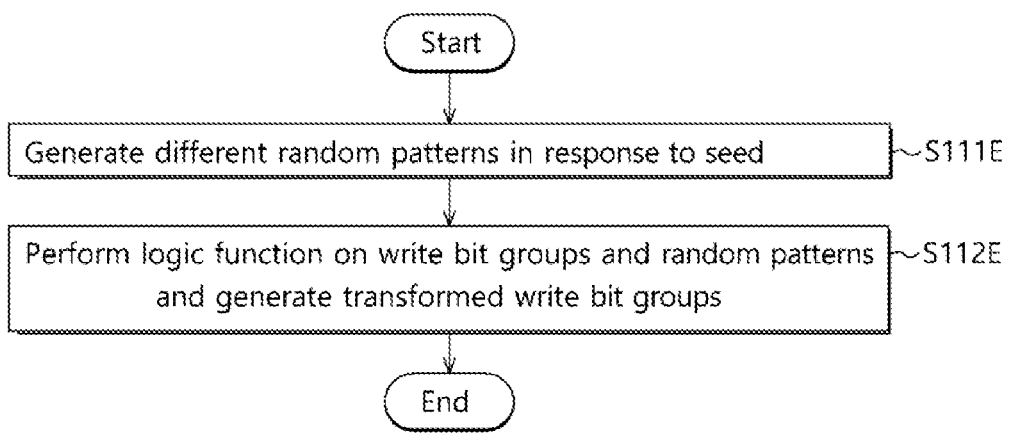

DATA STORAGE DEVICE

CROSS-REFERENCES TO RELATED APPLICATION

This application is a continuation application of U.S. patent application Ser. No. 16/987,977 filed on Aug. 7, 2020. U.S. patent application Ser. No. 16/987,977 is a continuation-in-part application of U.S. patent application Ser. No. 14/873,975 filed on Oct. 2, 2015 and issued as U.S. Pat. No. 11,182,339 on Nov. 23, 2021; Ser. No. 15/620,909 filed on Jun. 13, 2017 and issued as U.S. Pat. No. 10,741,212 on Aug. 11, 2020; Ser. No. 16/549,930 filed on Aug. 23, 2019 and issued as U.S. Pat. No. 11,177,835 on Nov. 16, 2021; and Ser. No. 16/517,144 filed on Jul. 19, 2019 and issued as U.S. Pat. No. 11,184,033 on Nov. 23, 2021. U.S. patent application Ser. No. 14/873,975 claims priority to Korean patent application No. 10-2015-0076165 filed on May 29, 2015. U.S. patent application Ser. No. 15/620,909 claims priority to Korean patent application No. 10-2016-0158369 filed on Nov. 25, 2016. U.S. patent application Ser. No. 16/549,930 filed on Aug. 23, 2019 is a continuation-in-part application of U.S. patent application Ser. No. 16/517,144 filed on Jul. 19, 2019 and issued as U.S. Pat. No. 11,184,033 on Nov. 23, 2021; U.S. patent application Ser. No. 15/674,134 filed on Aug. 10, 2017 and issued as U.S. Pat. No. 10,432,363 on Oct. 1, 2019, which claims priority to U.S. provisional application No. 62/374,692 filed on Aug. 12, 2016; and U.S. patent application Ser. No. 15/607,260 filed on May 26, 2017 and issued as U.S. Pat. No. 10,419,024 on Sep. 17, 2019. U.S. patent application Ser. No. 16/517,144 filed on Jul. 19, 2019 is a continuation application of U.S. patent application Ser. No. 16/138,512 filed on Sep. 21, 2018 and issued as U.S. Pat. No. 10,396,827 on Aug. 27, 2019, which is a continuation-in-part application of U.S. patent application Ser. No. 15/016,443 filed on Feb. 5, 2016 and issued as U.S. Pat. No. 10,102,066 on Oct. 16, 2018, which claims priority to Korean patent application No. 10-2015-0136362 filed on Sep. 25, 2015. The disclosure of each of the foregoing applications is herein incorporated by reference in its entirety.

BACKGROUND

1. Technical Field

Various embodiments generally relate to a data processing device and more particularly, to a data processing device having an improved data correction capability.

2. Related Art

Data storage devices store data provided by an external device in response to a write request. The data storage devices may also provide stored data to an external device in response to a read request. Examples of external devices employing one or more data storage devices include computers, digital cameras, cellular phones and the like. The data storage devices may be embedded in the external devices or may be fabricated in a separate form and connected to the external devices to operate.

In NAND flash storage systems, the read reference voltages are used to divide the possible threshold voltage range of NAND flash memory cells to several windows. A logical value is designated to each of the windows. The logical value of a cell is determined by the voltage window which the cell's threshold voltage is located in. For example, for a single-level cell (SLC), one read reference voltage is needed. When the threshold voltage of a cell is less than the specified read reference voltage, the logical value of the cell sets to "1"; otherwise, the cell's logical value sets to "0". For a multi-level cell (MLC), three read reference voltages are used. For a triple level cell (TLC) device, there are seven read reference voltages.

The threshold voltage of a cell can vary from its intended value for various reasons, such as program and read operation of neighboring cells, the number of program/erase cycles, and the retention time. Therefore, it is possible that the threshold voltage of a cell with an intended value shifts into another voltage window with a different logical value. In this case, when the cell is read, a wrong logical value is given and this error will be counted in the raw bit error rate (RBER) measurement. An optimal read reference voltage can achieve the minimal RBER.

Currently, there are two types of algorithm for the error-correction control solution, the hard-decoding algorithm and the soft-decoding algorithm. For the hard-decoding algorithm, the hard information which indicates that the input information is "0" or "1" is used. However, the soft information is used for the soft-decoding algorithm, which not only tells the decoder if the input information is "0" or "1", but also provides the decoder how likely it is "0" of "1". Usually if soft information is provided, a soft-decoding algorithm provides a better error correction performance than a hard-decoding algorithm. In NAND flash storage systems, an error-correction control solution will try the hard decoding first. When the hard decoding fails, the soft-decoding algorithm will be used.

Thus, there remains a need for a memory system and operating method thereof for page health prediction of the memory system.

Data integrity is an important feature for any data storage device and data transmission. Use of strong error-correction codes (ECCs) is recommended for various types of data storage devices include NAND flash memory devices. ECCs are also frequently used during the process of data transmission.

Error correcting code (ECC) refers to codes that add redundant data, or parity data, to a message, such that the message can be recovered by a receiver even when a number of errors were introduced, either during the process of transmission, or storage. In general, the ECC can correct the errors up to the capability of the code being used.

Low-density parity-check (LDPC) codes are an example of ECC. Generally, an LDPC decoder uses an iterative decoding process to decode information bits. The iterative decoding consumes time and levies a processing burden. Typically, the time and processing burden increase with an increase to the number of performed iterations. In certain latency sensitive applications (e.g., where the decoding should be completed within a short time period) and/or processing sensitive applications (e.g., where the decoding should use a small amount of processing), existing iterative decoding processes of LDPC codes may not be able to meet the desired latency and/or processing performance.

SUMMARY

Embodiments of the present disclosure are directed to a data processing device capable of performing a decoding operation for correcting errors in data read from a memory device.

Embodiments of the present disclosure are directed to a memory system and an operating method thereof capable of predicting page health of the memory system.

Embodiments of the present disclosure are directed to techniques for improving the latency or processing performance of an error correction system.

Embodiments of the present disclosure are directed to an ECC encoder, an ECC encoding method performed in one clock cycle, and a memory controller including the ECC encoder.

In an embodiment, a data processing system includes a storage medium, and a controller including a data processing block, configured to receive data from a host, transmit the received data to the storage medium, read data from the storage medium in response to a read request from the host, and decode the read data by the data processing block according to multiple decoding modes. The data processing block includes a first decoder and a second decoder, and is configured to manage the first decoder and the second decoder to run the decoding for the read data, and activate a fast decoding having shorter latency than a normal decoding after a fast decoding condition is satisfied.

In an example, an operating method of a memory system includes performing a decoding iteration includes conducting NAND read and generating NAND data; decoding in accordance with the NAND data and generating decoder information; predicting a BER in accordance with at least the decoder information; and evaluating the predicted BER and generating evaluation result.

In an example, a system includes an LDPC decoder and initiates an iterative decoding of an LDPC codeword. Generally, the iterative decoding is bounded by a maximum number of iterations. The system determines that a current iteration of the iterative decoding corresponds to number of iterations that is equal to or greater than an iteration number threshold and is smaller than the maximum number of iterations. The system compares a weight of a syndrome of the LDPC codeword at the current number of iterations to a checksum threshold. This comparison may be performed when the syndrome is non-zero. The system terminates the iterative decoding based on the comparing. The iterative decoding is terminated prior to reaching the maximum number of iterations.

In an example, an ECC encoder includes a plurality of exclusive OR (XOR) gates configured to receive a "k"-bit original data in parallel and configured to perform a plurality of XOR operations of the "k"-bit original data to output a "(n−k)"-bit parity data. The "k"-bit original data and the "(n−k)"-bit parity data form an "n"-bit codeword, "k" denotes a natural number and "n" denotes a natural number which is greater than "k".

In an example, a data processing circuit may include: a plurality of transformation blocks suitable for respectively transforming in parallel a plurality of input bit groups into a plurality of output bit groups, wherein each of the transformation blocks transforms a corresponding input bit group into a corresponding output bit group using a random pattern.

BRIEF DESCRIPTION OF THE DRAWINGS

FIGS. 2A and 2B are diagrams illustrating a method for decoding a plurality of data chunks, according to an embodiment of the invention.

FIG. 29 is a table illustrating an ECC encoding operation performed by the operation logic circuit of FIG. 28;

FIG. 30 is a table illustrating a method of allocating arbitrary variables to bits included in original data during a process for deducing an equation of an exclusive OR operation performed to establish a logic circuit of an ECC decoder, according to an embodiment of the present disclosure;

FIGS. 31 to 38 are tables illustrating the ECC encoding operation to the original data with the arbitrary variables through the iterative operation logic of FIG. 28;

FIG. 39 is a relationship table between the iterative operation logic of FIG. 28 and simplified logic for the ECC encoding operation according to an embodiment of the present disclosure;

FIG. 46 is a flow chart exemplarily illustrating an operation of a data storage device of FIG. 45 in accordance with an embodiment of the present invention.

FIG. 47 is a flow chart exemplarily illustrating an operation of a data processing circuit of FIG. 45 in accordance with an embodiment of the present invention.

DETAILED DESCRIPTION

Figure 1A:
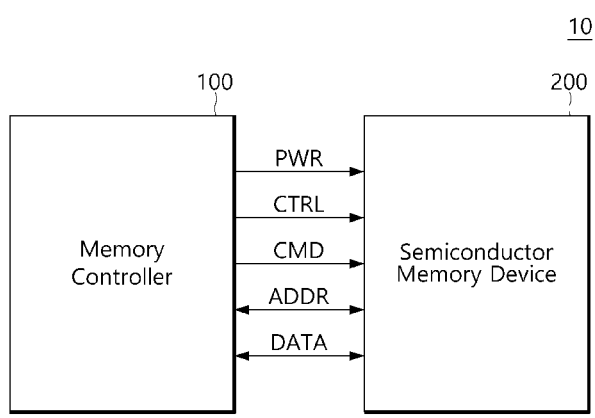
FIG. 1A is a block diagram schematically illustrating a memory system in accordance with an embodiment of the present invention.

Hereinafter, various embodiments of the invention will be described with reference to the accompanying drawings.

The invention may, however, be embodied in different forms and should not be construed as being limited to the embodiments set forth herein. Rather, these embodiments are provided so that a person skilled in the art to which the invention pertains could practice the invention.

Moreover, it is to be understood, that embodiments of the invention are not limited to the particulars shown in the drawings, that the drawings are not necessarily to scale and, in some instances, proportions may have been exaggerated in order to more clearly depict certain features of the invention. Also, while particular terminology is used, it is to be appreciated that the terminology used is for describing particular embodiments only and is not intended to limit the scope of the invention.

In NAND flash storage, data can be stored and accessed on a page level basis, and pages can be located in a block belonging to a die. Multiple codewords encoded using error control coding scheme can be stored in a single page. In a random data access command, the data is read out from the page and passed to a decoder. If health of the page, such as bit error rate (BER) for a page, can be predicted, the decoding latency can be avoided and a soft read command can be used to decode data. Sometimes, the page health can be so worse that the data cannot be recovered through even the soft decoding. In that case, chip kill information can be used to decode the data. This page health prediction scheme can not only significantly reduce the error recover flow latency, but also provide other advantages, such as improvement of garbage collection algorithm. In embodiments of current invention disclosure, a novel apparatus and algorithm to predict health of a block using product codes decoder is proposed.

Generalized product codes (GPC) have drawn attention recently for their advantages over state of art error control coding schemes, wherein the current error control coding schemes may have issues such as more noises and long latency, since the schemes wait for decoding failure or completion to take next action. Number of failed constituent codewords with a hard decoder or soft decoder at ith iteration can be used to predict BER for a page. A smaller number of iterations is preferred because the smaller number of iterations can indicate less iterations performed to determine the BER and shorten the decoding time.

The proposed page health predication schemes can track the error decoding process before the decoding failure. The noise data can be used to calculate checksum points, wherein the checksum points can be used to create BER lines. A number of the checksum points can be used to locate BER from the BER lines, more checksum points can result in a more accurate BER prediction. Optionally, multiple codewords can be used to replace the checksum points. For example, from simulations, it is observed that 3 iterations decoder information can provide good BER prediction. Even though the number of failed codewords information used to predict BER, other information from decoder can also be used for prediction before fully decoding.

FIG. 1A is a block diagram schematically illustrating a memory system 10 in accordance with an embodiment of the present invention. Referring FIG. 1A, the memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid-state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a netbook computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 1B:
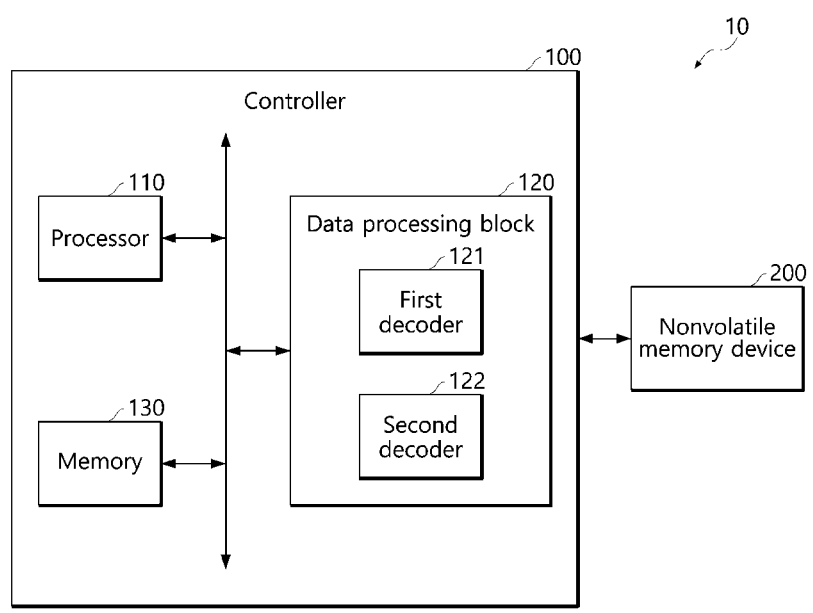
FIG. 1B is a block diagram illustrating a data storage device including a data processing block, according to an embodiment of the invention.

FIG. 1B is a block diagram illustrating a data storage device including a data processing block, according to an embodiment of the invention.

Referring now to FIG. 1B, a data storage device 10 is provided, according to an embodiment of the invention. The data storage device may be any suitable data storage device. For example, the data storage device 10 may be or comprise a personal computer memory card international association (PCMCIA) card, a compact flash (CF) card, a smart media card, a memory stick, a multimedia card (MMC), an embedded MMC (eMMC), a reduced-size multimedia card (RS-MMC), a micro-size version of MMC (MMC-micro), a secure digital (SD) card, a mini secure digital (mini-SD) card, a micro secure digital (micro-SD) card, a universal flash storage (UFS), a solid state drive (SSD), or the like.

The data storage device 10 may include a controller 100 and a nonvolatile memory device 200.

The controller 100 may include a processor 110, a data processing block 120, and a memory 130. Although not illustrated, the controller 100 may further include a data processing circuit which may be the same as the data processing circuit 100E described with reference to FIGS. 42 to 44. The data processing block 120 may include a first decoder 121 and a second decoder 122. Although not illustrated, the data processing block 120 may further include a data processing circuit which may be the same as the data processing circuit 100E described with reference to FIGS. 42 to 44.

The processor 110 may control the general operations of the data storage device 10. For example, the processor 110 may store data in the nonvolatile memory device 200 in response to a write request transmitted from an external device (not shown). The processor 110 may read data stored in the nonvolatile memory device 200 and output the read data to an external device (not shown) in response to a read request transmitted from the external device.

The processor 110 may control the data processing block 120 to encode data to be stored in the nonvolatile memory device 200 and decode data read from the nonvolatile memory device 200. The processor 110 may control a first decoder 121 of the data processing block 120 to perform a first decoding operation for a plurality of data chunks read sequentially from the nonvolatile memory device 200. The processor 110 may control a second decoder 122 of the data processing block 120 to perform an additional second decoding operation for one or more data chunks selected among the plurality of data chunks for which the first decoding operation failed, in response to a decoding failure report transmitted from the first decoder 121. The first and second decoding operations will be described hereinafter in more detail.

The data processing block 120 may determine whether data read from the nonvolatile memory device 200 includes an error bit, and may correct the error bit.

According to an embodiment, the first decoder 121 may perform a first decoding operation according to an iterative decoding algorithm. According to the first decoding operation, the first decoder 121 may iterate decoding calculations until all error bits included in data are corrected or until a maximum number of iterations has been reached. Decoding calculations may be repeated up to a maximum preset number of times defined by a maximum iteration count. Hence, it is possible, in the case where data include too many error bits, the first decoder 121 may fail in decoding the data even though decoding calculations are iterated to the maximum iteration count. According to an embodiment, the second decoder 122 may also perform a second decoding operation according to an iterative decoding algorithm.

The first decoder 121 and the second decoder 122 may perform decoding in a stepwise manner. For example, the first decoder 121 may perform a first decoding operation for data read from the nonvolatile memory device 200 and then, the second decoder 122 may perform an additional second decoding operation for the data for which the first decoding operation failed. Performing a second decoding operation for only those data for which a first decoding operation failed may reduce the number of errors in the read data while at the same time may reduce the number of iterations, hence improving the overall efficiency of the data processing block 120 and the associated data controller 100 and storage device 10.

The first decoder 121 and the second decoder 122 may perform decoding according to the same or different decoding algorithms. The first decoder 121 and the second decoder 122 may perform decoding according to different decoding algorithms or different decoding schemes. For example, the first decoder 121 may perform decoding in a hard decision decoding scheme according to an LDPC algorithm, and the second decoder 122 may perform decoding in a soft decision decoding scheme according to a low-density parity-check (LDPC) algorithm. The first decoder 121 and the second decoder 122 may have error correction capabilities complementary to each other, by applying different decoding algorithms for data. Accordingly, the error correction capability of the data processing block 120 may be improved.

The first decoder 121 and the second decoder 122 may perform decoding on a predetermined decoding data unit. For example, the first decoder 121 and the second decoder 122 may perform decoding on the basis of a data chunk. The size of each data chunk may be the same or may differ.

The first and second decoders 121, 122 may perform their respective first and second decoding operations on data chunks having the same size. The first and second decoders 121, 122 may perform their respective first and second decoding operations on different size data chunks. In an embodiment, the controller 100 may receive a plurality of data chunks, read sequentially from the nonvolatile memory device 200, and the first and second decoders 121, 122 may perform their respective first and second decoding operations for one or more of the plurality of data chunks.

In an embodiment, the first decoder 121 may perform a normal decoding for one or more data chunks among a plurality of data chunks read sequentially from the nonvolatile memory device 200. Then, based on one or more results of the normal decoding on the one or more data chunks, the first decoder may perform the same or a modified, for example a fast decoding operation for one or more succeeding data chunks. According to an embodiment, the one or more succeeding data chunks may be remaining data chunks for which normal decoding is not yet performed by the first decoder, among the plurality of data chunks. While sequentially performing normal decoding for the plurality of data chunks, the first decoder 121 may determine whether to continue performing normal decoding or perform a modified decoding instead, for example, a fast decoding for one or more of the remaining data chunks, based on a result of normal decoding performed previously. The result of normal decoding may include information on whether normal decoding has succeeded or failed, information on an iteration count of successful normal decoding and/or information on the number of errors corrected in normal decoding. The term "normal" of normal decoding is used to allow normal decoding to be distinguished from a modified decoding e.g. a fast decoding. Normal decoding may be performed according to any suitable conventional method.

In an embodiment, the first decoder 121 may perform fast decoding to more quickly end decoding for a succeeding data chunk. For example, a fast decoding may be used when inefficient decoding for a succeeding data chunk may be expected based on a result of normal decoding performed previously. For example, when it is expected that decoding may fail or a long time may be required even though decoding may succeed, the first decoder 121 may perform a fast decoding for a succeeding one or more data chunks.

According to an embodiment, the first decoder 121 may perform fast decoding for a succeeding data chunk, when normal decoding for a previous data chunk has failed. According to an embodiment, the first decoder 121 may perform fast decoding for a succeeding data chunk, when the number of error bits corrected in normal decoding for a previous data chunk exceeds a threshold number of error bits. According to an embodiment, the first decoder 121 may perform fast decoding for a succeeding data chunk, when an iteration count of successful normal decoding for a previous data chunk, that is, a success iteration count, exceeds a threshold iteration count. According to an embodiment, the first decoder 121 may perform fast decoding for a succeeding data chunk, based on a combination of two or more of the above conditions.

The first decoder 121 may perform fast decoding in various ways. According to an embodiment, the first decoder 121 may perform fast decoding by processing a succeeding data chunk in a bypass mode. When the first decoder 121 is set in the bypass mode, the succeeding data chunk inputted to the first decoder 121 may be outputted as it is. According to an embodiment, the first decoder 121 may perform fast decoding by inserting an error bit in a succeeding data chunk and performing normal decoding for the error-inserted data chunk. According to an embodiment, when the first decoder 121 performs normal decoding within the limit of a first maximum iteration count according to an iterative decoding scheme, the first decoder 121 may perform fast decoding within the limit of a second maximum iteration count smaller than the first maximum iteration count. The second maximum iteration count may be set to, for example, "0" or "1."

According to an embodiment, when performing fast decoding for a succeeding data chunk through the above-described ways, the first decoder 121 may output a result of performing the fast decoding together with its input data chunk, i.e., the succeeding data chunk. For example, when the fast decoding is performed in such a manner that an error bit is inserted in the succeeding data chunk and then normal decoding is performed, the first decoder 121 may separately retain the original succeeding data chunk and output the separately retained original succeeding data chunk together with a fast decoding result. This may allow the second decoder 122 to perform additional decoding with a data chunk transferred from the first decoder 121. It will be described later in detail.

According to an embodiment, when the number of a plurality of data chunks which are sequentially read is smaller than a threshold number of chunks, the first decoder 121 may not perform fast decoding for the plurality of data chunks but the first decoder 121 may continuously perform only normal decoding.

According to an embodiment, the first decoder 121 may transmit a decoding failure report to the processor 110, with respect to a data chunk for which fast decoding is performed. According to an embodiment, the first decoder 121 may transmit identification information for allowing the processor 110 to identify a data chunk for which fast decoding is performed, among a plurality of data chunks. In response to the report from the first decoder 121, the processor 110 may control the second decoder 122 to perform additional decoding for not only a data chunk for which normal decoding has failed in the first decoder 121 but also a data chunk for which fast decoding has been performed in the first decoder 121. It will be described later in detail.

The second decoder 122 may perform additional decoding for data chunks selected among a plurality of data chunks which are sequentially read. The selected data chunks may include a data chunk for which normal decoding has failed in the first decoder 121 and a data chunk for which fast decoding has been performed in the first decoder 121. In order to perform the additional decoding, the first decoder 121 may retain original data chunks and transfer them to the second decoder 122.

While the data processing block 120 of FIG. 1B includes two decoders 121 and 122, it is to be noted that, according to an embodiment, the data processing block 120 may include a plurality of decoders, i.e., three or more decoders. One or more of the plurality of decoders included in the data processing block 120 may perform fast decoding based on a result of normal decoding for a plurality of data chunks which are sequentially read, as described above. The plurality of decoders may perform decoding in a stepwise manner according to respective decoding algorithms different from each other, and may perform additional decoding for data chunks for which decoding has failed in previous decoders.

The memory 130 may serve as a working memory, a cache memory or a buffer memory of the processor 110. The memory 130 as a working memory may store software programs and various program data to be driven by the processor 110. The memory 130 as a cache memory may temporarily store cache data. The memory 130 as a buffer memory may temporarily store data transmitted between the external device and the nonvolatile memory device 200.

The nonvolatile memory device 200 may include flash memory devices such as NAND flash or NOR flash, Ferroelectrics Random Access Memory (FeRAM), Phase-Change Random Access Memory (PCRAM), Magnetoresistive Random Access Memory (MRAM) or Resistive Random Access Memory (ReRAM). The nonvolatile memory device 200 may store data transmitted from the controller 100 and may read stored data and transmit read data to the controller 100, under the control of the controller 100.

While the data storage device 10 of FIG. 1B includes one nonvolatile memory device 200, it is to be noted that the number of nonvolatile memory devices included in the data storage device 10 is not specifically limited.

FIGS. 2A and 2B are diagrams illustrating a method for the data processing block 120 of FIG. 1B to decode a plurality of data chunks. In FIGS. 2A and 2B, the data processing block 120 may perform a first decoding for example, for 4 data chunks DC0 to DC3 which are sequentially read.

Referring to FIG. 2A, the first decoder 121 may sequentially process data chunks DC0 to DC3. The first decoder 121 may determine whether to perform a fast decoding for a succeeding data chunk, based on whether normal decoding for a previous data chunk is a success or a failure.

First, the first decoder 121 may perform normal decoding for the first data chunk DC0. When the normal decoding for the first data chunk DC0 is a success, the first decoder 121 may perform normal decoding for the second data chunk DC1. Then, when the normal decoding for the second data chunk DC1 is a failure, the first decoder 121 may perform fast decoding for the succeeding data chunks DC2 and DC3. The first decoder 121 may transmit a decoding failure report to the processor 110, with respect to the second data chunk DC1 for which the normal decoding has failed and the third and fourth data chunks DC2 and DC3 for which the fast decoding has been performed. Meanwhile, according to an embodiment, the first decoder 121 may transmit identification information capable of identifying the third and fourth data chunks DC2 and DC3 for which the fast decoding has been performed, to the processor 110, instead of the decoding failure report.

The second decoder 122 may perform additional decoding for the second data chunk DC1 for which the normal decoding has failed in the first decoder 121 and the third and fourth data chunks DC2 and DC3 for which the fast decoding has been performed in the first decoder 121.

Referring to FIG. 2B, the first decoder 121 may determine whether to perform fast decoding for a succeeding data chunk, based on the number of error bits corrected in normal decoding for a previous data chunk.

First, the first decoder 121 may perform normal decoding for the first data chunk DC0. When the number of error bits corrected in the normal decoding for the first data chunk DC0 does not exceed a threshold number of error bits, the first decoder 121 may also perform normal decoding for the second data chunk DC1. Then, when the number of error bits corrected in the normal decoding for the second data chunk DC1 exceeds the threshold number of error bits, the first decoder 121 may perform fast decoding for the succeeding data chunks DC2 and DC3. The first decoder 121 may transmit a decoding failure report to the processor 110, with respect to the third and fourth data chunks DC2 and DC3 for which the fast decoding has been performed. Meanwhile, according to an embodiment, the first decoder 121 may transmit identification information capable of identifying the third and fourth data chunks DC2 and DC3 for which the fast decoding has been performed, to the processor 110, instead of the decoding failure report.

The second decoder 122 may perform additional decoding for the third and fourth data chunks DC2 and DC3 for which the fast decoding has been performed in the first decoder 121.

According to an embodiment, the first decoder 121 may determine whether to perform fast decoding for a succeeding data chunk, based on a success iteration count of normal decoding for a previous data chunk.

Figure 3:
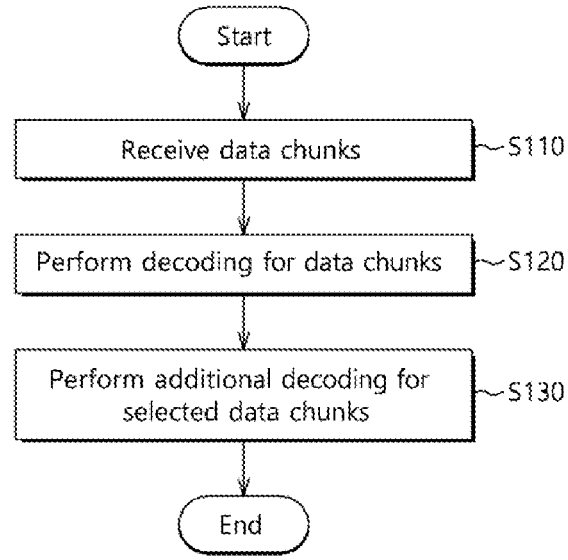
FIG. 3 is a flow chart illustrating a method for operating a data storage device, according to an embodiment of the invention.

FIG. 3 is a flow chart illustrating a method for operating the data storage device 10 of FIG. 1B.

At step S110, the controller 100 may receive a plurality of data chunks which are read sequentially from the nonvolatile memory device 200.

At step S120, the first decoder 121 may perform decoding sequentially for the plurality of data chunks. As aforementioned, the first decoder 121 may perform normal decoding or fast decoding for a succeeding data chunk, based on a result of normal decoding for a previous data chunk. The first decoder 121 may transmit a decoding failure report to the processor 110, with respect to a data chunk for which normal decoding has failed and a data chunk for which fast decoding has been performed.

At step S130, the second decoder 122 may perform additional decoding for data chunks selected among the plurality of data chunks. For example, the second decoder 122 may perform additional decoding for a data chunk for which normal decoding has failed in the first decoder 121 and/or a data chunk for which fast decoding has been performed in the first decoder 121. The second decoder 122 may perform decoding according to a decoding algorithm different from the decoding algorithm employed by the first decoder 121. In an embodiment, the second decoder 122 may perform decoding according to a decoding algorithm that is the same as the decoding algorithm used by the first decoder 121. The decoding algorithm employed by the second decoder 122 may be complimentary to the decoding algorithm employed by the first decoder allowing different data errors to be corrected.

Figure 4:
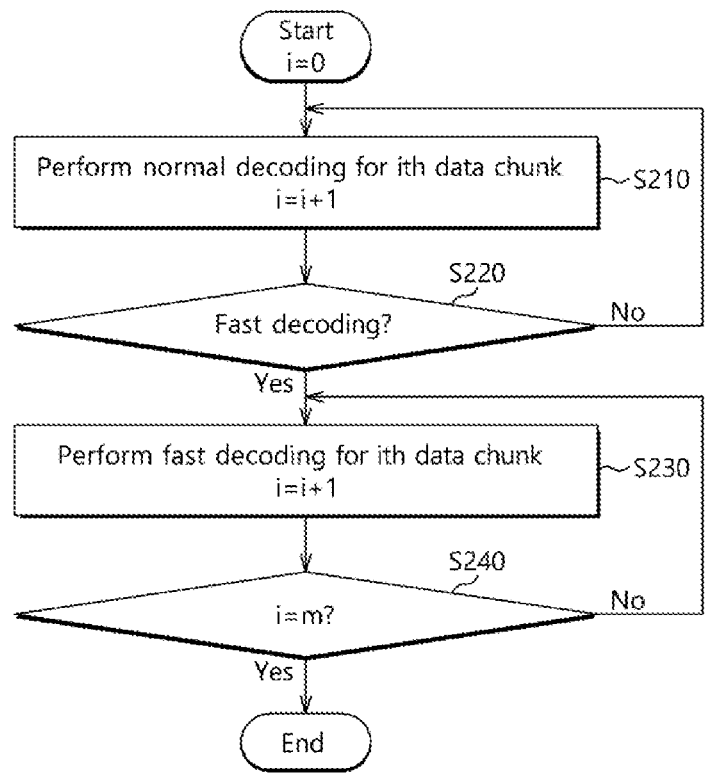
FIG. 4 is a flow chart illustrating a method for decoding one or more data chunks read sequentially, performed by a first decoder of a data processing device, according to an embodiment of the invention.

FIG. 4 is a flow chart illustrating a method for decoding a plurality of data chunks which are read sequentially from a nonvolatile memory device 200. The method may be performed by a first decoder 121 a data processing block as the one shown in FIG. 1B. For example, index i shown in FIG. 4 may be "0" and m may be any positive integer.

At step S210, the first decoder 121 may perform normal decoding for an $i^{th}$ data chunk. The index i may be increased by "1."

At step S220, the first decoder 121 may determine whether to perform fast decoding, based on a result of the normal decoding for the $i^{th}$ data chunk. In the case where it is determined that the fast decoding is not to be performed, the process may proceed to the step S210. For example, the first decoder 121 may perform normal decoding for a succeeding data chunk. In the case where it is determined that the fast decoding is to be performed, the process may proceed to step S230. A method for determining whether to perform a fast decoding will be described later in detail with reference to FIGS. 5A to 5C.

At step S230, the first decoder 121 may perform fast decoding for the $i^{th}$ data chunk. For example, the first decoder 121 may perform fast decoding by processing the $i^{th}$ data chunk in a bypass mode. For example, the first decoder 121 may perform the fast decoding by inserting an error bit in the $i^{th}$ data chunk and performing normal decoding for the error-inserted data chunk. For example, when the first decoder 121 performs normal decoding within the limit of a first maximum iteration count according to an iterative decoding scheme, the first decoder 121 may perform fast decoding within the limit of a second maximum iteration count smaller than the first maximum iteration count. The index i may be increased by "1."

At step S240, the first decoder 121 may determine whether decoding has been completed for m number of data chunks. In the case where decoding for the m number of data chunks is not completed, the process may proceed to the step S230. Hence, the first decoder 121 may continuously perform fast decoding for succeeding data chunks. In the case where the decoding for the m number of data chunks is completed, the process may be ended.

Figure 5A:
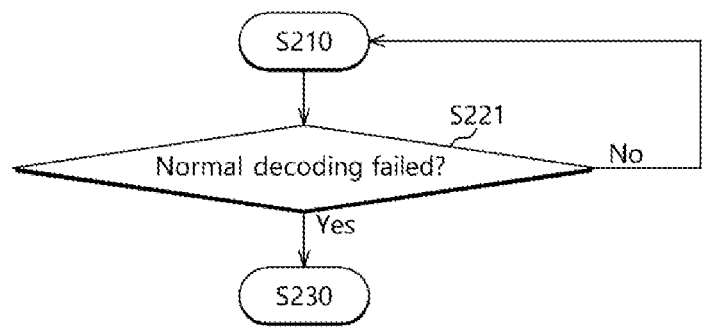
FIGS. 5A to 5C are flow charts illustrating methods performed by a first decoder of a data processing device for determining whether to perform fast decoding for a succeeding data chunk, based on a result of normal decoding for a previous data chunk, according to an embodiment of the invention.
Figure 5B:
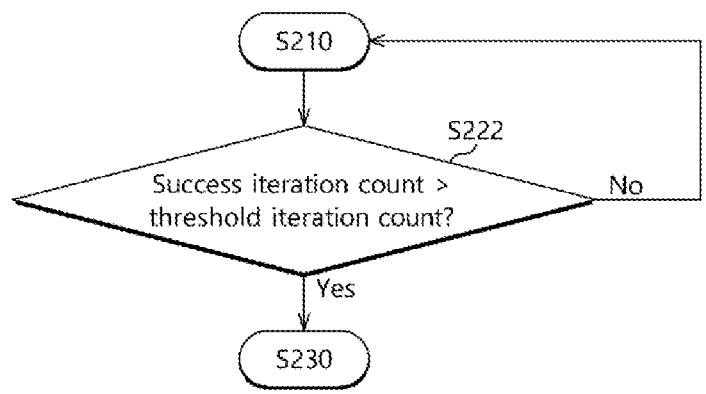
Figure 5C:
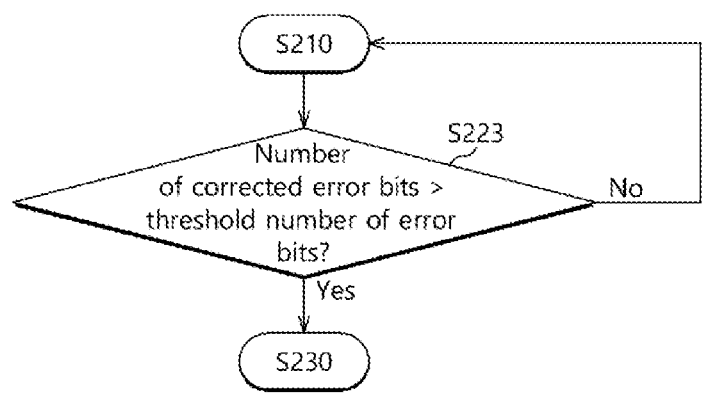

FIGS. 5A to 5C are flow charts illustrating methods performed by the first decoder 121 of FIG. 1B for determining whether to perform fast decoding for a succeeding data chunk, based on a result of normal decoding for a previous data chunk. Steps S221 to S223 may be detailed embodiments of step S220 of FIG. 4. Steps S221 to S223 may be performed between step S210 and step S230 of FIG. 4.

Referring to FIG. 5A, at step S221, the first decoder 121 may determine whether normal decoding for a data chunk is a failure or a success. When the normal decoding for a data chunk is a success, the first decoder 121 may determine to perform normal decoding for a succeeding data chunk, and the process may proceed to the step S210. When the normal decoding for a data chunk is a failure, the first decoder 121 may determine to perform fast decoding for the succeeding data chunk, and the process may proceed to the step S230.

Referring to FIG. 5B, at the step S222, the first decoder 121 may determine whether an iteration count of successful normal decoding for a data chunk, that is, a success iteration count, exceeds a threshold iteration count. When the success iteration count does not exceed the threshold iteration count, the first decoder 121 may determine to perform normal decoding for a succeeding data chunk, and the process may proceed to the step S210. When a success iteration count exceeds the threshold iteration count, the first decoder 121 may determine to perform fast decoding for the succeeding data chunk and the process may proceed to the step S230.

Referring to FIG. 5C, at step S223, the first decoder 121 may determine whether the number of error bits corrected in normal decoding for a data chunk exceeds a threshold number of error bits. When the number of corrected error bits does not exceed the threshold number of error bits, the first decoder 121 may determine to perform normal decoding for a succeeding data chunk and the process may proceed to step S210. When the number of corrected error bits exceeds the threshold number of error bits, the first decoder 121 may determine to perform fast decoding for the succeeding data chunk and the process may proceed to step S230.

Figure 6:
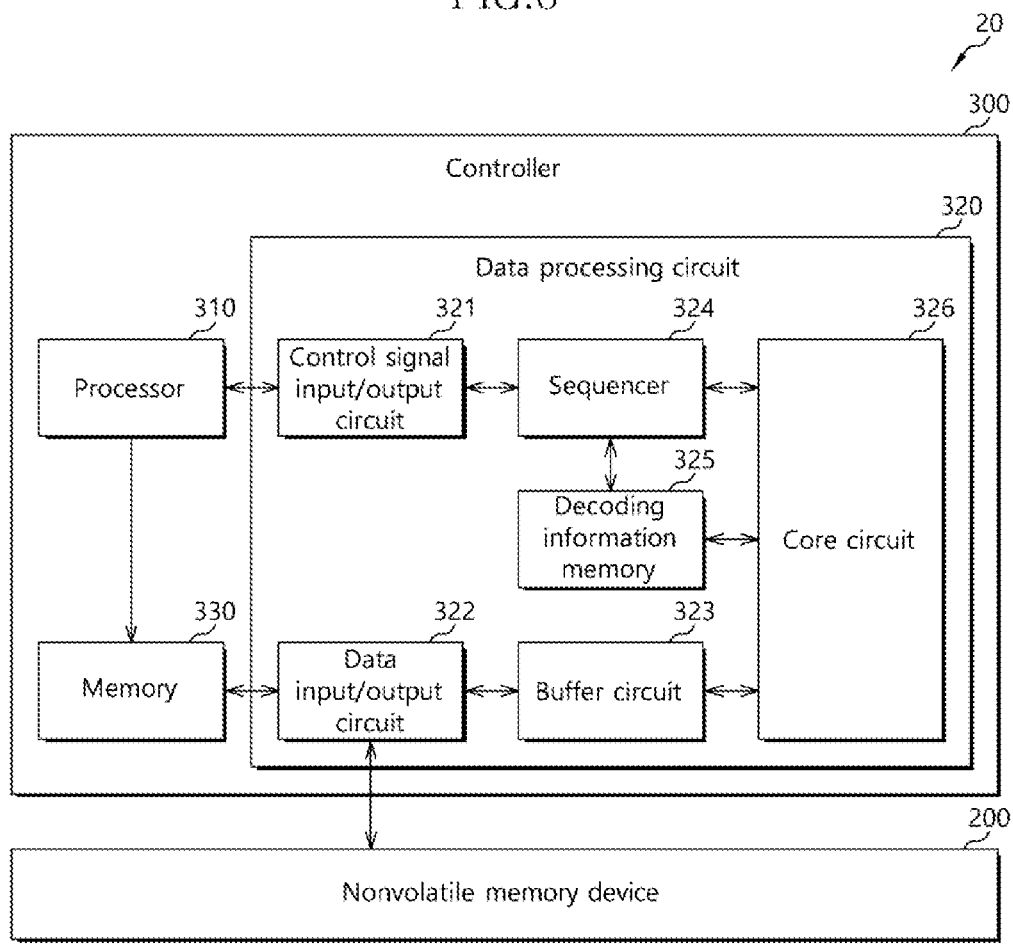
FIG. 6 is a block diagram illustrating a representation of an example of a data storage device 20 in accordance with an embodiment.

FIG. 6 is a block diagram illustrating a representation of an example of a data storage device 20 in accordance with an embodiment.

Referring to FIG. 6, the data storage device 20 may include a controller 300 and a nonvolatile memory device 200.

The controller 300 may include a processor 310, a data processing block 320 and a memory 330.

The processor 310 may control general operations of the data storage device 20. The processor 310 may store data in the nonvolatile memory device 200 in response to a write request transmitted from an external device, and may read data stored in the nonvolatile memory device 200 and output the read data to the external device in response to a read request transmitted from the external device.

The processor 310 may control the data processing block 320 to cause the data processing block 320 to perform decoding on data read from the nonvolatile memory device 200. The processor 310 may control the data processing block 320 by transmitting a control signal to the data processing block 320. The control signal may include an information on the size of data read from the nonvolatile memory device 200, that is, an information on the size of data on which the data processing block 320 is to perform decoding, an information on an address of a memory where data is to be stored, an information on a decoding type, and so forth.

The data processing block 320 may perform decoding on data read from the nonvolatile memory device 200, under the control of the processor 310. In detail, the data processing block 320 may perform decoding on data, by determining whether the data includes an error bit and correcting the error bit. As aforementioned, the data processing block 320 may perform decoding by the unit of data chunk. That is to say, the data processing block 320 may perform decoding, at once, on the bits included in a data chunk.

The data processing block 320 may include a control signal input/output circuit 321, a data input/output circuit 322, a buffer circuit 323, a sequencer 324, a decoding information memory 325 and a core circuit 326. Although not illustrated, the data processing block 320 may further include a data processing circuit which may be the same as the data processing circuit 100E described with reference to FIGS. 42 to 44.

The control signal input/output circuit 321 may receive the control signal from the processor 310 and transmit a control signal to the sequencer 324. Also, the control signal input/output circuit 321 may transmit informations, for example, a decoding end information, a decoding result information and so fourth, to the processor 310 under the control of the sequencer 324.

The data input/output circuit 322 may receive data from the nonvolatile memory device 200 and transmit the data to the buffer circuit 323. The data input/output circuit 322 may output data stored in the buffer circuit 323, to the memory 330, when decoding on the data stored in the buffer circuit 323 is performed. The data input/output circuit 322 may further include a data processing circuit (not shown) which may be the same as the data processing circuit 100E described with reference to FIGS. 42 to 44.

The buffer circuit 323 may receive data from the data input/output circuit 322 and store the received data. The buffer circuit 323 may transmit data to the core circuit 326 such that decoding is performed by the core circuit 326. The buffer circuit 323 may receive decoded data from the core circuit 326 and store the received data. In other words, the buffer circuit 323 may temporarily store data decoded/to be decoded by the core circuit 326.

The sequencer 324 may receive the control signal from the control signal input/output circuit 321 and control the internal components of the data processing block 320 based on the control signal. In particular, the sequencer 324 may generate a decoding information to be referred to by the core circuit 326 when performing decoding, based on the control signal. The sequencer 324 may store the decoding information in the decoding information memory 325 which may be accessed by the core circuit 326. According to an embodiment, the sequencer 324 may directly transmit the decoding information to the core circuit 326.

For example, the decoding information may include the information on the size of data read from the nonvolatile memory device 200. For example, the decoding information may include the number of data chunks. The number of data chunks may be determined through dividing the size of data read from the nonvolatile memory device 200 by the size of a data chunk or may be inputted from the processor 310.

According to an embodiment, the decoding information may include a maximum decoding iteration count. The maximum decoding iteration count may be a maximum count by which the core circuit 326 may iteratively perform decoding on a single data chunk.

According to an embodiment, the decoding information may include a decoding type. The decoding type may be for which decoding the core circuit 326 is to perform. The decoding type may include normal decoding, fast decoding and additional decoding.

In detail, first, the sequencer 324 may generate the decoding information such that the core circuit 326 performs normal decoding on a first data chunk among a plurality of data chunks.

When the sequencer 324 receives from the core circuit 326 a report that a fast decoding condition is satisfied, the sequencer 324 may modify the decoding information such that the core circuit 326 performs a fast decoding operation on a second data chunk. An execution time of fast decoding may be shorter than an execution time of normal decoding. The second data chunk may include at least one data chunk which is subsequent to the first data chunk, among the plurality of data chunks. The second data chunk may include at least one data chunk on which normal decoding is not performed yet, among the plurality of data chunks.

When the sequencer 324 receives from the core circuit 326 a report on a result of normal decoding or fast decoding on all the data chunks, the sequencer 324 may modify the decoding information such that the core circuit 326 performs additional decoding on a third data chunk. The third data chunk may include a data chunk on which normal decoding has failed and on which fast decoding has been performed, among the plurality of data chunks. Additional decoding may have better error correction performance and longer execution time than normal decoding.

The decoding information memory 325 may be accessed by the sequencer 324 and the core circuit 326, and may store informations which are to be transmitted between the sequencer 324 and the core circuit 326. For example, the decoding information memory 325 may store the decoding information generated/modified by the sequencer 324, a result determined by the core circuit 326 in terms of whether a fast decoding condition is satisfied, a result of performing decoding on the plurality of data chunks by the core circuit 326, and so forth.

The core circuit 326 may read the decoding information stored in the decoding information memory 325 or receive the decoding information from the sequencer 324. The core circuit 326 may read a data chunk from the buffer circuit 323 based on the decoding information and perform decoding on the data chunk.

In detail, the core circuit 326 may sequentially perform normal decoding on data chunks stored in the buffer circuit 323, when the decoding information of the sequencer 324 instructs normal decoding. At each time of performing normal decoding on a data chunk, the core circuit 326 may determine whether a result of normal decoding satisfies the fast decoding condition.

The result of normal decoding may include at least one among whether normal decoding is a failure, whether the number of error bits corrected in normal decoding exceeds a threshold number even though normal decoding is a success and whether a decoding iteration count in normal decoding exceeds a threshold iteration count. Namely, a case where the fast decoding condition is satisfied may include at least one among a case where normal decoding has failed, a case where the number of error bits corrected in normal decoding exceeds the threshold number and a case where a decoding iteration count in normal decoding exceeds the threshold iteration count.

When the fast decoding condition is satisfied, the core circuit 326 may report through the decoding information memory 325 or directly to the sequencer 324 that the fast decoding condition is satisfied.

When the decoding information of the sequencer 324 instructs fast decoding, the core circuit 326 may perform fast decoding on a subsequent data chunk which is stored in the buffer circuit 323. The core circuit 326 may perform fast decoding on data chunks on which normal decoding is not performed yet, among the data chunks stored in the buffer circuit 323.

Describing in detail a method for the core circuit 326 to perform fast decoding on a data chunk, for example, when the core circuit 326 performs normal decoding based on a first maximum iteration count, the core circuit 326 may perform fast decoding based on a second maximum iteration count smaller than the first maximum iteration count. The first maximum iteration count and the second maximum iteration count may be determined as the decoding information by the sequencer 324.

According to an embodiment, when fast decoding is performed on a data chunk, the data chunk may be outputted to the memory 330 through the data input/output circuit 322 without passing through the core circuit 326. That is to say, the data chunk stored in the buffer circuit 323 may be outputted to the memory 330 by bypassing the core circuit 326.

After performing normal decoding or fast decoding on all the data chunks, the core circuit 326 may report a decoding result through the decoding information memory 325 or directly to the sequencer 324.

When the decoding information of the sequencer 324 instructs additional decoding, the core circuit 326 may perform additional decoding on a data chunk which is selected among the data chunks. The core circuit 326 may perform additional decoding on a data chunk on which normal decoding has failed or a data chunk on which fast decoding has been performed, among the data chunks.

The memory 330 may serve as a working memory, a cache memory or a buffer memory of the processor 310. The memory 330 as a working memory may store software programs and various program data to be driven by the processor 310. The memory 330 as a cache memory may temporarily store cache data. The memory 330 as a buffer memory may temporarily store data to be transmitted between the external device and the data processing block 320. For example, the memory 330 may store data transmitted from the data input/output circuit 322, until it is transmitted to the external device.

According to an embodiment, the buffer circuit 323 may have a smaller capacity, and the memory 330 may have a larger capacity. In this case, the buffer circuit 323 may not be able to store at once all data chunks read from the nonvolatile memory device 200. Therefore, a data chunk on which decoding is performed by the core circuit 326 may be once outputted to the memory 330 without being retained in the buffer circuit 323 for a long time. For example, data on which normal decoding or fast decoding is performed by the core circuit 326 may be outputted to the memory 330 immediately after being stored in the buffer circuit 323. Then, a data chunk on which normal decoding has failed and a data chunk on which fast decoding has been performed, among the data chunks stored in the memory 330, may be transmitted again to the buffer circuit 323 to be applied with additional decoding of the core circuit 326.

Since the nonvolatile memory device 200 is similar to the nonvolatile memory device 200 of FIG. 1B, detailed description thereof will be omitted herein.

Figure 7:
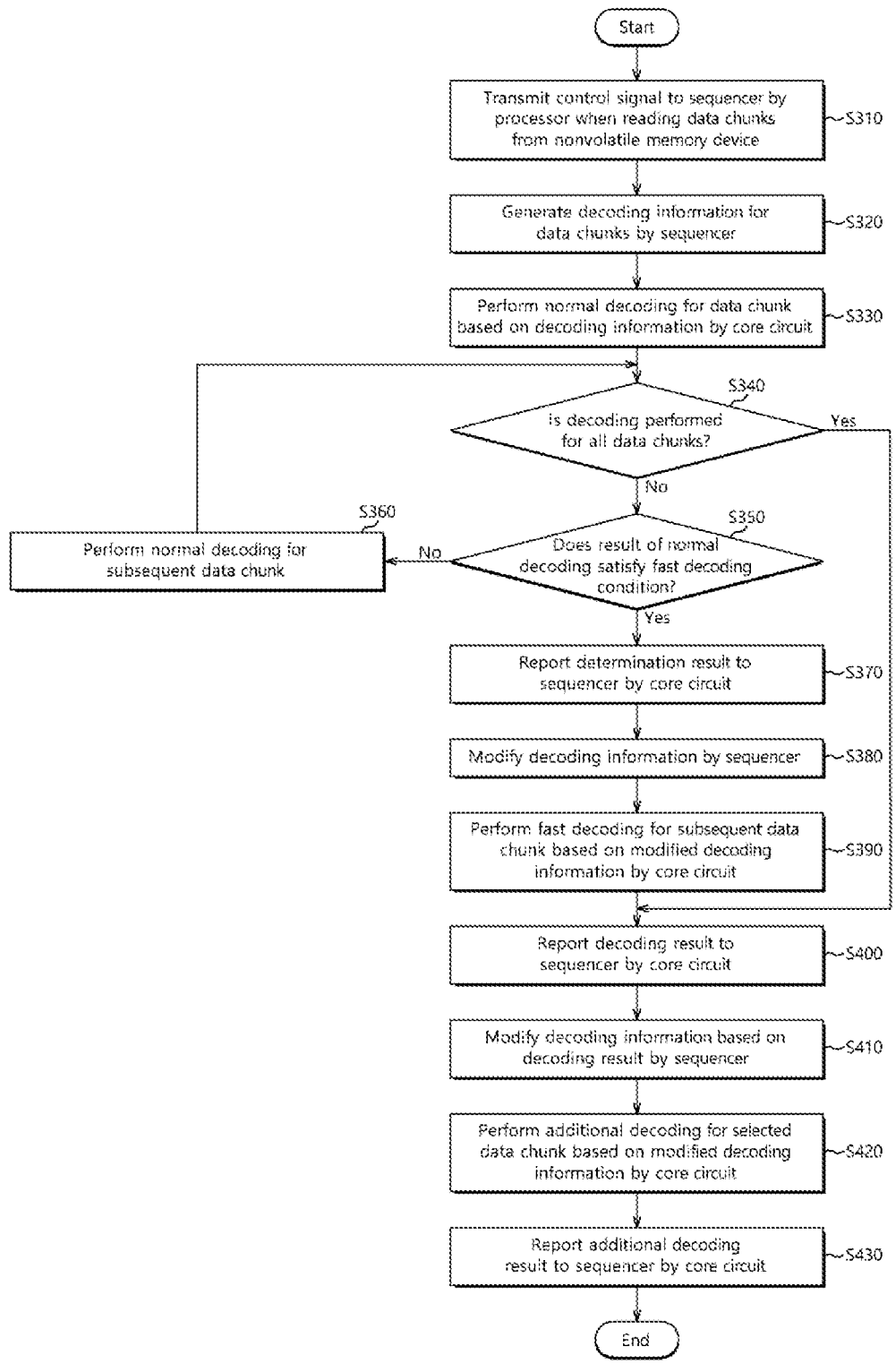
FIG. 7 is a representation of an example of a flow chart to assist in the explanation of a method for operating the data storage device 20 of FIG. 6 in accordance with an embodiment.

FIG. 7 is a representation of an example of a flow chart to assist in the explanation of a method for operating the data storage device 20 of FIG. 6 in accordance with an embodiment.

Referring to FIG. 7, at step S310, when reading data chunks from the nonvolatile memory device 200, the processor 310 may transmit a control signal to the sequencer 324. Data chunks may be read from the nonvolatile memory device 200, be transmitted to the buffer circuit 323 through the data input/output circuit 322 of the data processing block 320, and be stored in the buffer circuit 323. The control signal of the sequencer 324 may include an information on the size of data chunks.

At step S320, the sequencer 324 may generate a decoding information on the data chunks based on the control signal. The decoding information may include the number of all data chunks, a maximum decoding iteration count and a decoding type. At this time, the decoding type may indicate normal decoding. The sequencer 324 may store the decoding information in the decoding information memory 325 or directly transmit the decoding information to the core circuit 326.

At step S330, the core circuit 326 may perform normal decoding on a data chunk which is stored in the buffer circuit 323, based on the decoding information.

At step S340, the core circuit 326 may determine whether decoding has been performed on all data chunks on which decoding is instructed from the sequencer 324. The core circuit 326 may determine whether decoding has been performed on all data chunks, based on the number of data chunks included in the decoding information. When it is determined that decoding has been performed on all data chunks, the process may proceed to step S400. When it is determined that decoding has not been performed on all data chunks, the process may proceed to step S350.

At the step S350, the core circuit 326 may determine whether a result of normal decoding performed immediately before satisfies a fast decoding condition. A case where a result of normal decoding satisfies the fast decoding condition may include at least one among a case where normal decoding has failed, a case where the number of error bits corrected in normal decoding exceeds a threshold number and a case where a decoding iteration count in normal decoding exceeds a threshold iteration count. When it is determined that a result of normal decoding satisfies the fast decoding condition, the process may proceed to step S370. When it is determined that a result of normal decoding does not satisfy the fast decoding condition, the process may proceed to step S360.

At the step S360, the core circuit 326 may perform normal decoding on a subsequent data chunk which is stored in the buffer circuit 323.

At the step S370, the core circuit 326 may report to the sequencer 324 a determination result that a result of normal decoding satisfies the fast decoding condition.

At step S380, the sequencer 324 may modify the decoding information based on the determination result. The modified decoding information may include a decoding type indicating fast decoding. The sequencer 324 may store the modified decoding information in the decoding information memory 325 or directly transmit the modified decoding information to the core circuit 326.

At step S390, the core circuit 326 may perform fast decoding on at least one subsequent data chunk which is stored in the buffer circuit 323, based on the modified decoding information. An execution time of fast decoding may be shorter than an execution time of normal decoding. The core circuit 326 may perform fast decoding on all the remaining data chunks on which normal decoding has not been performed.

At the step S400, the core circuit 326 may report a decoding result to the sequencer 324. The core circuit 326 may report to the sequencer 324 that normal decoding or fast decoding has been performed for all the data chunks, as the decoding result.

At step S410, the sequencer 324 may modify the decoding information based on the decoding result. The modified decoding information may include a decoding type indicating additional decoding. According to an embodiment, the modified decoding information may indicate at least one selected data chunk on which additional decoding is to be performed. The sequencer 324 may store the modified decoding information in the decoding information memory 325 or directly transmit the modified decoding information to the core circuit 326.

At step S420, the core circuit 326 may perform additional decoding on a data chunk which is selected among all the data chunks, based on the modified decoding information. The core circuit 326 may perform additional decoding on a data chunk on which normal decoding has failed or a data chunk on which fast decoding has been performed, among all the data chunks.

At step S430, the core circuit 326 may report an additional decoding result to the sequencer 324. The core circuit 326 may report to the sequencer 324 whether additional decoding on selected data chunks is a success/failure, as the additional decoding result. Then, when additional decoding is a success, the sequencer 324 may transmit a decoding end signal to the processor 310 such that all the data chunks are transmitted to the external device.

Figure 8:
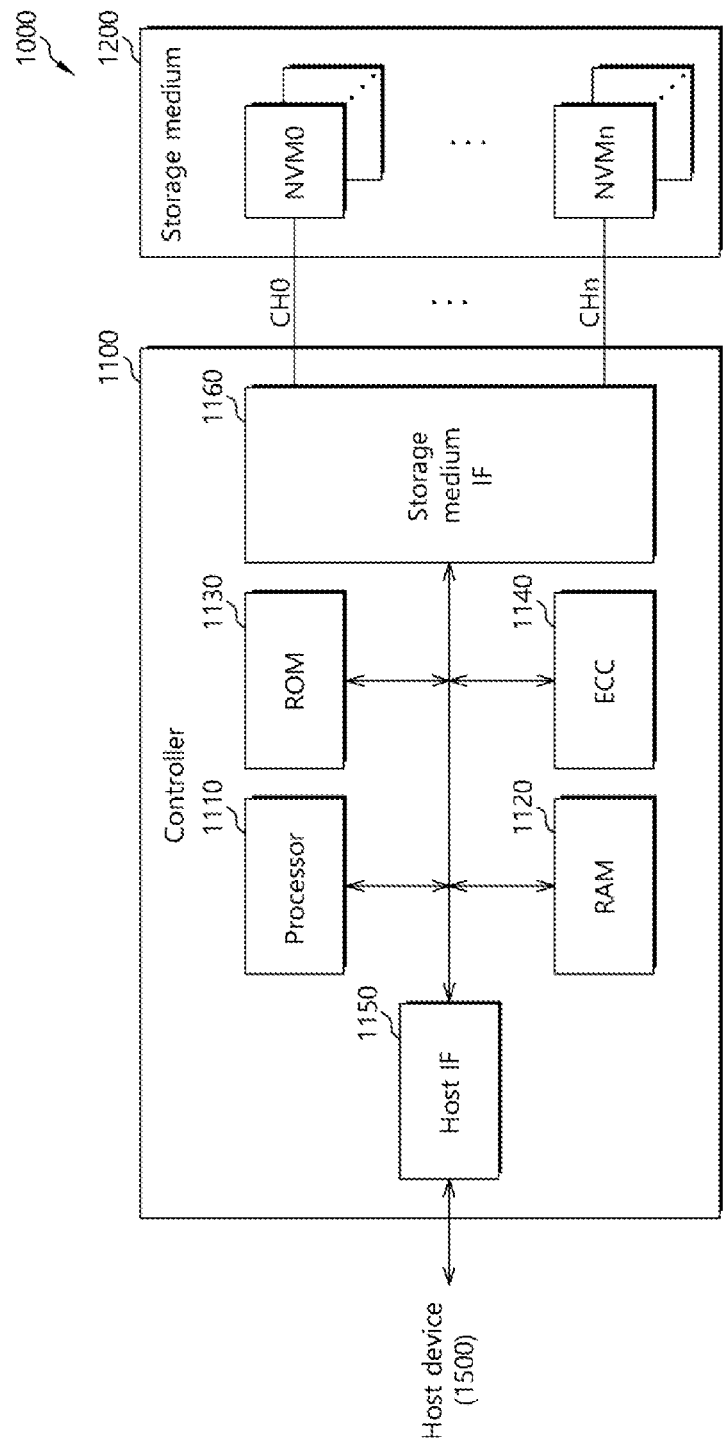
FIG. 8 is a block diagram illustrating a solid state drive (SSD), according to an embodiment of the invention.

FIG. 8 is a block diagram illustrating a solid state drive (SSD) 1000, according to an embodiment of the invention, the SSD 1000 comprising a controller 1100 and a storage medium 1200.

The controller 1100 may control the data exchange between a host device 1500 and the storage medium 1200. The controller 1100 may include a processor 1110, a RAM 1120, a ROM 1130, an ECC unit 1140, a host interface 1150, and a storage medium interface 1160. Although not illustrated, the controller 1100 may further include a data processing circuit which may be the same as the data processing circuit 100E described with reference to FIGS. 42 to 44.

The processor 1110 may control the general operations of the controller 1100. The processor 1110 may store data in the storage medium 1200 and read stored data from the storage medium 1200, in response to data processing requests from the host device 1500. In order to efficiently manage the storage medium 1200, the processor 1110 may control the internal operations of the SSD 1000 such as a merge operation, a wear leveling operation, and so forth. The processor 1110 may operate in a manner substantially similar to the processor 110 shown in FIG. 1B.

The RAM 1120 may store programs and program data to be used by the processor 1110. The RAM 1120 may temporarily store the data transmitted from the host interface 1150 before transferring it to the storage medium 1200. The RAM 1120 may temporarily store the data transmitted from the storage medium 1200 before transferring it to the host device 1500.

The ROM 1130 may store program codes to be read by the processor 1110. The program codes may include commands to be processed by the processor 1110, in order for the processor 1110 to control the internal units of the controller 1100.

The ECC unit 1140 may decode the data read from the storage medium 1200. The ECC unit 1140 may operate in a manner substantially similar to the data processing block 120 shown in FIG. 1. When decoding a plurality of data chunks sequentially read from the storage medium 1200, the ECC unit 1140 may perform normal decoding or fast decoding for a succeeding data chunk, based on a result of normal decoding for a previous data chunk. The ECC unit 1140 may include a plurality of decoders which perform decoding in a stepwise manner. The plurality of decoders may perform additional decoding for data chunks which the previous decoders thereof have failed to decode.

The host interface 1150 may exchange data processing requests, data, etc. with the host device 1500.

The storage medium interface 1160 may transmit control signals and data to the storage medium 1200. The storage medium interface 1160 may receive data from the storage medium 1200. The storage medium interface 1160 may be coupled with the storage medium 1200 through a plurality of channels CH0 to CHn. The storage medium interface 1160 may further include a data processing circuit (not shown) which may be the same as the data processing circuit 100E described with reference to FIGS. 42 to 44.

The storage medium 1200 may include a plurality of nonvolatile memory devices NVM0 to NVMn. Each of the plurality of nonvolatile memory devices NVM0 to NVMn may perform a write operation and a read operation under the control of the controller 1100.

Figure 9:
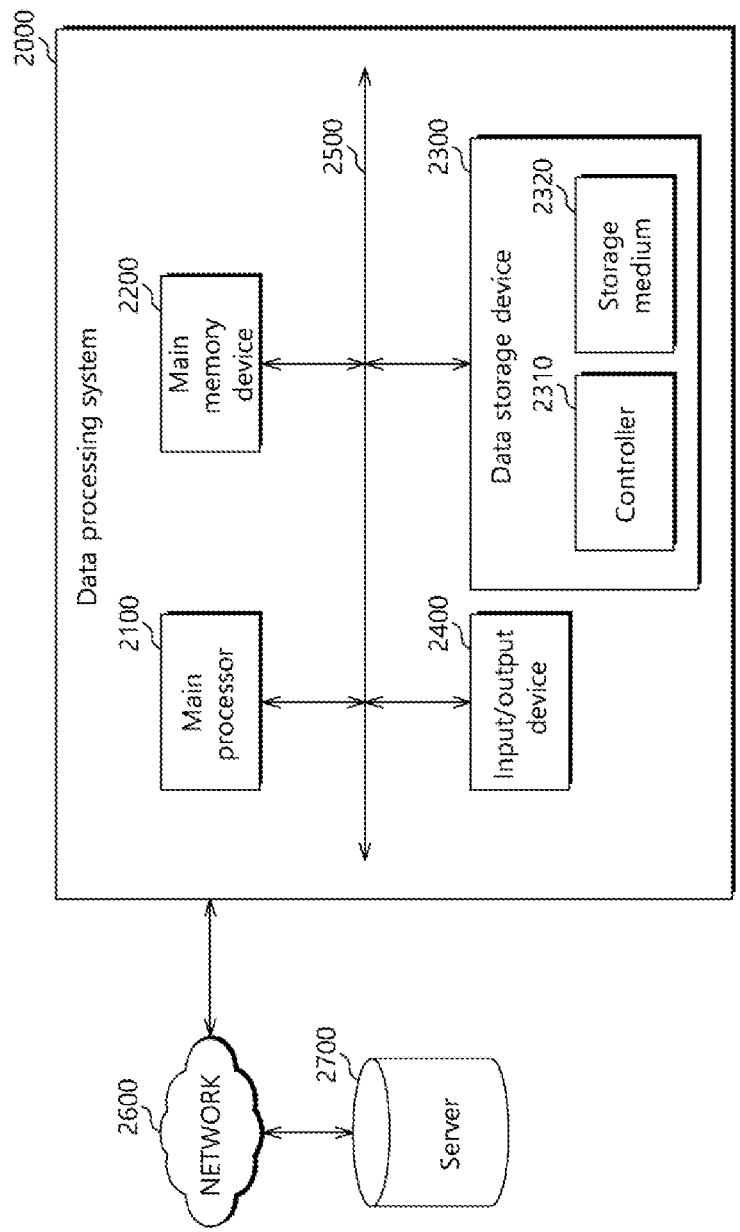
FIG. 9 is a block diagram illustrating a data processing system including a data storage device, according to an embodiment of the invention.

FIG. 9 is a block diagram illustrating a data processing system 2000 including a data storage device according to an embodiment of the invention.

The data processing system 2000 may be or comprise a computer, a laptop, a netbook, a smart phone, a digital TV, a digital camera, a navigator, or the like. For example, the data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control the general operations of the data processing system 2000. The main processor 2100 may be, for example, a central processing unit such as a microprocessor. The main processor 2100 may execute the softwares of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a memory controller 2310 and a storage medium 2320. Although not illustrated, the data storage device 2300 may further include a data processing circuit which may be the same as the data processing circuit 100E described with reference to FIGS. 42 to 44. The data storage device 2300 may be configured and operate in a substantially similar way as the data storage device 10 shown in FIG. 1B.

The input/output device 2400 may include a keyboard, a scanner, a touch screen, a mouse, or the like, capable of exchanging data with a user. The input/output device 2400 may receive a command for controlling the data processing system 2000 from the user or provide a processed result to the user.

According to an embodiment, the data processing system 2000 may communicate with at least one server 2700 through a network 2600 such as a LAN (local area network), a WAN (wide area network), a wireless network, and the like. The data processing system 2000 may include a network interface (not shown) to access the network 2600.

Figure 10:
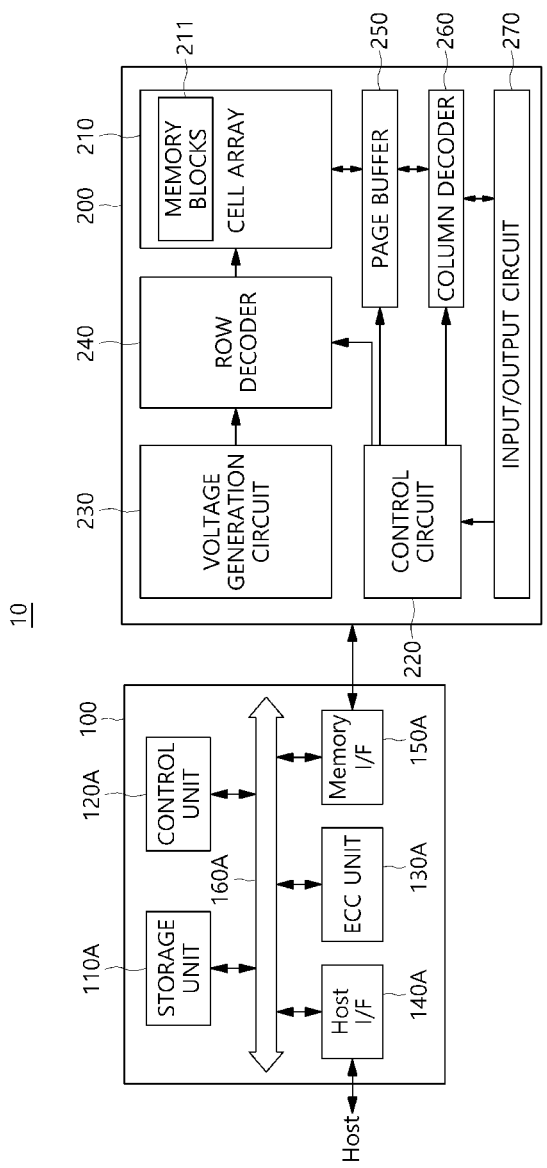
FIG. 10 is a block diagram illustrating a memory system in accordance with an embodiment of the present invention.

FIG. 10 is a detailed block diagram illustrating a memory system in accordance with an embodiment of the present invention. For example, the memory system of FIG. 10 may depict the memory system 10 shown in FIG. 1A.

Referring to FIG. 10, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random-access memory (DRAM) and a static random-access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random-access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110A, a control unit 120A, the error correction code (ECC) unit 130A, a host interface 140A and a memory interface 150A, which are coupled through a bus 160A. Although not illustrated, the controller 100 may further include a data processing circuit which may be the same as the data processing circuit 100E described with reference to FIGS. 42 to 44.

The storage unit 110A may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110A may be implemented with a volatile memory. The storage unit 110A may be implemented with a static random-access memory (SRAM) or a dynamic random-access memory (DRAM). As described above, the storage unit 110A may store data used by the host device in the memory device 200 for the read and write operations. To store the data, the storage unit 110A may include a program memory, a data memory, a write buffer, a read buffer, a map buffer, and so forth.

The control unit 120A may control general operations of the memory system 10, and a write operation or a read operation for the memory device 200, in response to a write request or a read request from the host device. The control unit 120A may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130A may detect and correct errors in the data read from the memory device 200 during the read operation. The ECC unit 130A may not correct error bits when the number of the error bits is greater than or equal to a threshold number of correctable error bits, and may output an error correction fail signal indicating failure in correcting the error bits.

In some embodiments, the ECC unit 130A may perform an error correction operation based on a coded modulation such as a low-density parity check (LDPC) code, a Bose-Chaudhuri-Hocqueng hem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130A may include all circuits, systems or devices for the error correction operation.

The host interface 140A may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150A may provide an interface between the controller 100 and the memory device 200 to allow the controller 100 to control the memory device 200 in response to a request from the host device. The memory interface 150A may generate control signals for the memory device 200 and process data under the control of the CPU 120A. When the memory device 200 is a flash memory such as a NAND flash memory, the memory interface 150A may generate control signals for the memory and process data under the control of the CPU 120A. The memory interface 150A may further include a data processing circuit (not shown) which may be the same as the data processing circuit 100E described with reference to FIGS. 42 to 44.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220. The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270. The control circuit 220 may control the peripheral circuit in response to the command and the address.

Figure 11:
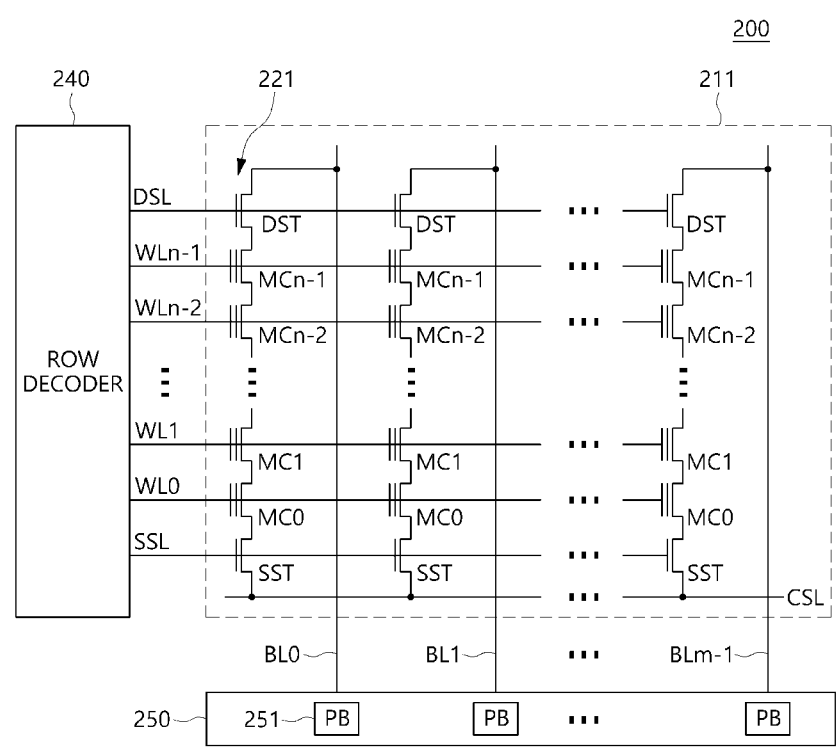
FIG. 11 is a circuit diagram illustrating a memory block of a memory device in accordance with an embodiment of the present invention.

FIG. 11 is a circuit diagram illustrating a memory block of a semiconductor memory device in accordance with an embodiment of the present invention. For example, a memory block of FIG. 11 may be the memory blocks 211 of the memory cell array 200 shown in FIG. 10.

Referring to FIG. 11, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 12:
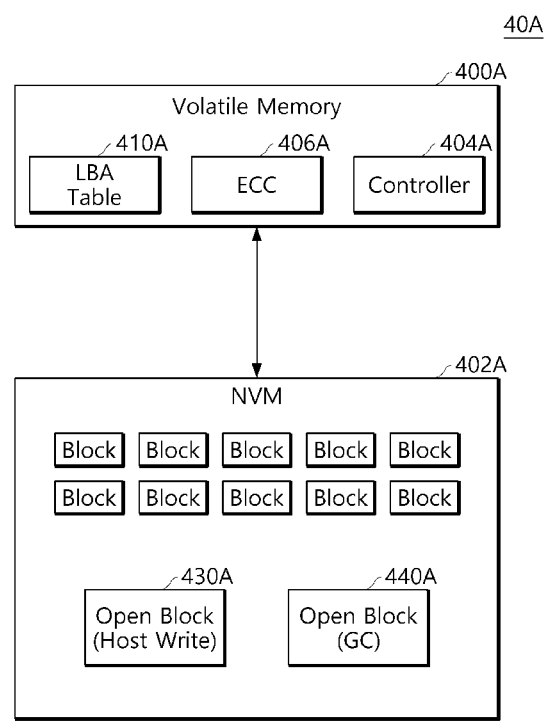
FIG. 12 is a diagram illustrating multiple optimal read reference voltages of a memory system in accordance with an embodiment of the present invention.

FIG. 12 is a diagram schematically illustrating top level block diagram of a memory system in accordance with an embodiment of the present invention. At FIG. 12, a general example of a memory system 40A is shown. The memory system 40A may include a volatile memory 400A (e.g., a DRAM) and a non-volatile memory (NVM) 402A (e.g., NAND) in communication with the volatile memory 400A. The volatile memory 400A may include a controller 404A, such as the controllers described herein, an error correcting code module 406A, and a logical bit address LBA table 410A for mapping physical to logical addresses of bits. The NVM 402A may include a plurality of memory blocks (and/or a plurality of super memory blocks), as well as an open block for host writes 430A and an open block for garbage collection (GC) 440A. The memory system 40A shows a general memory system, and additional/alternative components that may be utilized with memory systems to effectuate the invention disclosed herein will be understood to those of skill in the art.

As referred to herein, terms such as "NAND" or "NVM" may refer to non-volatile memories such as flash memories which may implement error correcting code processes. Further, "DRAM" may refer to volatile memories which may include components such as controllers and ECC modules.

Since data written on a NAND is subject to read errors (e.g., bit flips when read), the data written on the NAND may be protected by error correcting codes "ECCs". However, ECC decoding may still fail in some cases, such as cases due to NAND defects or other interferences.

To recover data after an ECC error, XOR-based recovery schemes are commonly used. In general, with an XOR-based scheme, the bitwise XOR of data pages from different die-plane pairs may be calculated and saved in a page called a "parity page", which together with the data pages may be referred to as a "stripe".

Figure 13:
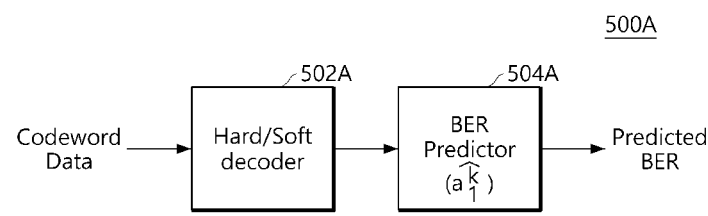
FIG. 13 is a diagram schematically illustrating top level block diagram of page health prediction of a memory system in accordance with an embodiment of the present invention.

FIG. 13 is a diagram schematically illustrating top level block diagram of page health prediction of a memory system in accordance with an embodiment of the present invention. The top level diagram 500A can comprise a hard/soft decoder 502A and a BER predictor 504A. The codeword data can be input to the hard/soft decoder 502A, and output of the BER predictor 504A can be predicated BER.

The codeword data coded with the error control coding scheme can be provided to the hard/soft decoder 502A for decoding. If the codewords of the codeword data can be decoded successfully, the iteration decoding process can be ended successfully. If the codewords of the codeword data cannot be decoded successfully, the failed codewords at ith iteration can be used for the BER estimation or predication. Typically, the hard/soft decoder 502A starts with hard decoding, and proceed with soft decoding when the hard decoding is failed.

The BER estimation can be defined as $$\tilde{\alpha}_1^k = \mathrm{argmin}_{\alpha_1^k}\left(BER - \sum_{i=1}^{k} F_i\, \alpha_1\right)^2$$

Where the BER is the bit error rate of the codeword of the codeword data, $F_i$ is the number of failed constituent codewords at ith iteration from the hard/soft decoder 502A, $\alpha_i$ is the estimator coefficient for the prediction, "argmin" stands for argument of the minimum, which is smallest value of function of the arguments.

If L samples are used to find the estimated $\tilde{\alpha}_1^k$, the BER vector can be written as, $A\alpha_1^k = B$, where $$A = \begin{pmatrix} F_1^1 & \cdots & F_k^1 \\ \vdots & \ddots & \vdots \\ F_1^L & \cdots & F_k^L \end{pmatrix} \text{ and } B = \begin{pmatrix} BER_1 \\ BER_2 \\ \cdot \\ \cdot \\ BER_L \end{pmatrix}.$$

Where the L samples comprises L samples for different data points, and corresponding L codewords with different BER can be generated offline and decoding thereof can be performed for k iterations. Each row of matrix A corresponds to one of the L vectors/samples, and each of the L samples comprises the numbers of failed constituent codewords of each of the k iterations. Wherein more elements or points in the L samples can predict higher accuracy of line slope, resulting in more accurate BER prediction.

The estimated $\tilde{\alpha}_1^k$ is given as, $$\tilde{\alpha}_1^k = (A^T A)^{-1} A^T B,$$

Where $A^T$ is transpose of A, $(A^T A)^{-1}$ is inverse of $(A^T A)$. Observed in simulations, after 3 iterations, the decoder data of matrix A entities is good enough to predict the BER with reasonable accuracy. A tradeoff between the accuracy of the BER prediction and the number of iterations k needs to be determined in accordance with the memory system configuration.

Figure 14:
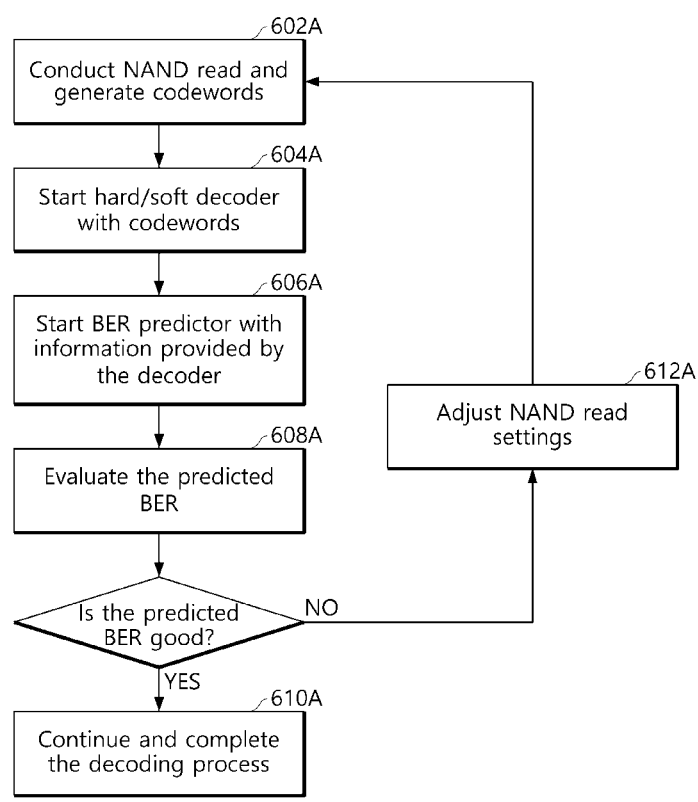
FIG. 14 is a flow diagram illustrating page health prediction of a memory system in accordance with an embodiment of the present invention.

FIG. 14 is a flow diagram illustrating page health prediction of a memory system in accordance with an embodiment of the present invention. The page health prediction process can include numerous iterations, although a typical number of iteration can be set as three.

For example, the page health prediction process can start from a NAND read and codewords generation in a step of 602A. During the first iteration when l=1, a first codeword data, such as the first set of L samples, can be provided to the hard/soft decoder 502A of FIG. 13, wherein the index i is an integer and 1≤i≤k. The hard/soft decoder 502A can starts the decoding process at time T1 in a step of 604A. As soon as sufficient decoder information collected to start the BER prediction process, the hard/soft decoder 502A can forward the collected decoder information to the BER predictor 504A to start the BER prediction process at time T2 in a step of 606A, wherein the collected decoder information can include the numbers of failed constituent codewords of the L samples at the current iteration, such as iteration 0. For example, the BER prediction process can provide a prediction result at time T3 before the decoding process can be completed at time T4, wherein T1<T2<T3<T4. The collected decoder information can include product codes, wherein the product codes can be constructed in any number dimensions by interleaving data in any dimension. For example, when m denotes the number of dimension and/denotes the number of iterations, the product codes can be constructed with a number of the features of data information, such as the number of codewords decoded and number of codewords failed in each dimension. The number of features of data information can be calculated as 2*m*l, wherein the features of data information can be provided for predicting BER.

The BER predictor 504A can calculate the predicted BER before the decoding iteration completion. The predicted BER can be provided to a plurality functional blocks for various purposes, such that, the ECC controller can use the predicted BER to evaluate and further optimize the ECC process, or the memory controller can use the predicted BER to choose an optimal read reference threshold. The predicted BER can be evaluated and categorized in a step of 608, such that the predicted BER can be categorized to different levels, such as good, bad, or very bad.

If the predicted BER is evaluated as good, most likely that the decoding iteration can be successful, the decoding iteration can be continued until completion in a step of 610A. If the predicted BER is evaluated as not good, the NAND read settings can be adjusted in accordance with the predicted BER of the current iteration in a step of 612A, a second NAND read can be performed, and a second codeword data, such as a second set of L samples can be provided to the hard/soft decoder 502A to start a second iteration of decoding, where i=2. The NAND read setting for the second NAND read can be adjusted responsively to the current predicted BER, such that, if the predicted BER is very bad the NAND setting can be adjusted dramatically, or if the predicted BER is bad but not very bad, the NAND setting can be adjusted moderately. The second iteration of decoding and BER predication can be performed with the second set of codeword data, the predicted BER can be evaluated again to determine if another iteration is needed for a successful decoding.

Optionally, the BER evaluation may be repeated in the same iteration a certain time after the first BER evaluation, with an updated set of the numbers of failed constituent codewords of the L samples at the current iteration, when the categorization of the predicted BER is bad but not very bad. The probability of successful decoding can be re-evaluated, the updated evaluation result can be used to determine whether the decoding process can continuedly proceed, or to adjust the NAND read setting and restart another decoding iteration.

The parameters for categorizing the predicted BER can be predetermined in accordance with the memory system configuration. For a certain value of the predicted BER, categorization of the predicted BER as good, bad, or very bad, can be different in different memory system. For example, a predicted BER can be categorized as good in one memory system, or as bad in another memory system.

If a third iteration is needed for the successful decoding, the NAND read settings can be adjusted again for a third NAND read and a third decoding iteration, where i=3. The hard/soft decoder 502A and the BER predictor 504A can repeat the decoding iterations described above, and more iterations may be conducted. The maximum number of iterations can be predetermined in accordance with the memory system configuration and request. However, simulation shows that 3 iterations can be sufficient to estimate a reasonably accurate BER without prolonging the decoding process.

The embodiments of the present invention disclose a memory system and operating method thereof for predicting page health of the memory blocks. The page health prediction is very important to the memory system, since the accurate page health prediction can reduce the write amplification and decoding latency time. The page health prediction, such as the predicted BER, can be used in various applications, such as ECC controller for optimizing ECC process, or memory controller for selecting an optimal read reference threshold.

Advanced to the traditional decoding process, instead of waiting until the end of the decoding process to know if the decoding process is successful, the embodiments of the present invention provide a novel memory system and operating method thereof, which can predict whether the decoding process can be successful ahead of completion of the current decoding iteration. Furthermore, the prediction can be utilized to adjust NAND read settings and restart another decoding iteration with updated NAND data according to the adjusted NAND read settings, resulting in a more accurate prediction and a shorter decoding latency time.

Another application of utilization of the page health prediction can be for garbage collection of the memory system. It has been discovered that the memory system and the operating method of page health prediction can dramatically improve the decoding success rate and reduce decoding latency time, further improve the memory system performance and reduce the power consumption.

Figure 15:
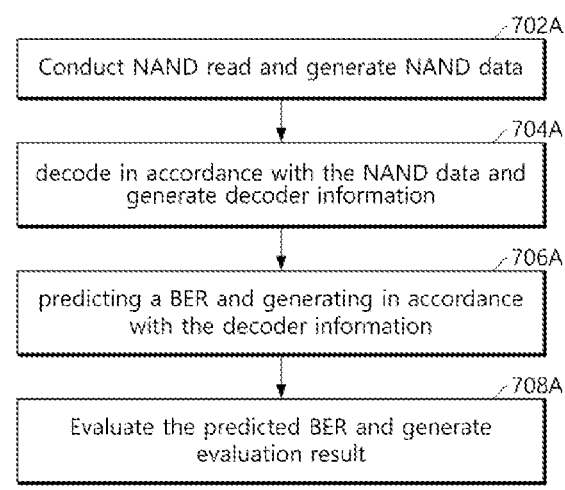
FIG. 15 is a flow chart illustrating a method of page health prediction of a memory system in accordance with a further embodiment of the present invention.

FIG. 15 is a flow chart illustrating a method of page health prediction of a memory system in accordance with a further embodiment of the present invention. The method comprising: performing a decoding iteration includes conducting NAND read and generating NAND data in a block of 702A; decoding in accordance with the NAND data and generating decoder information in a block of 704A; predicting a BER in accordance with the decoder information in a block of 706A; and evaluating the predicted BER and generating evaluation result in a block of 708A.

Thus, it has been discovered that the architecture of a memory system of the present invention furnishes important and heretofore unknown and unavailable solutions, capabilities, and functional aspects for a unified optimized acceleration architecture. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

Generally, LDPC decoding uses an iterative decoding process. The iterative decoding process ends based on two parameters. First, if a syndrome of a decoded codeword is zero, the iterative decoding for that codeword is terminated. The syndrome is zero when all errors, if any were existent, have been corrected by the LDPC decoder. Second, if the syndrome is not zero, but the number of iterations reaches a maximum number, the iterative decoding ends. This scenario occurs when the iterative decoding does not correct all the errors. Under this scenario, the iterative decoding is repeated until the maximum number of iterations regardless of information that the non-zero syndrome may reveal. Because the iterative decoding is "blindly" repeated until the maximum number of iterations, its overall latency and processing performance directly depends on this maximum number. The larger the maximum number is, the worse the latency and processing burden can become.

To improve the latency and processing performance, embodiments of the present disclosure are directed to an early termination of LDPC decoding. In an example, a set of additional parameters is introduced to terminate the iterative decoding procedure prior to reaching the maximum number of iterations. This set relates to information that the non-zero syndrome reveals about the decoding. The weight of the non-zero syndrome represents the checksum of the codeword. If after a certain number of iterations, the non-zero weight of the syndrome is too large, that large weight indicates that the likelihood of correcting all the errors of the codeword is low, even if the maximum number of iterations is performed. In another illustration, if the change to the weight of the syndrome between the iterations indicates that the weight is not properly improving (e.g., its value is not zero and is increasing, staying constant or relatively stable, or not decreasing at an acceptable decrease rate), the likelihood of correcting all the errors of the codeword is also low, even if the maximum number of iterations is performed. Hence, under these two scenarios, terminating the iterative decoding prior to reaching the maximum number of iterations is advantageous because the early termination improves the latency and reduces the processing burden without a significant degradation, if any, to the correction capability of the iterative decoding (e.g., to the bit error rate (BER) performance).

Hence, various embodiments of the present disclosure involve the use of the additional set parameter for the early termination of the iterative decoding procedure. In an example, this set includes the number of iterations and the weight of the syndrome. More specifically, the number of iterations is monitored. When the number for a current iteration reaches an iteration number threshold that is smaller than the maximum number of iterations, the weight of the non-zero syndrome is compared to a checksum threshold. If the comparison indicates that the weight of non-zero syndrome at the current iteration is greater than the checksum threshold, the likelihood of correcting all the errors of the codeword is low even if subsequent iterations are performed up to the maximum number of iterations. Accordingly, the iterative decoding is terminated at the current iteration. On the other hand, if the comparison indicates that the weight of the non-zero syndrome at the current iteration is smaller than the checksum threshold, one or more of the subsequent iterations are performed.

In the interest of clarity of explanation, the embodiments of the present disclosure are described in connection with LDPC decoding. However, the embodiments are not limited as such and apply to other decoding procedures that rely on the syndrome of a codeword.

Figure 16:
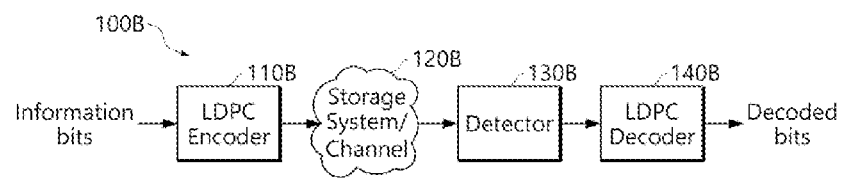
FIG. 16 illustrates an example high level block diagram of an error correcting system, in accordance with certain embodiments of the present disclosure.

FIG. 16 illustrates an example high level block diagram of an error correcting system 100B, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 1108 receives information bits that include data which is desired to be stored in a storage system 120B. LDPC encoded data is output by the LDPC encoder 1108 and is written to the storage 120B.

In various embodiments, the storage 120B may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130B receives data from the storage system 120B. The received data may include some noise or errors. The detector 130B performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140B which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140B are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the code word and the other set of nodes, e.g., check nodes, correspond to the set of parity-check constraints satisfied by the code words. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a code word by p results in another code word. Here p is the size of square matrix which is either a zero matrix or a circulant matrix. This is a generalization of a cyclic code in which a cyclic shift of a code word by 1 results in another code word. The block of p×p matrix can be a zero matrix or cyclically shifted identity matrix of size p×p.

Figures 17A, 17B:
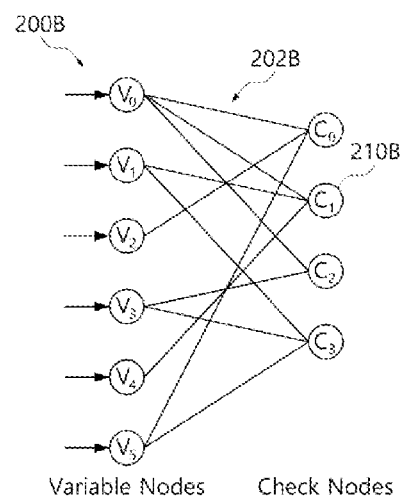
FIGS. 17A-17B illustrate an example parity-check matrix and an example graph representing the parity-check matrix, in accordance with certain embodiments of the present disclosure.

FIG. 17A illustrates an example parity-check matrix H 200B and FIG. 17B illustrates an example bipartite graph corresponding to the parity-check matrix 200B, in accordance with certain embodiments of the present disclosure. In this example, the parity-check matrix 200B has six column vectors and four row vectors. Network 202B shows the network corresponding to the parity-check matrix 200B and represent a bipartite graph. Various type of bipartite graphs are possible, including, for example, a Tanner graph.

Generally, the variable nodes in the network 202B correspond to the column vectors in the parity-check matrix 200B. The check nodes in the network 202B correspond to the row vectors of the parity-check matrix 200B. The interconnections between the nodes are determined by the values of the parity-check matrix 200B. Specifically, a "1" indicates the corresponding check node and variable nodes have a connection. A "0" indicates there is no connection. For example, the "1" in the leftmost column vector and the second row vector from the top in the parity-check matrix 200B corresponds to the connection between the variable node 204B and the check node 210B.

A message passing algorithm is generally used to decode LDPC codes. Several variations of the message passing algorithm exist in the art, such as min-sum algorithm, scaled min-sum algorithm or the like. In general, any of the variations of the message passing algorithm may be used in an LDPC decoder without departing from the teachings of the present disclosure. Message passing uses a network of variable nodes and check nodes, as shown in FIG. 17B. The connections between variable nodes and check nodes are described by and correspond to the values of the parity-check matrix 200, as shown in FIG. 17A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword as further illustrated in the next figures. It should be noted that a soft-decision decoder works similarly, however, each of the messages that are passed among check nodes and variable nodes, also include reliability of each bit.

An example message passing algorithm may be performed.

In this example, L(qij) represents a message that is sent by variable node $v_i$ to check node $c_j$; L($r_{ji}$) represents the message sent by check node $c_j$ to variable node $v_i$; and (L($c_i$) represents initial LLR value for each variable node $v_i$. Variable node processing for each L(qij) can be done through the following steps:

(1) Read L($c_i$) and L($r_{ji}$) from memory.
(2) Calculate L(Qi-sum)=L($c_i$)+Scaling Factor*$\Sigma_{j \in c_i}$L($r_{ij}$).
(3) Calculate each L(Qi-sum)~L($r_{ij}$).
(4) Output L(Qi-sum) and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each L(rji) can be performed as follows:

(1) Read one row of qij from memory.
(2) Calculate L(Rj-sum) as follows:

$$L(Rj - \text{sum}) = \left(\prod_{i' \in R_j} \alpha_{i'j}\right) \phi\left(\sum_{i' \in R_j} \phi(\beta_{i'j})\right)$$

$$\alpha_{ij} = \text{sign}(L(q_{ij})), \beta_{ij} = |L(q_{ij})|,$$

-continued $$\emptyset(x) = -\log\left(\tanh\left(\frac{x}{2}\right)\right) = \log\left(\frac{e^x+1}{e^x-1}\right)$$

(3) Calculate the individual $L(r_{ji})=(\emptyset_{i'\in R_{ji}}\alpha_{i'j})\emptyset(\Sigma_{i'\in R_{ji}}\emptyset(\beta_{i'j}))$ for check nodes.
(4) Write back $L(r_{ji})$ to memory.
(5) If this is not the last row of memory, then go to the first step and increment j by one.

Figure 18:
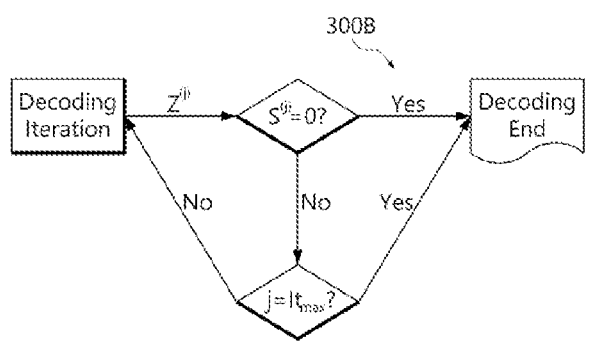
FIG. 18 illustrates an example diagram for terminating an LDPC iterative decoding based on a syndrome and maximum number of iterations, in accordance with certain embodiments of the present disclosure.

FIG. 18 illustrates an example diagram 300B for terminating an LDPC iterative decoding based on a syndrome and maximum number of iterations, in accordance with certain embodiments of the present disclosure. The termination depends on either the syndrome of a codeword being a zero or the number of iterations reaching the maximum number.

As illustrated in diagram 300B, suppose that $x=[x_0, x_1, \ldots, x_{N-1}]$ is a bit vector, and $H=[h_{i,j}]$ is an M×N low-density parity-check matrix with a binary value hu at the intersection of row i and column j. Then each row of H provides a parity check for x. If x is a codeword of H, $xH^T=0$ because of the LDPC code construction. Assume that x is transmitted over a noisy channel, and the corrupted channel output is $y=[y_0, y_1, \ldots, y_{N-1}]$ and its hard decision is $z=[z_0, z_1, \ldots, z_{N-1}]$. The syndrome of z is a binary vector calculated by $s=[s_0, s_1, \ldots, s_{N-1}]=zH^T$, with a weight of $\|s\|$. The weight of $\|s\|$ represents the number of unsatisfied check nodes and is also called the checksum since $$\|s\| = \sum_{i=0}^{M-1} s_i.$$

Suppose that $z^{(j)}=z=[z_0, z_1, \ldots, z_{N-1}]$ is the hard decision of the j-th iteration and the syndrome vector of the j-th iteration is $s^{(j)}=[s_0^{(j)}, s_1^{(j)}, \ldots, s_{N-1}^{(j)}]=z^{(j)}H^T$. Then $\|s\|^{(j)}$ is the checksum of the j-th iteration.

As further illustrated in diagram 300B, the iterative decoding is terminated either when the checksum is zero (shown with $s^{(j)}=0$), or when the checksum is non-zero and the iteration number reaches the predefined maximal iteration number (shown with $j=\text{It}_{max}$, where "$\text{It}_{max}$" is the maximum number of iterations). Otherwise, the iterative decoding is repeated.

Figure 19:
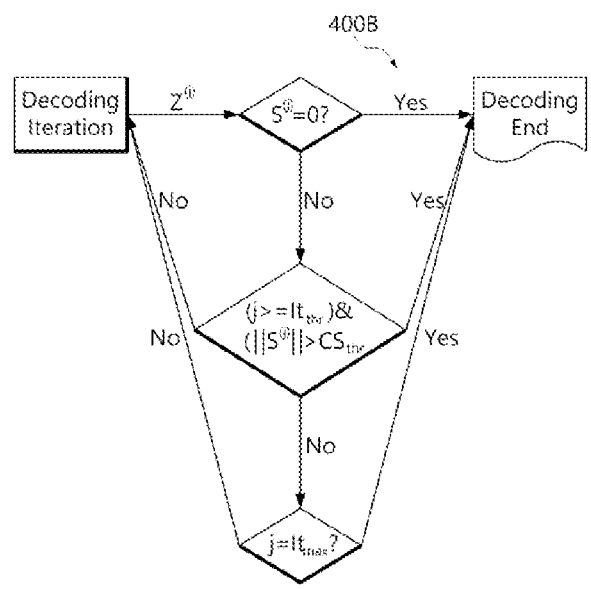
FIG. 19 illustrates an example diagram for early terminating an LDPC iterative decoding based on a current number of iterations and the syndrome at the current iteration, in accordance with certain embodiments of the present disclosure.

FIG. 19 illustrates an example diagram 400B for early terminating an LDPC iterative decoding based on a current number of iterations and the syndrome at the current iteration, in accordance with certain embodiments of the present disclosure. The termination of diagram 400B introduces an additional set of parameters: the iterative decoding is terminated prior to reaching the maximum number depending on the current iteration reaching a threshold iteration number and the information about the syndrome at the current iteration (e.g., the weight of the syndrome) being greater than a checksum threshold.

In an example, to reduce the average iteration number, two additional parameters are used. "$\text{It}_{thr}$" is defined as an iteration number threshold and "$CS_{thr}$" is defined as a checksum threshold. These two new parameters can be used to define an early termination rule for decoding termination, where this rule accounts also for a zero-syndrome and the maximum number of iterations "$\text{It}_{max}$." For instance, according to the early termination rule, the decoding algorithm is terminated either when the checksum is zero (shown with $s^{(j)}=0$), when the current number of iterations reaches the iteration number threshold and the weight of the syndrome (or, similarly, the checksum of the codeword) equals or exceeds the checksum threshold (shown as $j \geq \text{It}_{thr}$ and $\|s\|^{(j)} > CS_{thr}$), or when the maximum iteration number is reached.

Figure 20:
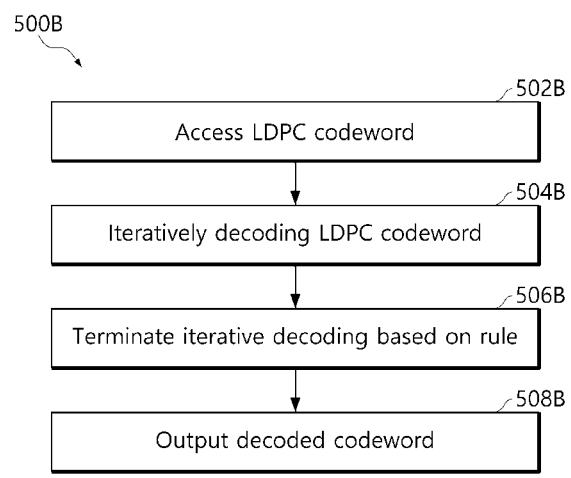
FIG. 20 illustrates an example flow for an LDPC iterative decoding, in accordance with certain embodiments of the present disclosure.
Figure 21:
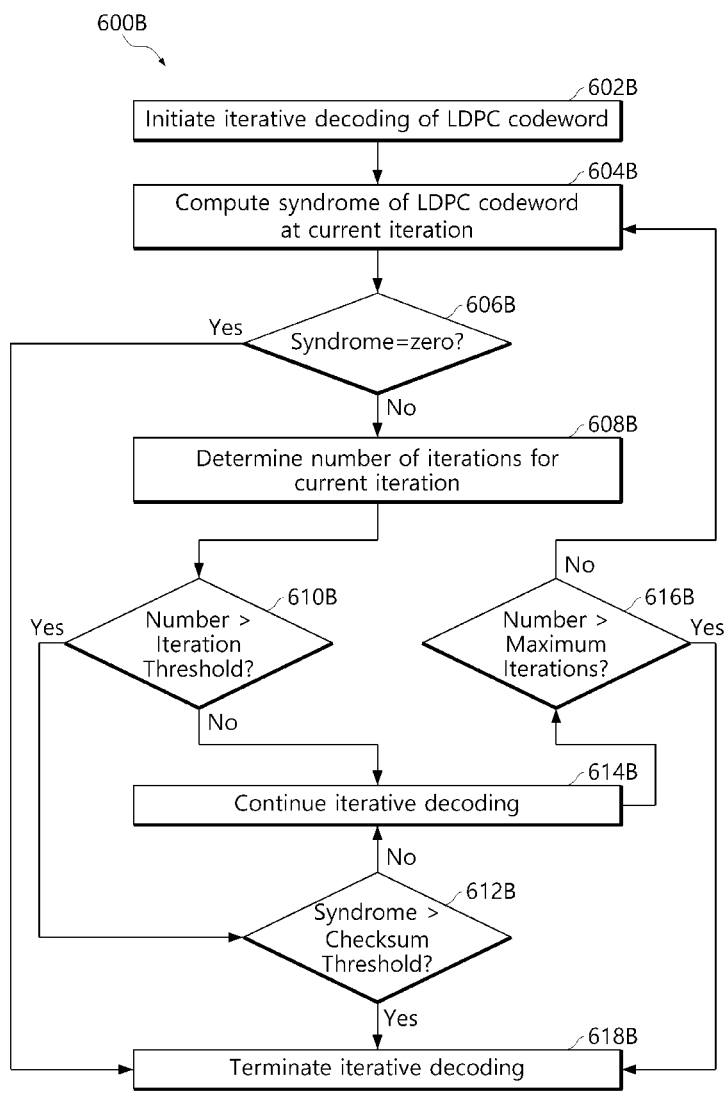
FIG. 21 illustrates an example flow for early termination of an LDPC iterative decoding based on a current number of iterations and the syndrome at the current iteration, in accordance with certain embodiments of the present disclosure.
Figure 22:
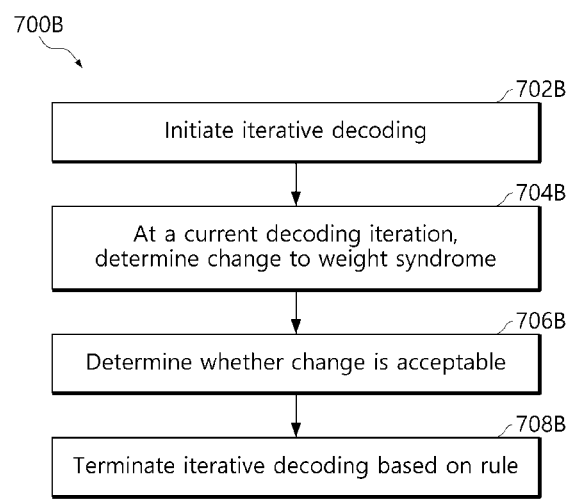
FIG. 22 illustrates an example flow for using the syndrome at the current iteration to generate a decision for an early termination of an LDPC iterative decoding, in accordance with certain embodiments of the present disclosure.

FIGS. 20-22 illustrate example flows for decoding a codeword, such as an LDPC codeword, based on an iterative decoding process that uses an early termination rule, where this rule applies parameters that relate to the syndrome of the decoded codeword. A system is described as performing particular operations of the example flows. In particular, the system implements an error correcting system, such as the error correcting system 100B of FIG. 16. The system may have a specific hardware configuration to perform the operations of the error correcting system, including those of a decoder (e.g., an iterative decoder such as the LDPC decoder 140B of FIG. 16). Alternatively or additionally, the system may include generic hardware configured with specific instructions. In an example, the system includes one or more processors and one or more memories. The memory(ies) stores computer-readable instructions to embody functionalities specific to the system. The instructions, when executed by the processor(s) of the system, result in performance of the functionalities by the system. The instructions stored in the memory(ies) in conjunction with the underlying processor(s) represent means for performing the functionalities. Some of the operations across the example flows are similar. In the interest of brevity, the similarities are not repeated herein. Further, although the operations are illustrated in a particular order, other arrangement of the operations are possible and some of the operations may be skipped as it would be apparent to a person skilled in the art.

FIG. 20 illustrates an example flow 500B for an LDPC iterative decoding, in accordance with certain embodiments of the present disclosure. As illustrated, the example flow 500B starts at operation 502B, where the system accesses an LDPC codeword. For example, the LDPC codeword is accessed from storage in response to a request for information bits stored in the storage. The information bits were encoded using an LDPC encoding process and stored in the storage.

At operation 504B, the system iteratively decodes the LDPC codeword. For example, the system implements a hard or soft iterative LDPC decoding process and inputs the LDPC codeword to such a process. The iterative decoding process, whether soft or hard, monitors the number of iterations, computes the syndrome of the LDPC codeword (e.g., of the decoded codeword), and applies the early termination rule based on the syndrome and the number of iterations to either continue the iterative decoding or to terminate this decoding early prior to reaching the maximum number of iterations. These and other operations related to the early termination are further described in connection with the next figures.

At operation 506B, the system terminates the iterative decoding early (e.g., prior to reaching the maximum number of iterations) based on the early termination rule. In an example this rule includes various parameters that control the early termination prior to reaching the maximum number of iterations. One of the parameters is whether the syndrome is zero or not. If the syndrome is zero, the early termination rule specifies that the iterative decoding should stop at the current iteration. If the syndrome is non-zero, the system checks additional parameters.

One of the additional parameters is the current number of iterations. Another additional parameter is the weight of the syndrome. If the current number of iterations is less than an iteration number threshold, the iterative decoding proceeds to the next decoding iteration. In contrast, if the current number of iterations is equal to or greater than the iteration number threshold, the system checks the weight of the syndrome.

Various types of checks are possible (each of which may define an additional parameter). One example check compares the weight of the syndrome at the current iteration (e.g., the current value of this weight, or similarly, the current checksum of the decoded codeword at the current decoding iteration) and a checksum threshold (e.g., the weight is compared to the checksum threshold). If the comparison indicates that the weight is equal to or greater than the checksum threshold, the system terminates the iterative decoding at the current iteration. That is because the comparison indicates that the weight of the syndrome is too large such that the likelihood of correcting all the errors of the codeword is low even if the maximum number of iterations is performed. Otherwise, the iterative decoding proceeds to the next decoding iteration.

Another example check monitors the change to the weight of the syndrome from a number of previous decoding iterations (five, or half way from (or some other fraction or function) the current iteration to the maximum number of iterations) the start of the iterative decoding). If the change indicates that the weight is relatively stable (e.g., changes within a predefined weight range such as +/−1), is constant, is not improving (e.g., is worsening by increasing instead of decreasing), or is less than a predefined change rate threshold, the system terminates the iterative decoding at the current iteration. That is because the rate of change to the weight of the syndrome indicates that no significant BER gains are likely to be achieved even if the maximum number of iterations is performed. Otherwise, the iterative decoding proceeds to the next decoding iteration.

Of course, concurrent use of both types of checks is possible. For example, once the number of iterations reaches the iteration number threshold, the system compares the weight of the syndrome at the current iteration to the checksum threshold. If the weight is equal to or greater than the checksum threshold, the system starts monitoring the change to the weight of the syndrome over a next number of iterations to determine whether to terminate the iterative decoding at any of the subsequent decoding iterations but prior to reaching the maximum number of iterations (e.g., depending on whether the change indicates that the weight is relatively stable, is constant, is not improving, or is less than a predefined change rate threshold such as the weight decreasing by three (or some other values) between each iteration). This next number of iterations can be predefined (e.g., five, or half way from (or some other fraction or function) the current iteration to the maximum number of iterations)).

In an example, the various parametric values are predefined based on a simulation of the latency performance and/or processing performance of the system (or of the LDPC decoder). Generally, the simulation varies the different parametric values. The parametric values resulting in the best or desired latency performance and/or processing performance are stored in the memory of the system. As described herein above, these parameter values include the iteration number threshold, the checksum threshold, the change rate threshold, the number of previous decoding iterations, the number of additional decoding iterations, the weight range, and the maximum number of iterations. In an illustrative example, the maximum number of iterations is in the range of fifteen to twenty-five, the iteration number threshold is smaller than the maximum number of iterations and is in the range of ten to twenty, and checksum threshold is in the range of twenty-five to thirty-five. In another illustrative example, the iteration number threshold is in the range of sixty to eighty percent of the maximum number of iterations.

At operation 508B, the system outputs the decoded codeword. For example, upon termination of the iterative decoding process, the system determines the decoded information bits and outputs these information bits as being representative of the originally encoded and stored information bits.

FIG. 21 illustrates an example flow 600B for early termination of an LDPC iterative decoding based on a current number of iterations and the syndrome at the current iteration, in accordance with certain embodiments of the present disclosure. Some or all of the operations of example flow 600B may be implemented as sub-operations of operations 504B and 506B of the example flow 500B of FIG. 20.

As illustrated, the example flow 600B starts at operation 602B, where the system initiates an iterative decoding of an LDPC codeword. In an example, the iterative decoding is bounded by a maximum number of iterations. The system starts with the first iteration and sets an iteration counter to one. The iterative decoding uses soft or hard decoding.

At operation 604B, the system computes a syndrome associated the LDPC codeword at a current iteration. This syndrome corresponds to the checksum of the decoded LDPC codeword at the current iteration. The current iteration is the first iteration when operation 604B is performed for the first time after the initiation of the iterative decoding at operation 602B. Otherwise, the current iteration is the latest iteration through which the system is decoding the LDPC codeword. In an example, x is a codeword of H and $xH^T=0$ because of the LDPC code construction. The LDPC codeword under decoding is $y=[y_0, y_1, \ldots, y_{N-1}]$ and is different than because of x channel noise. In the current iteration, the system decodes y hard decision is $z=[z_0, z_1, \ldots, z_{N-1}]$. The system computes the syndrome of z as a binary vector calculated by $s=[s_0, s_1, \ldots, s_{N-1}]=zH^T$. The system also computes the weight of s as $\|s\|$. $z^{(j)}=z=[z_0, z_1, \ldots, z_{N-1}]$ is the hard decision of the j-th iteration (the current iteration) and the syndrome vector of the j-th iteration is $s^{(j)}=[s_0^{(j)}, s_1^{(j)}, \ldots, s_{N-1}^{(j)}]=z^{(j)}H^T$. Then $\|s\|^{(j)}$ is the weight (or, similarly, checksum) of the j-th iteration (the current iteration).

At operation 606B, the system determines whether the syndrome at the current iteration is zero or not. For example, if the weight is zero, the system determines that the syndrome is zero. Otherwise, the system determines that the syndrome is non-zero. If the syndrome is zero, operation 618B is performed after operation 606B and the system terminates the iterative decoding at the current iteration and outputs the decoded codeword. Otherwise, operation 608 is performed after operation 606B such that the system checks whether other parameters of the early termination rule are satisfied to support the early termination or not.

At operation 608B, the system determines the number of iterations that corresponds to the current iteration. For example, each time the system completes a decoding iteration, the system increases the iteration counter by one. Accordingly, the number of iterations performed so far and corresponding to the current iteration is determined from the current value of the iteration counter.

At operation 610B, the system determines whether the number of iterations corresponding to the current iteration is equal to or larger than an iteration number threshold and is smaller than the maximum number of iterations. For example, the system compares the current value of the iteration counter to the iteration number of threshold. If the current value is equal to or greater than the iteration number of threshold, the system determines that the number of iterations reached the iteration number threshold. In this case, operation 612B is performed after operation 610B, where the system further assesses if the iterative decoding should be terminated early. Otherwise, operation 614B is performed after operation 610B, where the system continues the iterative decoding.

At operation 612B, the system compares the syndrome at the current number of iterations to a checksum threshold. At this operation, the syndrome is non-zero. Generally, the comparing indicates whether the likelihood of correcting all the errors of the codeword is low even if the maximum number of iterations is performed. If so, the system can generate a decision for the early termination of the iterative decoding (as illustrated in connection with operation 618B).

Various types of the comparison are possible. The example flow 600B is illustrated in connection with comparing the weight of the syndrome (e.g., $\|s\|$) to the checksum threshold. Other types of the comparison are possible. Example flow 700B of FIG. 22 illustrates a comparison based on a change to the weight of the syndrome between iterations. As further described in connection with FIG. 22, the checksum threshold includes a rate change threshold for comparison with the change to the weight.

In the example flow 600B, the system compares the weight of the syndrome to the checksum threshold. If the weight is equal to or greater than the checksum threshold, the system generates a decision for the early termination of the iterative decoding. Accordingly, operation 618B is performed after operation 612B, where the system terminates the iterative decoding and outputs the decoded codeword. Otherwise, operation 614B is performed after operation 612B.

At operation 614B, the system continues the iterative decoding. For example, the system proceeds with decoding the LDPC codeword in the next decoding iteration and increments the iteration counter by one.

At operation 616B, the system compares the number of the iterations corresponding to the current iteration (e.g., the current value of the iteration counter) to the maximum number of iterations. If this number is equal to or greater than the maximum number of iterations, operation 618B is performed after operation 616B, where the system terminates the iterative decoding and outputs the decoded codeword. Otherwise, operation 604B is performed after operation 614B, where the system loops back and computes the syndrome.

As illustrated in the example flow 600B of FIG. 21, operation 612B (where the syndrome is compared to the checksum threshold, such as by comparing the syndrome's weight or the decoded codeword's checksum to the checksum threshold) only after operation 610B indicates that the current number of iterations reaches the iteration number threshold, but prior to the current number of iterations reaching the maximum number of iterations. In this way, the system ensures that at least a minimum number of decoding iterations has been performed to build confidence in the iterative decoding and avoids a premature termination.

FIG. 22 illustrates an example flow for using the syndrome at the current iteration to generate a decision for an early termination of an LDPC iterative decoding, in accordance with certain embodiments of the present disclosure. Some or all of the operations of example flow 700B may be implemented as sub-operations of operations 504B and 506B of the example flow 500B of FIG. 20. Relative to the example flow 600B of FIG. 21, the example flow 700B represents the use of the change to the weight of the system as a parameter for the early termination.

As illustrated, the example flow 700B starts at operation 702B, where the system initiates the iterative decoding. At operation 704B, the system determines the change to the weight of the syndrome at a current decoding iteration. For example, the system computes the syndrome and its weight at each decoding iteration and monitors the change to weight between the iterations.

At operation 706B, the system determines whether the change is acceptable. This determination is typically performed only after the current number of iterations reaches the iteration number threshold to avoid a premature early termination. Various types of determination are possible. In one example, the system uses a change rate threshold. In this example, the system computes a rate of the change to the weight of the syndrome from one or more previous iterations to the current iteration. The system compares the rate of change to the change rate threshold. If the rate of change is lower than the change rate threshold, the system generates a decision to terminate the iterative decoding because the rate of change is unacceptable. Otherwise, such a decision is not generated.

In another example, the system does not use a change rate threshold. Instead, the system computes the change to the weight of the syndrome from one or more previous iterations to the current iteration. The system then determines whether the rate of the change is constant, has not improved, has worsened, or is relatively stable from the one or more previous iterations. If so, the system generates the decision to terminate the iterative decoding because the rate of change is unacceptable. Otherwise, this decision is not generated.

At operation 708B, the system terminates the iterative decoding based on an early termination rule. In this example, the rule specifies that if the change to the weight of syndrome was found unacceptable at operation 706B (and, thus, a decision for the early termination was generated), the system should terminate the iterative decoding at the current iteration. Accordingly, the system exits the iterative decoding and outputs the decoded codeword.

As previously described, a combination of using the comparison of the weight of the syndrome to the checksum threshold, similarly to what is illustrated in the example flow 600B of FIG. 21, and monitoring the rate of change to the weight between decoding iterations, similarly to what is illustrated in the example flow 700B of FIG. 22, is possible. For example, and referring back to operation 612B of the example flow 600B, the system determines that the weight of the syndrome at the current iteration is equal to or greater than the checksum threshold. Rather than generating a decision to terminate the iterative decoding, the system further investigates whether the likelihood of correcting all the errors of the codeword is low even if the maximum number of iterations is performed. In this case, instead of performing operation 618B after the operation 612B, the system performs operations similar to operations 704B-708B of the example flow 700B. In one specific example, the system determines the rate of change to the weight from a number of previous iterations to the current iteration (e.g., from the last five iterations) to generate the decision for the early termination as applicable. In another specific example, the system starts monitoring the rate of change to the weight from the current iteration to a number of subsequent iterations but prior to the iteration counter reaching the maximum number of iterations (e.g., over the next five iterations) to generate the decision for the early termination as applicable.

Figure 23:
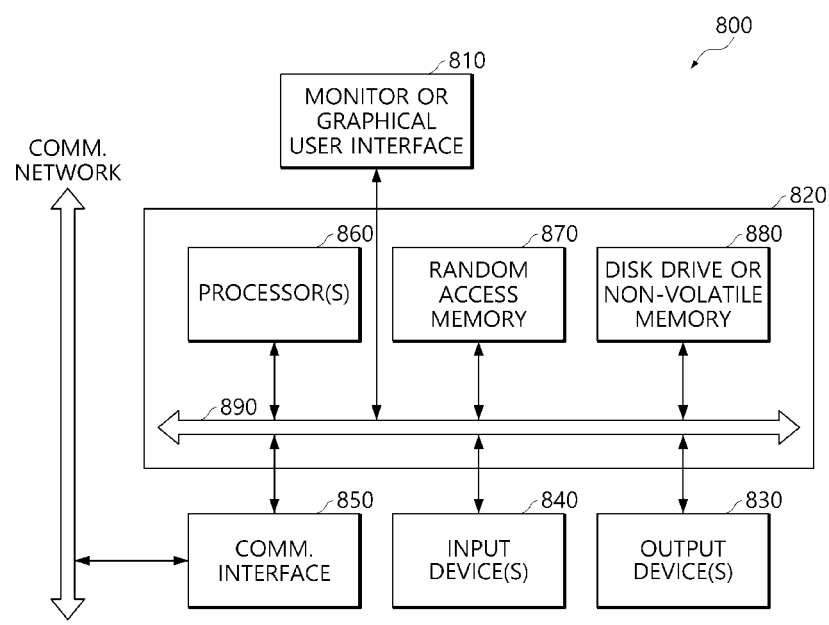
FIG. 23 is representative of a computer system capable of embodying the present disclosure.

FIG. 23 describes one potential implementation of a system, which may be used according to one embodiment, such as the error correction system 100B of FIG. 16. FIG. 23 is merely illustrative of an embodiment of the present disclosure and does not limit the scope of the disclosure as recited in the claims. In one embodiment, the system is a computer system 800 that typically includes a monitor 810, a computer 820, user output devices 830, user input devices 840, communications interface 850, and the like. The error correction system 100 of FIG. 16 implements some or all of the components of the computer system 800.

As shown in FIG. 23, the computer 820 may include a processor(s) 860 that communicates with a number of peripheral devices via a bus subsystem 890. These peripheral devices may include the user output devices 830, the user input devices 840, the communications interface 850, and a storage subsystem, such as random access memory (RAM) 870 and disk drive 880.

The user input devices 840 include all possible types of devices and mechanisms for inputting information to the computer system 820. These may include a keyboard, a keypad, a touch screen incorporated into the display, audio input devices such as voice recognition systems, microphones, and other types of input devices. In various embodiments, the user input devices 840 are typically embodied as a computer mouse, a trackball, a track pad, a joystick, a wireless remote, a drawing tablet, a voice command system, an eye tracking system, and the like. The user input devices 840 typically allow a user to select objects, icons, text and the like that appear on the monitor 810 via a command such as a click of a button or the like.

The user output devices 830 include all possible types of devices and mechanisms for outputting information from the computer 820. These may include a display (e.g., the monitor 810), non-visual displays such as audio output devices, etc.

The communications interface 850 provides an interface to other communication networks and devices. The communications interface 850 may serve as an interface for receiving data from and transmitting data to other systems. Embodiments of the communications interface 850 typically include an Ethernet card, a modem (telephone, satellite, cable, ISDN), (asynchronous) digital subscriber line (DSL) unit, FireWire interface, USB interface, and the like. For example, the communications interface 850 may be coupled to a computer network, to a FireWire bus, or the like. In other embodiments, the communications interfaces 850 may be physically integrated on the motherboard of the computer 820, and may be a software program, such as soft DSL, or the like.

In various embodiments, the computer system 800 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 820 includes one or more Xeon microprocessors from Intel as the processor(s) 860. Further, one embodiment, the computer 820 includes a UNIX-based operating system.

The RAM 870 and the disk drive 880 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 870 and the disk drive 880 may be configured to store the basic programming and data constructs that provide the functionality of the present disclosure.

Software code modules and instructions that provide the functionality of the present disclosure may be stored in the RAM 870 and the disk drive 880. These software modules may be executed by the processor(s) 860. The RAM 870 and the disk drive 880 may also provide a repository for storing data used in accordance with the present disclosure.

The RAM 870 and the disk drive 880 may include a number of memories including a main random access memory (RAM) for storage of instructions and data during program execution and a read-only memory (ROM) in which fixed non-transitory instructions are stored. The RAM 870 and the disk drive 880 may include a file storage subsystem providing persistent (non-volatile) storage for program and data files. The RAM 870 and the disk drive 880 may also include removable storage systems, such as removable flash memory.

The bus subsystem 890 provides a mechanism for letting the various components and subsystems of the computer 820 communicate with each other as intended. Although the bus subsystem 890 is shown schematically as a single bus, alternative embodiments of the bus subsystem may utilize multiple busses.

FIG. 23 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Figure 24:
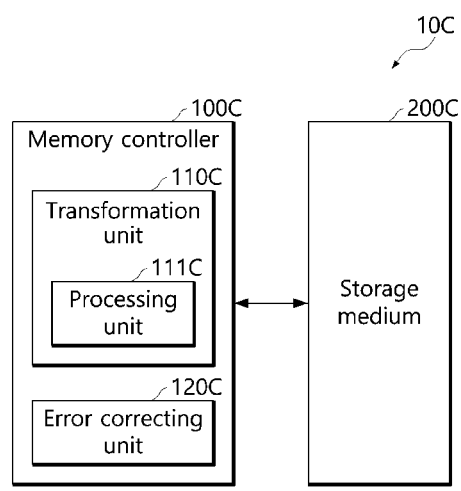
FIG. 24 is a block diagram illustrating a memory system, according to an embodiment of the present disclosure.

FIG. 24 is a block diagram illustrating a memory system 10C according to an embodiment of the present disclosure.

Referring to FIG. 24, the memory system 10C may include a memory controller 100C and a storage medium 200C.

The memory controller 100C may control the storage medium 200C to write data in the storage medium 200C and to read data from the storage medium 200C. The memory controller 100C may transform data using the transformation unit 110C before writing the data to the storage medium 200C, and write the data, outputted from the transformation unit 110C, to the storage medium 200C.

The memory controller 100C may include the transformation unit 110C and an error correcting unit 120C. Although not illustrated, the memory controller 100C may further include a data processing circuit which may be the same as the data processing circuit 100E described with reference to FIGS. 42 to 44.

The transformation unit 110C may include a processing unit 111C.

The processing unit 111C may perform a parallel operation of generating second bit values in parallel, based on first bit values inputted in parallel. The processing unit 111C may further include a data processing circuit (not shown) which may be the same as the data processing circuit 100E described with reference to FIGS. 42 to 44.

According to an embodiment, the processing unit 111C may consist of a plurality of XOR operation units.

According to an embodiment, the processing unit 111C may perform a parallel operation during one clock cycle.

The transformation unit 110C may receive an input bit group, and generate an output bit group based on the input bit group and the second bit values generated by the processing unit 111C. The input bit group may be data transmitted from an external host device (not illustrated). Alternatively, the input bit group may be data generated in the memory system 10C.

According to an embodiment, the transformation unit 110C may generate the output bit group by performing a randomizing operation on the input bit group. Specifically, the first bit values may constitute a seed, and the second bit values may constitute a random pattern which is generated based on the seed. In this case, the transformation unit 110C may generate the output bit group by randomizing the input bit group based on the second bit values, i.e. the random pattern. The controller 100C may write the output bit group, outputted from the transformation unit 110C, to the storage medium 200C.

According to an embodiment, the transformation unit 110C may generate the output bit group by performing a derandomizing operation on the input bit group. Specifically, the first bit values may constitute a seed, and the second bit values may constitute a random pattern which is generated based on the seed. In this case, the transformation unit 110C may generate the output bit group by derandomizing the input bit group based on the second bit values, i.e. the random pattern. The controller 100C may input data, read from the storage medium 200C, as the input bit group to the transformation unit 110C.

According to an embodiment, the memory controller 100C may include a plurality of transformation units. The plurality of transformation units may operate in a similar manner to the transformation unit 110C, and transform a plurality of input bit groups into a plurality of output bit groups, respectively, in parallel. That is, each of the transformation units may generate the corresponding output bit group by randomizing the corresponding input bit group, based on a random pattern generated by the processing unit thereof.

According to an embodiment, the transformation unit 110C may generate the output bit group by performing an ECC encoding operation on the input bit group. Specifically, the first bit values may constitute the input bit group, and the second bit values may constitute parity data of the input bit group. In this case, the transformation unit 110C may generate the output bit group by adding the second bit values, i.e. the parity data to the input bit group.

The error correcting unit 120C may perform an error correcting operation on data read from the storage medium 200C. According to an embodiment, the error correcting unit 120C may include the data processing unit 120 of FIG. 1B, the data processing circuit 320 of FIG. 6, the ECC unit 130A of FIG. 10, the ECC 406A of FIG. 12, the hard/soft decoder 502A and the BER predictor 504A of FIG. 13, or the detector 130B and the LDPC decoder 140B of FIG. 16.

The storage medium 200C may perform a write operation and a read operation under control of the memory controller 100C. The storage medium 200C may include one or more memory devices.

Figure 25:
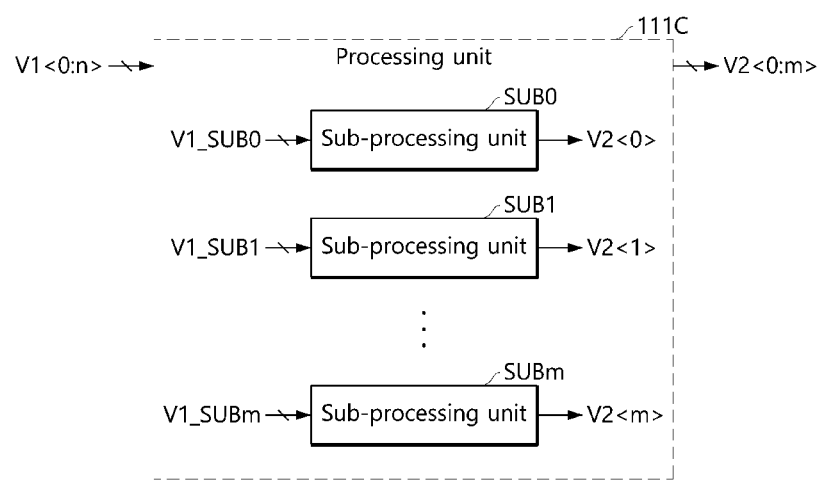
FIG. 25 is a block diagram illustrating a transformation unit of FIG. 24, according to an embodiment of the present disclosure.

FIG. 25 is a block diagram illustrating the processing unit 111C of FIG. 24 according to the embodiment of the present disclosure.

Referring to FIG. 25, the processing unit 111C may receive first bit values V1<0:n> in parallel, generate second bit values V2<0: m> based on the first bit values V1<0:n>, and output the second bit values V2<0: m> in parallel.

The processing unit 111C may include sub processing units SUB0 to SUBm to generate the second bit values V2<0: m>, respectively, in parallel. As illustrated in FIG. 25, the number of the second bit values V2<0:m> may be equal to the number of the sub processing units SUB0 to SUBm.

Each of the sub processing units SUB0 to SUBm may receive the corresponding first bit values of the first bit values V1<0:n> in parallel, and generate the corresponding second bit value based on the corresponding first bit values. For example, the first sub processing unit SUB0 may receive the corresponding first bit values V1_SUB0 of the first bit values V1<0:n> in parallel. The corresponding first bit values V1_SUB0 may be all or some of the first bit values V1<0:n>. The first sub processing unit SUB0 may generate the corresponding second bit value V2<0> based on the corresponding first bit values V1_SUB0.

According to an embodiment, each of the sub processing units SUB0 to SUBm may consist of one or more XOR operation units.

According to an embodiment, the entire operations of the sub processing units SUB0 to SUBm may be performed during one clock cycle.

According to an embodiment, the sub processing units SUB0 to SUBm may correspond to XOR operation expressions, respectively, which are expressed as random variables. The XOR operation expressions may be operation expressions which output the second bit values V2<0: m> when the first bit values V1<0:n> are inputted as random variables, respectively. The XOR operation expressions may output the second bit values, as random variables are inputted to a circuit including an LFSR and XOR operation units.

According to an embodiment, the LFSR used to derive the XOR operation expressions may consist of N registers coupled in series, and output a sequence with a period of 2^N−1. That is, the LFSR may output an M-sequence.

Figure 26:
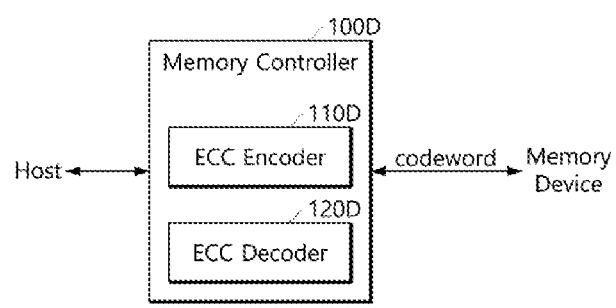
FIG. 26 is a block diagram illustrating a memory controller, according to an embodiment of the present disclosure.

FIG. 26 is a block diagram illustrating a memory controller 100D according to an embodiment of the present disclosure.

Referring to FIG. 26, the memory controller 100D may act as an interface between a host and a memory device and may access to the memory device to control operations of the memory device in response to a request provided from the host. In general, the host may correspond to an upstream part of a system that transmits data to the memory controller 100D and/or receives data from the memory controller 100D. The memory controller 100D may be an embodiment of the memory controller 100C shown in FIG. 24. The memory device may be a general memory device such as a NAND-type flash memory device or a new memory device such as a PCRAM device, a MRAM device, an NFGM device, an RRAM device or a polymer RAM device. The memory controller 100D may include an ECC encoder 110D and an ECC decoder 120D. Although not illustrated, the memory controller 100D may further include a data processing circuit which may be the same as the data processing circuit 100E described with reference to FIGS. 42 to 44. The ECC encoder 110D may perform an ECC encoding operation to original data, which are to be written into the memory device, to generate a codeword including the original data and parity bits. The ECC encoder 110D may be an embodiment of the transformation unit 110C shown in FIG. 24. The ECC decoder 120D may perform an ECC decoding operation to the codeword read from the memory device to restore the original data. The ECC decoder 120D may be an embodiment of the error correcting unit 120C shown in FIG. 24. The memory controller 100D may transmit the restored or error-corrected original data original data to the host.

Figure 27:
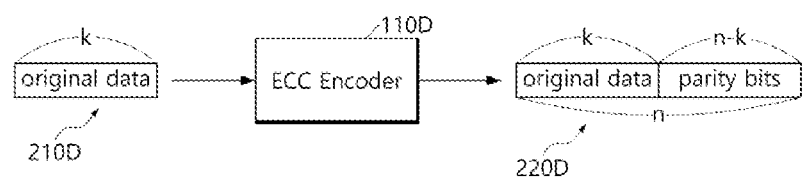
FIG. 27 illustrates an ECC encoder of the memory controller of FIG. 26, together with input and output data of the ECC decoder, according to an embodiment of the present disclosure.

FIG. 27 is a schematic view illustrating the ECC encoder 110D of FIG. 26 together with input data and output data of the ECC encoder 110D. Referring to FIG. 27, the ECC encoder 110D may receive "k"-bit original data 210D from the host (where, "k" denotes a natural number). The ECC encoder 110D may receive all of the bit values of the original data 210D in parallel. Although not shown in FIG. 26 or 27, the memory controller 100D may be configured to include a host interface which is realized using a logic circuit appropriate for parallel data transmission so that the ECC encoder 110D receives all of bit values of the original data 210D in parallel. The ECC encoder 110D may perform an ECC encoding operation to the "k"-bit original data 210D to generate and output an "n"-bit codeword 220D (where, "n" denotes a natural number greater than "k"). The ECC encoding operation may be performed using a BCH code.

The "n"-bit codeword 220D outputted from the ECC encoder 110D may include the "k"-bit original data 210D and a "(n−k)" parity bits. The "n"-bit codeword 220D may also be outputted in parallel from the ECC encoder 110D. Although not shown in FIG. 26 or 27, the memory controller 100D may be configured to include a memory interface which is realized using a logic circuit appropriate for parallel data transmission so that the ECC encoder 110D outputs all of bit values of the "n"-bit codeword 220D in parallel.

The ECC encoder 110D may be realized using a logic circuit including exclusive OR (XOR) arithmetic elements (e.g., XOR gates). According to an embodiment of the present disclosure, the ECC encoding operation may be performed by XOR operations using linear feedback shift registers (LFSRs).

Figure 28:
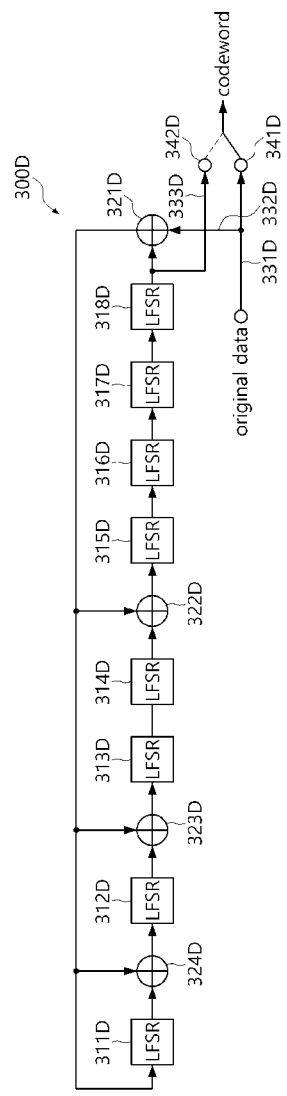
FIG. 28 is an operation logic circuit diagram illustrating an iterative operation logic for an ECC encoding operation according to an embodiment of the present disclosure.

FIG. 28 is a logic diagram illustrating an iterative operation logic for the ECC encoding operation of the ECC encoder 110D according to an embodiment of the present disclosure, and shows the iterative operation logic as an iterative operation logic circuit 300D.

Referring to FIG. 28, the iterative operation logic circuit 300D may perform an iterative XOR operation with a plurality of LFSRs and a plurality of XOR arithmetic elements to ECC-encode the original data. The iterative operation logic circuit 300D may receive the "k"-bit original data and may generate and output the "n"-bit codeword as a result of the ECC encoding operation. Hereinafter, it is assumed as an example that the number "k" of bits included in the original data is seven. However, the iterative operation logic circuit 300D of FIG. 28 is merely an example of suitable iterative operation logic circuits. That is, the number "k" of bits included in the original data may be less than or greater than seven according to various embodiments. The number "n" of bits included in the codeword may be equal to "2m−1" (i.e., n=2m−1) where, 'm' is a positive integer which is equal to or greater than three and the number "(n−k)" of bits included in the parity necessary for error correction may be equal to or less than "m×t" (i.e., (n−k) ≤m×t)), where, 't' is error correction capability)". The number of the LFSRs may be "(n−k)" in the iterative operation logic circuit 300D.

Since the number "k" of bits included in the original data is seven as an example, the minimum value of the number "m" may be four because the number "n" of bits include in the codeword should be greater than seven (refer to the equation "n=2m−1"). In such a case, the number "n" of bits include in the codeword may be fifteen. In addition, if the error correction capability "t" is two, the maximum number "(n−k)" of bits included in the parity necessary for error correction should be eight (refer to the equation "(n−k)≤m× t"). If the number "k" of bits included in the original data is seven and the number "n" of bits include in the codeword including the parity bits (i.e., 8 bits) is fifteen, the iterative operation logic circuit 300D may include eight linear feedback shift registers (LFSRs) (i.e., first to eighth LFSRs 311D to 318D) and four XOR arithmetic elements (i.e., first to fourth XOR arithmetic elements 321D to 324D).

Specifically, the first LFSR 311D may receive feedback data outputted from the first XOR arithmetic element 321D and may transmit data stored therein to the fourth XOR arithmetic element 324D in a subsequent step. The fourth XOR arithmetic element 324D may perform an XOR operation to the feedback data outputted from the first XOR arithmetic element 321D and the data outputted from the first LFSR 311D and may output the result of the XOR operation to the second LFSR 312D.

The second LFSR 312D may transmit data stored therein to the third XOR arithmetic element 323D in a subsequent step. The third XOR arithmetic element 323D may perform an XOR operation to the feedback data outputted from the first XOR arithmetic element 321D and the data outputted from the second LFSR 312D and may output the result of the XOR operation to the third LFSR 313D.

The third LFSR 313D may transmit data stored therein to the fourth LFSR 314D in a subsequent step.

The fourth LFSR 314D may transmit data stored therein to the second XOR arithmetic element 322D in a subsequent step. The second XOR arithmetic element 322D may perform an XOR operation to the feedback data outputted from the first XOR arithmetic element 321D and the data outputted from the fourth LFSR 314D and may output the result of the XOR operation to the fifth LFSR 315D.

The fifth LFSR 315D may transmit data stored therein to the sixth LFSR 316D in a subsequent step. The sixth LFSR 316D may transmit data stored therein to the seventh LFSR 317D in a subsequent step. The seventh LFSR 317D may transmit data stored therein to the eighth LFSR 318D in a subsequent step. The eighth LFSR 318D may transmit data stored therein to the first XOR arithmetic element 321D in a subsequent step. The data output from the eighth LFSR 318D may also constitute the parity bits of the codeword.

The data shifting operation of each of the first to eighth LFSRs 311D to 318D may be performed in synchronization with a clock signal, and an XOR operation of each of the first to fourth XOR arithmetic elements 321D to 324D may also be performed in synchronization with the clock signal. The original data inputted to the iterative operation logic circuit 300D may be outputted through a first output terminal 341D of an input/output (I/O) line 331D to constitute a portion of the codeword and may be transmitted to the first test XOR arithmetic element 321D through an input line 332D. In some embodiments, the original data from a least significant bit LSB to a most significant bit MSB may be sequentially inputted bit by bit to the iterative operation logic circuit 300D. The original data may also be inputted to the iterative operation logic circuit 300D in synchronization with the clock signal.

An output line 333D of the eighth LFSR 318D may be coupled to a second output terminal 342D. Output data of the eighth LFSR 318D may be inputted to the first XOR arithmetic element 321D while the iteration operation of the iterative operation logic circuit 300D is performed and may be outputted through the second output terminal 342D after each iteration operation of the iterative operation logic circuit 300D. In such a case, the data stored in the first to eighth LFSRs 311D to 318D may be sequentially outputted through the second output terminal 342D to constitute the parity bits of the codeword.

FIG. 29 is a table illustrating the ECC encoding operation through the iterative operation logic represented by the iterative operation logic circuit 300D. Hereinafter, it is assumed as an example that the original data has a binary value of '1010110'.

Referring to FIGS. 28 and 29, in an initial step, all of the first to eighth LFSRs 311D to 318D may be set to have values of "0 (zero)" and the feedback datum outputted from the first XOR arithmetic element 321D may also be set to have a value of "0 (zero)".

In a first step executed during a first clock cycle, a datum "0" of the seventh bit (i.e., the LSB) of the original data may be inputted to the iterative operation logic circuit 300D, and the input datum "0" may be outputted through the first output terminal 341D of the I/O line 331D and may also be inputted to the first XOR arithmetic element 321D through the input line 332D. The first XOR arithmetic element 321D may perform an XOR operation to the datum "0" or the seventh bit value of the original data through the input line 332D and the datum "0" outputted from the eighth LFSR 318D to output a datum "0" as the feedback datum. The feedback datum "0" may then be inputted to all of the second to fourth XOR arithmetic elements 322D, 323D and 324D and may also be stored into the first LFSR 311D.

In a second step executed during a second clock cycle, a datum "1" of the sixth bit of the original data may be inputted to the iterative operation logic circuit 300D, and the input datum "1" may be outputted through the first output terminal 341D of the I/O line 331D and may also be inputted to the first XOR arithmetic element 321D through the input line 332D. The first XOR arithmetic element 321D may then perform an XOR operation to the datum "1" (i.e., the sixth bit value of the original data) inputted through the input line 332D and the datum "0" outputted from the eighth LFSR 318D to output a datum "1" as the feedback datum. The feedback datum "1" may then be inputted to all of the second to fourth XOR arithmetic elements 322D, 323D and 324D and may also be stored into the first LFSR 311D. The fourth XOR arithmetic element 324D may perform an XOR operation to the previous datum "0" stored in the first LFSR 311D and the feedback datum "1" outputted from the first XOR arithmetic element 321D to output a datum "1", and the output datum "1" of the fourth XOR arithmetic element 324D may be stored into the second LFSR 312D. The third XOR arithmetic element 323D may then perform an XOR operation to the previous datum "0" stored in the second LFSR 312D and the feedback datum "1" outputted from the first XOR arithmetic element 321D to output a datum "1", and the output datum "1" of the third XOR arithmetic element 323D may be stored into the third LFSR 313D. The previous datum "0" stored in the third LFSR 313D may be transmitted to the fourth LFSR 314D. The second XOR arithmetic element 322D may perform an XOR operation to the previous datum "0" stored in the fourth LFSR 314D and the feedback datum "1" outputted from the first XOR arithmetic element 321D to output a datum "1", and the output datum "1" of the second XOR arithmetic element 322D may be stored into the fifth LFSR 315D.

In a third step executed during a third clock cycle, a datum "1" of the fifth bit of the original data may be inputted to the iterative operation logic circuit 300D, and the input datum "1" may be outputted through the first output terminal 341D of the I/O line 331D as a portion of the codeword and may also be inputted to the first XOR arithmetic element 321D through the input line 332D. The first XOR arithmetic element 321D may perform an XOR operation to the datum "1" (i.e., the fifth bit value of the original data) inputted through the input line 332D and the datum "0" outputted from the eighth LFSR 318D to output a datum "1" as the feedback datum. The feedback datum "1" may be inputted to all of the second to fourth XOR arithmetic elements 322D, 323D, and 324D and may be stored into the first LFSR 311D. The fourth XOR arithmetic element 324D may perform an XOR operation to the previous datum "1" stored in the first LFSR 311D and the feedback datum "1" outputted from the first XOR arithmetic element 321D to output a datum "0", and the output datum "1" of the fourth XOR arithmetic element 324D may be stored into the second LFSR 312D. The third XOR arithmetic element 323D may perform an XOR operation to the previous datum "1" stored in the second LFSR 312D and the feedback datum "1" outputted from the first XOR arithmetic element 321D to output a datum "0", and the output datum "0" of the third XOR arithmetic element 323D may be stored into the third LFSR 313D. The previous datum "1" stored in the third LFSR 313D may be transmitted to the fourth LFSR 314D. The second XOR arithmetic element 322D may perform an XOR operation to the previous datum "0" stored in the fourth LFSR 314D and the feedback datum "1" outputted from the first XOR arithmetic element 321D to output a datum "1", and the output datum "1" of the second XOR arithmetic element 322D may be stored into the fifth LFSR 315D. The previous datum "1" stored in the fifth LFSR 315D may be transmitted to the sixth LFSR 316D.

In a fourth step executed during a fourth clock cycle, a datum "0" of the fourth bit of the original data may be inputted to the iterative operation logic circuit 300D, and the input datum "0" may be outputted through the first output terminal 341D of the I/O line 331D as a portion of the codeword and may also be inputted to the first test XOR arithmetic element 321D through the input line 332D. The first XOR arithmetic element 321D may perform an XOR operation to the datum "0" (i.e., the fourth bit value of the original data) inputted through the input line 332D and the datum "0" outputted from the eighth LFSR 318D to output a datum "0" as the feedback datum. The feedback datum "0" may be inputted to all of the second to fourth XOR arithmetic elements 322D-324D and may be stored into the first LFSR 311D. The fourth XOR arithmetic element 324D may perform an XOR operation to the previous datum "1" stored in the first LFSR 311D and the feedback datum "0" outputted from the first XOR arithmetic element 321D to output a datum "1", and the output datum "1" of the fourth XOR arithmetic element 324D may be stored into the second LFSR 312D. The third XOR arithmetic element 323D may perform an XOR operation to the previous datum "0" stored in the second LFSR 312D and the feedback datum "0" outputted from the first XOR arithmetic element 321D to output a datum "0", and the output datum "0" of the third XOR arithmetic element 323D may be stored into the third LFSR 313D. The previous datum "0" stored in the third LFSR 313D may be transmitted to the fourth LFSR 314D. The second XOR arithmetic element 322D may perform an XOR operation to the previous datum "1" stored in the fourth LFSR 314D and the feedback datum "0" outputted from the first XOR arithmetic element 321D to output a datum "1", and the output datum "1" of the second XOR arithmetic element 322D may be stored into the fifth LFSR 315D. The previous datum "1" stored in the fifth LFSR 315D may be transmitted to the sixth LFSR 316D. The previous datum "1" stored in the sixth LFSR 316D may be transmitted to the seventh LFSR 317D.

In a fifth step executed during a fifth clock cycle, a datum "1" of the third bit of the original data may be inputted to the iterative operation logic circuit 300D, and the input datum "1" may be outputted through the first output terminal 341D of the I/O line 331D as a portion of the codeword and may also be inputted to the first XOR arithmetic element 321D through the input line 332D. The first XOR arithmetic element 321D may perform an XOR operation to the datum "1" (or the third bit value of the original data) inputted through the input line 332D and the datum "0" outputted from the eighth LFSR 318D to output a datum "1" as the feedback datum. The feedback datum "1" may be inputted to all of the second to fourth XOR arithmetic elements 322D-324D and may be stored into the first LFSR 311D. The fourth XOR arithmetic element 324D may perform an XOR operation to the previous datum "0" stored in the first LFSR 311D and the feedback datum "1" outputted from the first XOR arithmetic element 321D to output a datum "1", and the output datum "1" of the fourth XOR arithmetic element 324D may be stored into the second LFSR 312D. The third XOR arithmetic element 323D may perform an XOR operation to the previous datum "1" stored in the second LFSR 312D and the feedback datum "1" outputted from the first XOR arithmetic element 321D to output a datum "0", and the output datum "0" of the third XOR arithmetic element 323D may be stored into the third LFSR 313D. The previous datum "0" stored in the third LFSR 313D may be transmitted to the fourth LFSR 314D. The second XOR arithmetic element 322D may perform an XOR operation to the previous datum "0" stored in the fourth LFSR 314D and the feedback datum "1" outputted from the first XOR arithmetic element 321D to output a datum "1", and the output datum "1" of the second XOR arithmetic element 322D may be stored into the fifth LFSR 315D. The previous datum "1" stored in the fifth LFSR 315D may be transmitted to the sixth LFSR 316D. The previous datum "1" stored in the sixth LFSR 316D may be transmitted to the seventh LFSR 317D. The previous datum "1" stored in the seventh LFSR 317D may be transmitted to the eighth LFSR 318D.

In a sixth step executed during a sixth clock cycle, a datum "0" of the second bit of the original data may be inputted to the iterative operation logic circuit 300D, and the input datum "0" may be outputted through the first output terminal 341D of the I/O line 331D as a portion of the codeword and may also be inputted to the first XOR arithmetic element 321D through the input line 332D. The first XOR arithmetic element 321D may perform an XOR operation to the datum "0" (or the second bit value of the original data) inputted through the input line 332D and the datum "1" outputted from the eighth LFSR 318D to output a datum "1" as the feedback datum. The feedback datum "1" may be inputted to all of the second to fourth XOR arithmetic elements 322D-324D and may be stored into the first LFSR 311D. The fourth XOR arithmetic element 324D may perform an XOR operation to the previous datum "1" stored in the first LFSR 311D and the feedback datum "1" outputted from the first XOR arithmetic element 321D to output a datum "0", and the output datum "0" of the fourth XOR arithmetic element 324D may be stored into the second LFSR 312D. The third XOR arithmetic element 323D may perform an XOR operation to the previous datum "1" stored in the second LFSR 312D and the feedback datum "1" outputted from the first XOR arithmetic element 321D to output a datum "0", and the output datum "0" of the third XOR arithmetic element 323D may be stored into the third LFSR 313D. The previous datum "0" stored in the third LFSR 313D may be transmitted to the fourth LFSR 314D. The second XOR arithmetic element 322D may perform an XOR operation to the previous datum "0" stored in the fourth LFSR 314D and the feedback datum "1" outputted from the first XOR arithmetic element 321D to output a datum "1", and the output datum "1" of the second XOR arithmetic element 322D may be stored into the fifth LFSR 315D. The previous datum "1" stored in the fifth LFSR 315D may be transmitted to the sixth LFSR 316D. The previous datum "1" stored in the sixth LFSR 316D may be transmitted to the seventh LFSR 317D. The previous datum "1" stored in the seventh LFSR 317D may be transmitted to the eighth LFSR 318D.

In a seventh step executed during a seventh clock cycle, a datum "1" of the first bit (i.e., the MSB) of the original data may be inputted to the iterative operation logic circuit 300D, and the input datum "1" may be outputted through the first output terminal 341D of the I/O line 331D as a portion of the codeword and may also be inputted to the first test XOR arithmetic element 321D through the input line 332D. The first XOR arithmetic element 321D may perform an XOR operation to the datum "1" (or the first bit value of the original data) inputted through the input line 332D and the datum "1" outputted from the eighth LFSR 318D to output a datum "0" as the feedback datum. The feedback datum "0" may be inputted to all of the second to fourth XOR arithmetic elements 322D-324D and may be stored into the first LFSR 311D. The fourth XOR arithmetic element 324D may perform an XOR operation to the previous datum "1" stored in the first LFSR 311D and the feedback datum "0" outputted from the first XOR arithmetic element 321D to output a datum "1", and the output datum "1" of the fourth XOR arithmetic element 324D may be stored into the second LFSR 312D. The third XOR arithmetic element 323D may perform an XOR operation to the previous datum "0" stored in the second LFSR 312D and the feedback datum "0" outputted from the first XOR arithmetic element 321D to output a datum "0", and the output datum "0" of the third XOR arithmetic element 323D may be stored into the third LFSR 313D. The previous datum "0" stored in the third LFSR 313D may be transmitted to the fourth LFSR 314D. The second XOR arithmetic element 322D may perform an XOR operation to the previous datum "0" stored in the fourth LFSR 314D and the feedback datum "0" outputted from the first XOR arithmetic element 321D to output a datum "0", and the output datum "0" of the second XOR arithmetic element 322D may be stored into the fifth LFSR 315D. The previous datum "1" stored in the fifth LFSR 315D may be transmitted to the sixth LFSR 316D. The previous datum "1" stored in the sixth LFSR 316D may be transmitted to the seventh LFSR 317D. The previous datum "1" stored in the seventh LFSR 317D may be transmitted to the eighth LFSR 318D.

As described above, as a result of the iterative operation performed for seven clock cycles to ECC-encode the original data of '1010110', data of '01000111' may be stored into the first to eighth LFSRs 311D to 318D. The data '01000111' may be sequentially outputted from the iterative operation logic circuit 300D through the output line 333D and the second output terminal 342D to constitute the parity bits of the codeword. Thus, the iterative operation logic circuit 300D may receive the 7-bit original data of '1010110' and may output the 15-bit codeword of '101011001000111' including the 7-bit original data (i.e., '1010110') and the 8-bit parity (i.e., '01000111'). The iterative operation for the ECC encoding may be performed for seven clock cycles if the number of bits included in the original data is seven. That is, if the number of bits included in the original data is "k", "k"-number of clock cycles may be required for the ECC encoding of the "k"-bit original data.

FIG. 30 shows an example of the original data to which arbitrary variables are allocated.

Referring to FIG. 30, the arbitrary variables may be allocated to the bits included in the 7-bit original data, respectively. For example, an arbitrary variable "A00" may be allocated to the seventh bit (i.e., the LSB) of the 7-bit original data. An arbitrary variable "B00" may be allocated to the sixth bit of the 7-bit original data. An arbitrary variable "C00" may be allocated to the fifth bit of the 7-bit original data. An arbitrary variable "D00" may be allocated to the fourth bit of the 7-bit original data. An arbitrary variable "E00" may be allocated to the third bit of the 7-bit original data. An arbitrary variable "F00" may be allocated to the second bit of the 7-bit original data. An arbitrary variable "G00" may be allocated to the first bit (i.e., the MSB) of the 7-bit original data. Each of the arbitrary variables "A00, B00, C00, D00, E00, F00 and G00" allocated to the bits of the 7-bit original data may represent a datum "0" or a datum "1". If the 7-bit original data have a combination of '1010110', the arbitrary variables "A00, B00, C00, D00, E00, F00 and G00" may respectively have a datum "0", a datum "1", a datum "1", a datum "0", a datum "1", a datum "0" and a datum "1".

FIGS. 31 to 38 are tables illustrating the ECC encoding operation to the original data with the arbitrary variables through the iterative operation logic of FIG. 28.

The iterative operation of the iterative operation logic circuit 300D may perform the ECC encoding operation to the original data with the arbitrary variables "A00, B00, C00, D00, E00, F00 and G00".

First, as illustrated in FIG. 31, the first to eighth LFSRs 311D to 318D of the iterative operation logic circuit 300D for the ECC encoding may be initialized to have data "0". In such a case, the feedback datum outputted from the first XOR arithmetic element 321D may also be set to have a logic "0".

Next, as illustrated in FIG. 32, the first step may be executed during the first clock cycle. Specifically, the arbitrary variable "A00" allocated to the seventh bit (i.e., the LSB) of the original data may be inputted to the iterative operation logic circuit 300D, and the input datum "A00" may be outputted as a portion of the codeword and may also be inputted to the first XOR arithmetic element 321D. The first XOR arithmetic element 321D may perform an XOR operation to the datum "A00" or the seventh bit value of the original data and the datum "0" outputted from the eighth LFSR 318D to output the datum "A00" as the feedback datum. The feedback datum "A00" may be inputted to all of the second to fourth XOR arithmetic elements 322D-324D and may be stored into the first LFSR 311D. The fourth XOR arithmetic element 324D may perform an XOR operation to the previous datum "0" stored in the first LFSR 311D and the feedback datum "A00" outputted from the first XOR arithmetic element 321D to output the datum "A00", and the output datum "A00" of the fourth XOR arithmetic element 324D may be stored into the second LFSR 312D. The third XOR arithmetic element 323D may perform an XOR operation to the previous datum "0" stored in the second LFSR 312D and the feedback datum "A00" outputted from the first XOR arithmetic element 321D to output the datum "A00", and the output datum "A00" of the third XOR arithmetic element 323D may be stored into the third LFSR 313D. The previous datum "0" stored in the third LFSR 313D may be transmitted to the fourth LFSR 314D. The second XOR arithmetic element 322D may perform an XOR operation to the previous datum "0" stored in the fourth LFSR 314D and the feedback datum "A00" outputted from the first XOR arithmetic element 321D to output a datum "A00", and the output datum "A00" of the second XOR arithmetic element 322D may be stored into the fifth LFSR 315D. As a result, the data "A00", "A00", "A00", "0", "A00", "0", "0" and "0" may be respectively stored into the first to eighth LFSRs 311D to 318D during the first clock cycle.

Next, as illustrated in FIG. 33, in the second step executed during the second clock cycle, the arbitrary variable "B00" allocated to the sixth bit of the original data may be inputted to the iterative operation logic circuit 300D, and the input datum "B00" may be outputted as a portion of the codeword and may also be inputted to the first XOR arithmetic element 321D. The first XOR arithmetic element 321D may perform an XOR operation to the datum "B00" or the sixth bit value of the original data and the datum "0" outputted from the eighth LFSR 318D to output the datum "B00" as the feedback datum. The feedback datum "B00" may be inputted to all of the second to fourth XOR arithmetic elements 322D-324D and may be stored into the first LFSR 311D. The fourth XOR arithmetic element 324D may perform an XOR operation to the previous datum "A00" stored in the first LFSR 311D and the feedback datum "B00" outputted from the first XOR arithmetic element 321D to output a datum "A00⊕B00", and the output datum "A00⊕B00" of the fourth XOR arithmetic element 324D may be stored into the second LFSR 312D. The third XOR arithmetic element 323D may perform an XOR operation to the previous datum "A00" stored in the second LFSR 312D and the feedback datum "B00" outputted from the first XOR arithmetic element 321D to output a datum "A00⊕B00", and the output datum "A00⊕B00" of the third XOR arithmetic element 323D may be stored into the third LFSR 313D. The previous datum "A00" stored in the third LFSR 313D may be transmitted to the fourth LFSR 314D. The second XOR arithmetic element 322D may perform an XOR operation to the previous datum "0" stored in the fourth LFSR 314D and the feedback datum "B00" outputted from the first XOR arithmetic element 321D to output a datum "B00", and the output datum "B00" of the second XOR arithmetic element 322D may be stored into the fifth LFSR 315D. The previous datum "A00" stored in the fifth LFSR 315D may be transmitted to the sixth LFSR 316D. As a result, the data "B00", "A00⊕B00", "A00⊕B00", "A00", "B00", "A00", "0" and "0" may be respectively stored into the first to eighth LFSRs 311D to 318D during the second clock cycle.

Next, as illustrated in FIG. 34, in the third step executed during the third clock cycle, the arbitrary variable "C00" allocated to the fifth bit of the original data may be inputted to the iterative operation logic circuit 300D, and the input datum "C00" may be outputted as a portion of the codeword and may also be inputted to the first XOR arithmetic element 321D. The first XOR arithmetic element 321D may perform an XOR operation to the datum "C00" or the fifth bit value of the original data and the datum "0" outputted from the eighth LFSR 318D to output the datum "C00" as the feedback datum. The feedback datum "C00" may be inputted to all of the second to fourth XOR arithmetic elements 322D-324D and may be stored into the first LFSR 311D. The fourth XOR arithmetic element 324D may perform an XOR operation to the previous datum "B00" stored in the first LFSR 311D and the feedback datum "C00" outputted from the first XOR arithmetic element 321D to output a datum "B00⊕C00", and the output datum "B00⊕C00" of the fourth XOR arithmetic element 324D may be stored into the second LFSR 312D. The third XOR arithmetic element 323D may perform an XOR operation to the previous datum "A00⊕B00" stored in the second LFSR 312D and the feedback datum "C00" outputted from the first XOR arithmetic element 321D to output a datum "A00⊕B00⊕C00", and the output datum "A00⊕B00⊕C00" of the third XOR arithmetic element 323D may be stored into the third LFSR 313D. The previous datum "A00⊕B00" stored in the third LFSR 313D may be transmitted to the fourth LFSR 314D. The second XOR arithmetic element 322D may perform an XOR operation to the previous datum "A00" stored in the fourth LFSR 314D and the feedback datum "C00" outputted from the first XOR arithmetic element 321D to output a datum "A00⊕C00", and the output datum "A00⊕C00" of the second XOR arithmetic element 322D may be stored into the fifth LFSR 315D. The previous datum "B00" stored in the fifth LFSR 315D may be transmitted to the sixth LFSR 316D. The previous datum "A00" stored in the sixth LFSR 316D may be transmitted to the seventh LFSR 317D. As a result, the data "C00", "B00⊕C00", "A00⊕B00⊕C00", "A00⊕B00", "A00⊕C00", "B00", "A00" and "0" may be respectively stored into the first to eighth LFSRs 311D to 318D during the third clock cycle.

Next, as illustrated in FIG. 35, in the fourth step executed during the fourth clock cycle, the arbitrary variable "D00" allocated to the fourth bit of the original data may be inputted to the iterative operation logic circuit 300D, and the input datum "D00" may be outputted as a portion of the codeword and may also be inputted to the first XOR arithmetic element 321D. The first XOR arithmetic element 321D may perform an XOR operation to the datum "D00" or the fourth bit value of the original data and the datum "0" outputted from the eighth LFSR 318D to output the datum "D00" as the feedback datum. The feedback datum "D00" may be inputted to all of the second to fourth XOR arithmetic elements 322D-324D and may be stored into the first LFSR 311D. The fourth XOR arithmetic element 324D may perform an XOR operation to the previous datum "C00" stored in the first LFSR 311D and the feedback datum "D00" outputted from the first XOR arithmetic element 321D to output a datum "C00⊕D00", and the output datum "C00⊕D00" of the fourth XOR arithmetic element 324D may be stored into the second LFSR 312D. The third XOR arithmetic element 323D may perform an XOR operation to the previous datum "B00⊕C00" stored in the second LFSR 312D and the feedback datum "D00" outputted from the first XOR arithmetic element 321D to output a datum "B00⊕C00⊕D00", and the output datum "B00⊕C00⊕D00" of the third XOR arithmetic element 323D may be stored into the third LFSR 313D. The previous datum "A00⊕B00⊕C00" stored in the third LFSR 313D may be transmitted to the fourth LFSR 314D. The second XOR arithmetic element 322D may perform an XOR operation to the previous datum "A00⊕B00" stored in the fourth LFSR 314D and the feedback datum "D00" outputted from the first XOR arithmetic element 321D to output a datum "A00⊕B00⊕D00", and the output datum "A00⊕B00⊕D00" of the second XOR arithmetic element 322D may be stored into the fifth LFSR 315D. The previous datum "A00⊕C00" stored in the fifth LFSR 315D may be transmitted to the sixth LFSR 316D. The previous datum "B00" stored in the sixth LFSR 316D may be transmitted to the seventh LFSR 317D. The previous datum "A00" stored in the seventh LFSR 317D may be transmitted to the eighth LFSR 318D. As a result, the data "D00", "C00⊕D00", "B00⊕C00⊕D00", "A00⊕B00⊕C00", "A00⊕B00⊕D00", "A00⊕C00", "B00" and "A00" may be respectively stored into the first to eighth LFSRs 311D to 318D during the fourth clock cycle.

Next, as illustrated in FIG. 36, in the fifth step executed during the fifth clock cycle, the arbitrary variable "E00" allocated to the third bit of the original data may be inputted to the iterative operation logic circuit 300D, and the input datum "E00" may be outputted as a portion of the codeword and may also be inputted to the first XOR arithmetic element 321D. The first XOR arithmetic element 321D may perform an XOR operation to the datum "E00" or the third bit value of the original data and the datum "A00" outputted from the eighth LFSR 318D to output a datum "A00⊕E00" as the feedback datum. The feedback datum "A00⊕E00" may be inputted to all of the second to fourth XOR arithmetic elements 322D~324D and may be stored into the first LFSR 311D. The fourth XOR arithmetic element 324D may perform an XOR operation to the previous datum "D00" stored in the first LFSR 311D and the feedback datum "A00⊕E00" outputted from the first XOR arithmetic element 321D to output a datum "D00⊕A00⊕E00", and the output datum "D00⊕A00⊕E00" of the fourth XOR arithmetic element 324D may be stored into the second LFSR 312D. The third XOR arithmetic element 323D may perform an XOR operation to the previous datum "C00⊕D00" stored in the second LFSR 312D and the feedback datum "A00⊕E00" outputted from the first XOR arithmetic element 321D to output a datum "C00⊕D00⊕A00⊕E00", and the output datum "C00⊕D00⊕A00⊕E00" of the third XOR arithmetic element 323D may be stored into the third LFSR 313D. The previous datum "B00⊕C00⊕D00" stored in the third LFSR 313D may be transmitted to the fourth LFSR 314D. The second XOR arithmetic element 322D may perform an XOR operation to the previous datum "A00⊕B00⊕C00" stored in the fourth LFSR 314D and the feedback datum "A00⊕E00" outputted from the first XOR arithmetic element 321D to output a datum "A00⊕B00⊕C00⊕A00⊕E00", and the output datum "A00⊕B00⊕C00⊕A00⊕E00" of the second XOR arithmetic element 322D may be stored into the fifth LFSR 315D. The previous datum "A00⊕B00⊕D00" stored in the fifth LFSR 315D may be transmitted to the sixth LFSR 316D. The previous datum "A00⊕C00" stored in the sixth LFSR 316D may be transmitted to the seventh LFSR 317D. The previous datum "B00" stored in the seventh LFSR 317D may be transmitted to the eighth LFSR 318D. As a result, the data "A00⊕E00", "D00⊕A00⊕E00", "C00⊕D00⊕A00⊕E00", "B00⊕C00⊕D00", "A00⊕B00⊕C00⊕A00⊕E00", "A00⊕B00⊕D00", "A00⊕C00" and "B00" may be respectively stored into the first to eighth LFSRs 311D to 318D during the fifth clock cycle.

Next, as illustrated in FIG. 37, in the sixth step executed during the sixth clock cycle, the arbitrary variable "F00" allocated to the second bit of the original data may be inputted to the iterative operation logic circuit 300D, and the input datum "F00" may be outputted as a portion of the codeword and may also be inputted to the first XOR arithmetic element 321D. The first XOR arithmetic element 321D may perform an XOR operation to the datum "F00" or the second bit value of the original data and the datum "B00" outputted from the eighth LFSR 318D to output a datum "B00⊕F00" as the feedback datum. The feedback datum "B00⊕F00" may be inputted to all of the second to fourth XOR arithmetic elements 322D~324D and may be stored into the first LFSR 311D. The fourth XOR arithmetic element 324D may perform an XOR operation to the previous datum "A00⊕E00" stored in the first LFSR 311D and the feedback datum "B00⊕F00" outputted from the first XOR arithmetic element 321D to output a datum "A00⊕E00⊕B00⊕F00", and the output datum "A00⊕E00⊕B00⊕F00" of the fourth XOR arithmetic element 324D may be stored into the second LFSR 312D. The third XOR arithmetic element 323D may perform an XOR operation to the previous datum "D00⊕A00⊕E00" stored in the second LFSR 312D and the feedback datum "B00⊕F00" outputted from the first XOR arithmetic element 321D to output a datum "D00⊕A00⊕E00⊕B00⊕F00", and the output datum "D00⊕A00⊕E00⊕B00⊕F00" of the third XOR arithmetic element 323D may be stored into the third LFSR 313D. The previous datum "C00⊕D00⊕A00⊕E00" stored in the third LFSR 313D may be transmitted to the fourth LFSR 314D. The second XOR arithmetic element 322D may perform an XOR operation to the previous datum "B00⊕C00⊕D00" stored in the fourth LFSR 314D and the feedback datum "B00⊕F00" outputted from the first XOR arithmetic element 321D to output a datum "B00⊕C00⊕D00⊕B00⊕F00", and the output datum "B00⊕C00⊕D00⊕B00⊕F00" of the second XOR arithmetic element 322D may be stored into the fifth LFSR 315D. The previous datum "A00⊕B00⊕C00⊕A00⊕E00" stored in the fifth LFSR 315D may be transmitted to the sixth LFSR 316D. The previous datum "A00⊕B00⊕D00" stored in the sixth LFSR 316D may be transmitted to the seventh LFSR 317D. The previous datum "A00⊕C00" stored in the seventh LFSR 317D may be transmitted to the eighth LFSR 318D. As a result, the data "B00⊕F00", "A00⊕E00⊕B00⊕F00", "D00⊕A00⊕E00⊕B00⊕F00", "C00⊕D00⊕A00⊕E00", "B00⊕C00⊕D00⊕B00⊕F00", "A00⊕B00⊕C00⊕A00⊕E00", "A00⊕B00⊕D00" and "A00⊕C00" may be respectively stored into the first to eighth LFSRs 311D to 318D during the sixth clock cycle.

Next, as illustrated in FIG. 38, in the seventh step executed during the seventh clock cycle, the arbitrary variable "G00" allocated to the first bit of the original data may be inputted to the iterative operation logic circuit 300D, and the input datum "G00" may be outputted as a portion of the codeword and may also be inputted to the first XOR arithmetic element 321D. The first XOR arithmetic element 321D may perform an XOR operation to the datum "G00" or the first bit value of the original data and the datum "A00⊕C00" outputted from the eighth LFSR 318D to output a datum "A00⊕C00⊕G00" as the feedback datum. The feedback datum "A00⊕C00⊕G00" may be inputted to all of the second to fourth XOR arithmetic elements 322D-324D and may be stored into the first LFSR 311D. The fourth XOR arithmetic element 324D may perform an XOR operation to the previous datum "B00⊕F00" stored in the first LFSR 311D and the feedback datum "A00⊕C00⊕G00" outputted from the first XOR arithmetic element 321D to output a datum "B00⊕F00⊕A00⊕C00⊕G00", and the output datum "B00⊕F00⊕A00⊕C00⊕G00" of the fourth XOR arithmetic element 324D may be stored into the second LFSR 312D. The third XOR arithmetic element 323D may perform an XOR operation to the previous datum "A00⊕E00⊕B00⊕F00" stored in the second LFSR 312D and the feedback datum "A00⊕C00⊕G00" outputted from the first XOR arithmetic element 321D to output a datum "A00⊕E00⊕B00⊕F00⊕A00⊕C00⊕G00", and the output datum "A00⊕E00⊕B00⊕F00⊕A00⊕C00⊕G00" of the third XOR arithmetic element 323D may be stored into the third LFSR 313D. The previous datum "D00⊕A00⊕E00⊕B00⊕F00" stored in the third LFSR 313D may be transmitted to the fourth LFSR 314D. The second XOR arithmetic element 322D may perform an XOR operation to the previous datum "C00⊕D00⊕A00⊕E00" stored in the fourth LFSR 314D and the feedback datum "A00⊕C00⊕G00" outputted from the first XOR arithmetic element 321D to output a datum "C00⊕D00⊕A00⊕E00⊕A00⊕C00⊕G00", and the output datum "C00⊕D00⊕A00⊕E00⊕A00⊕C00⊕G00" of the second XOR arithmetic element 322D may be stored into the fifth LFSR 315D. The previous datum "B00⊕C00⊕D00⊕B00⊕F00" stored in the fifth LFSR 315D may be transmitted to the sixth LFSR 316D. The previous datum "A00⊕B00⊕C00⊕A00⊕E00" stored in the sixth LFSR 316D may be transmitted to the seventh LFSR 317D. The previous datum "A00⊕B00⊕D00" stored in the seventh LFSR 317D may be transmitted to the eighth LFSR 318D. As a result, the data "A00⊕C00⊕G00", "B00⊕F00⊕A00⊕C00⊕G00", "A00⊕E00⊕B00⊕F00⊕A00⊕C00⊕G00", "D00⊕A00⊕E00⊕B00⊕F00", "C00⊕D00⊕A00⊕E00⊕A00⊕C00⊕G00", "B00⊕C00⊕D00⊕B00⊕F00", "A00⊕B00⊕C00⊕A00⊕E00"

and "A00⊕B00⊕D00" may be respectively stored into the first to eighth LFSRs 311D to 318D during the seventh clock cycle.

FIG. 39 is a relationship table between the iterative operation logic of FIG. 28 and simplified logic for the ECC encoding operation according to an embodiment of the present disclosure.

Referring to FIG. 39, a first column (denoted as "XOR-EQUATION") of the table shows each of the data finally stored in the first to eighth LFSRs 311D to 318D (i.e., each of the parity bit values included in the codeword) expressed by an XOR operation to the arbitrary variables allocated to the original data of exemplary 7 bits. For example, the datum finally stored in the third LFSR 313D may correspond to a value of a third parity bit among the parity bits included in the codeword. That is, a result of the XOR operation "A00⊕E00⊕B00⊕F00⊕A00⊕C00⊕G00" may correspond to the third parity bit value of the codeword.

Referring to the first column of the table in FIG. 39, the XOR operation is sometimes performed to the same variables. In such a case, the XOR operation to the same variables may produce a logic "0". Thus, the XOR operations to the same variables are required to be simplified based on the nature of the XOR operation. That is, since an XOR operation to the same data produces a logic "0", removal of the XOR operation to the same variables does not affect the final result of the whole XOR operations. Accordingly, if an XOR operation is performed to the same variables, the XOR operation to the same variables may be removed to simplify an implementation of the ECC encoding operation.

For example, the XOR operation "A00⊕E00⊕B00⊕F00⊕A00⊕C00⊕G00" producing the data finally stored in the third LFSR 313D may include an XOR operation of "A00⊕A00". Thus, the XOR operation of "A00⊕A00" may be removed from the XOR operation "A00⊕E00⊕B00⊕F00⊕A00⊕C00⊕G00" to obtain a simplified XOR operation "E00⊕B00⊕F00⊕C00⊕G00". In addition, the XOR operation "C00⊕D00⊕A00⊕E00⊕A00⊕C00⊕G00" producing the data finally stored in the fifth LFSR 315D may include XOR operations of "A00⊕A00" and "C00⊕C00". Thus, the XOR operations of "A00⊕A00" and "C00⊕C00" may be removed from the XOR operation "C00⊕D00⊕A00⊕E00⊕A00⊕C00⊕G00" to obtain a simplified XOR operation "D00⊕E00⊕G00". Furthermore, the XOR operation "B00⊕C00⊕D00⊕B00⊕F00" producing the data finally stored in the sixth LFSR 316D may include an XOR operation of "B00⊕B00". Thus, the XOR operation of "B00⊕B00" may be removed from the XOR operation "B00⊕C00⊕D00⊕B00⊕F00" to obtain a simplified XOR operation "C00⊕D00⊕F00". Moreover, the XOR operation "A00⊕B00⊕C00⊕A00⊕E00" producing the data finally stored in the seventh LFSR 317D may include an XOR operation of "A00⊕A00". Thus, the XOR operation of "A00⊕A00" may be removed from the XOR operation "A00⊕B00⊕C00⊕A00⊕E00" to obtain a simplified XOR operation "B00⊕C00⊕E00".

A second column (denoted as "SIMPLIFIED XOR-EQUATIONS WITHOUT DUPLICATE VARIABLES") of the table in FIG. 39 shows the simplified XOR operations corresponding to the original XOR operations of the first column. A third column (denoted as "PARITY BIT VALUES (EXAMPLE)") of the table in FIG. 39 shows an example result of the simplified XOR operations when the original data has the values of '1010110'. As described with reference to FIG. 30, if the 7-bit original data have a combination of '1010110', the variables "A00", "B00", "C00", "D00", "E00", "F00" and "G00" may respectively have a datum "0", a datum "1", a datum "1", a datum "0", a datum "1", a datum "0" and a datum "1". If the data of the variables "A00 to G00" are substituted into the simplified XOR equations of FIG. 39, data "0", "1", "0", "0", "0", "1", "1" and "1" may be respectively stored into the first to eighth LFSRs 311D to 318D. Thus, the parity having a combination of '01000111' may be outputted, and the parity data '01000111' may be identical to the data of the parity bits generated by the iteration operation to the original data having a combination of '0110101' as described with reference to FIG. 29 (i.e., identical to the original XOR operations of the first column in the table of FIG. 39). Accordingly, in the event that a logic circuit is realized based on the original XOR operations of the first column in the table or the simplified XOR operations of the second column in the table of FIG. 39, an ECC encoding operation may be performed even for one clock cycle when the data of the parity bits are simultaneously outputted in parallel.

Figure 40:
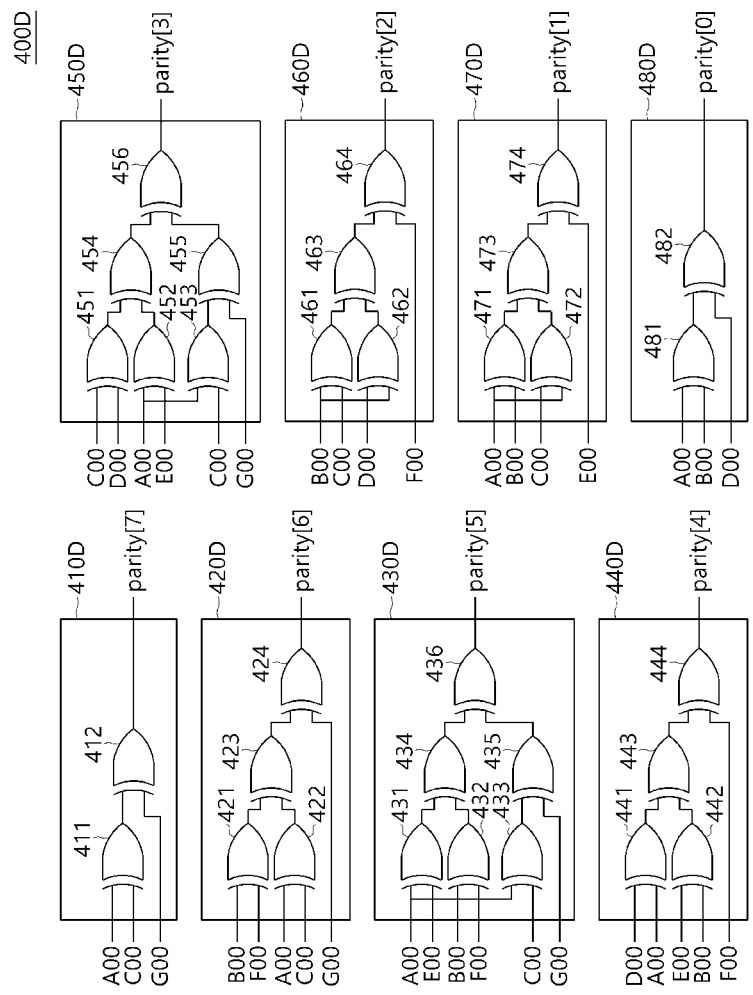
FIG. 40 is a circuit diagram illustrating an ECC encoder implemented by XOR gates realizing the iterative operation logic of FIG. 28.

FIG. 40 is a circuit diagram illustrating the ECC encoder 110D implemented by XOR gates realizing the iterative operation logic of FIG. 28. FIG. 40 shows a logic circuit according to the original XOR operations of the first column in the table of FIG. 39.

Referring to FIG. 40, the ECC encoder 400D may receive seven input data (i.e., first to seventh input data) in parallel to output eight output data (i.e., first to eighth output data corresponding to parity[7] to parity[0]) in parallel. The input data may correspond to arbitrary variables A00 to G00 as described with reference to FIG. 30. The output data (parity[7] to parity[0]) may correspond to data of parity bits included in a codeword.

The ECC encoder 400D may include sub-processing units 410D~480D. The sub-processing units 410D~480D may be an embodiment of the sub-processing units SUB0~SUBm shown in FIG. 25. The sub-processing units 410D~480D may consist of the processing unit 111C shown in FIG. 25. The sub-processing units 410D~480D may receive corresponding input data, and output a corresponding parity bit.

The first output datum (the parity[7]) may be generated by operations of first and second XOR arithmetic elements 411 and 412. The first XOR arithmetic element 411 may receive the arbitrary variable "A00" and the arbitrary variable "C00". The second XOR arithmetic element 412 may receive an output datum of the first XOR arithmetic element 411 and the arbitrary variable "G00". The first and second XOR arithmetic elements 411 and 412 may perform an operation to the XOR equation "A00⊕C00⊕G00". The first output datum (the parity[7]) outputted from the second XOR arithmetic element 412 may correspond to the datum finally stored in the first LFSR 311D (i.e., a datum of the first bit of the parity), as described with reference to FIG. 39.

The second output datum (the parity[6]) may be generated by operations of third to sixth XOR arithmetic elements 421, 422, 423 and 424. The third XOR arithmetic element 421 may receive the arbitrary variable "B00" and the arbitrary variable "F00". The fourth XOR arithmetic element 422 may receive the arbitrary variable "A00" and the arbitrary variable "C00". The fifth XOR arithmetic element 423 may receive an output datum of the third XOR arithmetic element 421 and an output datum of the fourth XOR arithmetic element 422. The sixth XOR arithmetic element 424 may receive an output datum of the fifth XOR arithmetic element 423 and the arbitrary variable "G00". The third to sixth XOR arithmetic elements 421 422, 423 and 424 may perform an operation to the XOR equation "B00⊕F00⊕A00⊕C00⊕G00". The second output datum (the parity[6]) outputted from the sixth XOR arithmetic element 424 may correspond to the datum finally stored in the second LFSR 312D (i.e., a datum of the second bit of the parity), as described with reference to FIG. 39.

The third output datum (the parity[5]) may be generated by operations of seventh to twelfth XOR arithmetic elements 431, 432, 433, 434, 435 and 436. The seventh XOR arithmetic element 431 may receive the arbitrary variable "A00" and the arbitrary variable "E00". The eighth XOR arithmetic element 432 may receive the arbitrary variable "B00" and the arbitrary variable "F00". The ninth XOR arithmetic element 433 may receive the arbitrary variable "A00" and the arbitrary variable "C00". The tenth XOR arithmetic element 434 may receive an output datum of the seventh XOR arithmetic element 431 and an output datum of the eighth XOR arithmetic element 432. The eleventh XOR arithmetic element 435 may receive an output datum of the ninth XOR arithmetic element 433 and the arbitrary variable "G00". The twelfth XOR arithmetic element 436 may receive an output datum of the tenth XOR arithmetic element 434 and an output datum of the eleventh XOR arithmetic element 435. The seventh to twelfth XOR arithmetic elements 431, 432, 433, 434, 435 and 436 may perform an operation to the XOR equation "A00⊕E00⊕B00⊕F00⊕A00⊕C00⊕G00". The third output datum (the parity[5]) outputted from the twelfth XOR arithmetic element 436 may correspond to the datum finally stored in the third LFSR 313D (i.e., a datum of the third bit of the parity), as described with reference to FIG. 39.

The fourth output datum (the parity[4]) may be generated by operations of thirteenth to sixteenth XOR arithmetic elements 441, 442, 443 and 444. The thirteenth XOR arithmetic element 441 may receive the arbitrary variable "D00" and the arbitrary variable "A00". The fourteenth XOR arithmetic element 442 may receive the arbitrary variable "E00" and the arbitrary variable "B00". The fifteenth XOR arithmetic element 443 may receive an output datum of the thirteenth XOR arithmetic element 441 and an output datum of the fourteenth XOR arithmetic element 442. The sixteenth XOR arithmetic element 444 may receive an output datum of the fifteenth XOR arithmetic element 443 and the arbitrary variable "F00". The thirteenth to sixteenth XOR arithmetic elements 441, 442, 443 and 444 may perform an operation to the XOR equation "D00⊕A00⊕E00⊕B00⊕F00". The fourth output datum (the parity[4]) outputted from the sixteenth XOR arithmetic element 444 may correspond to the datum finally stored in the fourth LFSR 314D (i.e., a datum of the fourth bit of the parity), as described with reference to FIG. 39.

The fifth output datum (the parity[3]) may be generated by operations of seventeenth to twenty-second XOR arithmetic elements 451, 452, 453, 454, 455 and 456. The seventeenth XOR arithmetic element 451 may receive the arbitrary variable "C00" and the arbitrary variable "D00". The eighteenth XOR arithmetic element 452 may receive the arbitrary variable "A00" and the arbitrary variable "E00". The nineteenth XOR arithmetic element 453 may receive the arbitrary variable "A00" and the arbitrary variable "C00". The twentieth XOR arithmetic element 454 may receive an output datum of the seventeenth XOR arithmetic element 451 and an output datum of the eighteenth XOR arithmetic element 452. The twenty-first XOR arithmetic element 455 may receive an output datum of the nineteenth XOR arithmetic element 453 and the arbitrary variable "G00". The twenty-second XOR arithmetic element 456 may receive an output datum of the twentieth XOR arithmetic element 454 and an output datum of the twenty-first XOR arithmetic element 455. The seventeenth to twenty-second XOR arithmetic elements 451, 452, 453, 454, 455 and 456 may perform an operation to the XOR equation "C00⊕D00⊕A00⊕E00⊕A00⊕C00⊕G00". The fifth output datum (the parity[3]) outputted from the twenty-second XOR arithmetic element 456 may correspond to the datum finally stored in the fifth LFSR 315D (i.e., a datum of the fifth bit of the parity), as described with reference to FIG. 39.

The sixth output datum (the parity[2]) may be generated by operations of twenty-third to twenty-sixth XOR arithmetic elements 461, 462, 463 and 464. The twenty-third XOR arithmetic element 461 may receive the arbitrary variable "B00" and the arbitrary variable "C00". The twenty-fourth XOR arithmetic element 462 may receive the arbitrary variable "B00" and the arbitrary variable "D00". The twenty-fifth XOR arithmetic element 463 may receive an output datum of the twenty-third XOR arithmetic element 461 and an output datum of the twenty-fourth XOR arithmetic element 462. The twenty-sixth XOR arithmetic element 464 may receive an output datum of the twenty-fifth XOR arithmetic element 463 and the arbitrary variable "F00". The twenty-third to twenty-sixth XOR arithmetic elements 461, 462, 463 and 464 may perform an operation to the XOR equation "B00⊕C00⊕D00⊕B00⊕F00". The sixth output datum (the parity[2]) outputted from the twenty-sixth XOR arithmetic element 464 may correspond to the datum finally stored in the sixth LFSR 316D (i.e., a datum of the sixth bit of the parity), as described with reference to FIG. 39.

The seventh output datum (the parity[1]) may be generated by operations of twenty-seventh to thirtieth XOR arithmetic elements 471, 472, 473 and 474. The twenty-seventh XOR arithmetic element 471 may receive the arbitrary variable "A00" and the arbitrary variable "B00". The twenty-eighth XOR arithmetic element 472 may receive the arbitrary variable "A00" and the arbitrary variable "C00". The twenty-ninth XOR arithmetic element 473 may receive an output datum of the twenty-seventh XOR arithmetic element 471 and an output datum of the twenty-eighth XOR arithmetic element 472. The thirtieth XOR arithmetic element 474 may receive an output datum of the twenty-ninth XOR arithmetic element 473 and the arbitrary variable "E00". The twenty-seventh to thirtieth XOR arithmetic elements 471, 472, 473 and 474 may perform an operation to the XOR equation "A00⊕B00⊕C00⊕A00⊕E00". The seventh output datum (the parity[1]) outputted from the thirtieth XOR arithmetic element 474 may correspond to the datum finally stored in the seventh LFSR 317D (i.e., a datum of the seventh bit of the parity), as described with reference to FIG. 39.

The eighth output datum (the parity[0]) may be generated by operations of thirty-first and thirty-second XOR arithmetic elements 481 and 482. The thirty-first XOR arithmetic element 481 may receive the arbitrary variable "A00" and the arbitrary variable "B00". The thirty-second XOR arithmetic element 482 may receive an output datum of the thirty-first XOR arithmetic element 481 and the arbitrary variable "D00". The thirty-first and thirty-second XOR arithmetic elements 481 and 482 may perform an operation to the XOR equation "A00⊕B00⊕D00". The eighth output datum (the parity[0]) outputted from the thirty-second XOR arithmetic element 482 may correspond to the datum finally stored in the eighth LFSR 318D (i.e., a datum of the eighth bit of the parity), as described with reference to FIG. 39.

As described above, the ECC decoder 400D according to an embodiment may be realized using a logic circuit based on the XOR equations including the duplicate operations. As a result, thirty two XOR arithmetic elements (e.g., 32 XOR gates) may be required to realize the ECC decoder 400D. Since the ECC encoding operation is performed using only the XOR operations of the arbitrary variables "A00 to G00" inputted in parallel, the output data of the ECC decoder 400D corresponding to the parity bits (parity[7] to parity[0]) of the codeword may also be outputted in parallel. In addition, the ECC encoding operation may be performed in one clock cycle.

Figure 41:
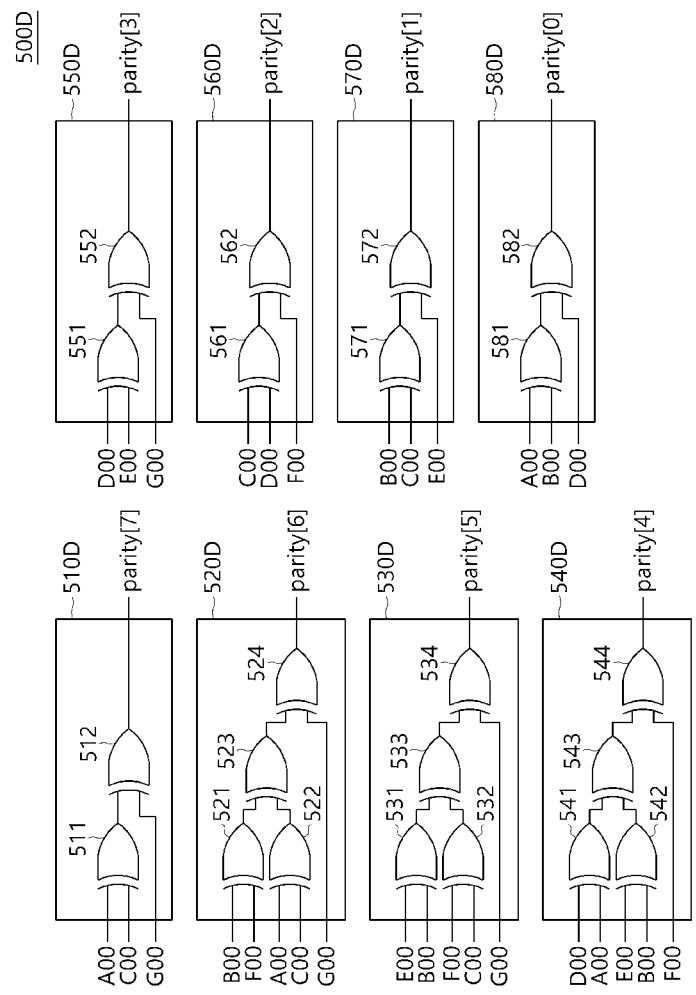
FIG. 41 is a circuit diagram illustrating an ECC encoder implemented by XOR gates realizing the simplified logic.

FIG. 41 is a circuit diagram illustrating the ECC encoder 110D implemented by XOR gates realizing a simplified logic circuit according to the simplified XOR equations without duplicate variables of the second column in the table of FIG. 39. equations without duplicate operations Referring to FIG. 41, the ECC encoder 500D may receive seven input data (i.e., first to seventh input data) in parallel to output eight output data (i.e., first to eighth output data corresponding to parity[7] to parity[0]) in parallel. The input data may correspond to arbitrary variables A00 to G00 as described with reference to FIG. 30. The output data (parity[7] to parity[0]) may correspond to data of parity bits included in a codeword.

The ECC encoder 500D may include sub-processing units 510D~580D. The sub-processing units 510D~580D may be an embodiment of the sub-processing units SUB0—SUBm shown in FIG. 25. The sub-processing units 510D~580D may consist of the processing unit 111C shown in FIG. 25. The sub-processing units 510D~580D may receive corresponding input data, and output a corresponding parity bit.

The first output datum (the parity[7]) may be generated by operations of first and second XOR arithmetic elements 511 and 512. The first XOR arithmetic element 511 may receive the arbitrary variable "A00" and the arbitrary variable "C00". The second XOR arithmetic element 512 may receive an output datum of the first XOR arithmetic element 511 and the arbitrary variable "G00". The first and second XOR arithmetic elements 511 and 512 may perform an operation to the XOR equation "A00⊕C00⊕G00". The first output datum (the parity[7]) outputted from the second XOR arithmetic element 512 may correspond to the datum finally stored in the first LFSR 311D (i.e., a datum of the first bit of the parity), as described with reference to FIG. 39.

The second output datum (the parity[6]) may be generated by operations of third to sixth XOR arithmetic elements 521, 422, 423 and 524. The third XOR arithmetic element 521 may receive the arbitrary variable "B00" and the arbitrary variable "F00". The fourth XOR arithmetic element 522 may receive the arbitrary variable "A00" and the arbitrary variable "C00". The fifth XOR arithmetic element 523 may receive an output datum of the third XOR arithmetic element 521 and an output datum of the fourth XOR arithmetic element 522. The sixth XOR arithmetic element 524 may receive an output datum of the fifth XOR arithmetic element 523 and the arbitrary variable "G00". The third to sixth XOR arithmetic elements 521 522, 523 and 524 may perform an operation to the XOR equation "B00⊕F00⊕A00⊕C00⊕G00". The second output datum (the parity[6]) outputted from the sixth XOR arithmetic element 524 may correspond to the datum finally stored in the second LFSR 312D (i.e., a datum of the second bit of the parity), as described with reference to FIG. 39.

The third output datum (the parity[5]) may be generated by operations of seventh to tenth XOR arithmetic elements 531, 532, 533 and 534. The seventh XOR arithmetic element 531 may receive the arbitrary variable "E00" and the arbitrary variable "B00". The eighth XOR arithmetic element 532 may receive the arbitrary variable "F00" and the arbitrary variable "C00". The ninth XOR arithmetic element 533 may receive an output datum of the seventh XOR arithmetic element 531 and an output datum of the eighth XOR arithmetic element 532. The tenth XOR arithmetic element 534 may receive an output datum of the ninth XOR arithmetic element 533 and the arbitrary variable "G00". The seventh to tenth XOR arithmetic elements 531, 532, 533 and 534 may perform an operation to the XOR equation "E00⊕B00⊕F00⊕C00⊕G00". The third output datum (the parity[5]) outputted from the tenth XOR arithmetic element 534 may correspond to the datum finally stored in the third LFSR 313D (i.e., a datum of the third bit of the parity), as described with reference to FIG. 39.

The fourth output datum (the parity[4]) may be generated by operations of eleventh to fourteenth XOR arithmetic elements 541, 542, 543 and 544. The eleventh XOR arithmetic element 541 may receive the arbitrary variable "D00" and the arbitrary variable "A00". The twelfth XOR arithmetic element 542 may receive the arbitrary variable "E00" and the arbitrary variable "B00". The thirteenth XOR arithmetic element 543 may receive an output datum of the eleventh XOR arithmetic element 541 and an output datum of the twelfth XOR arithmetic element 542. The fourteenth XOR arithmetic element 544 may receive an output datum of the thirteenth XOR arithmetic element 543 and the arbitrary variable "F00". The eleventh to fourteenth XOR arithmetic elements 541, 542, 543 and 544 may perform an operation to the XOR equation "D00⊕A00⊕E00⊕B00⊕F00". The fourth output datum (the parity[4]) outputted from the fourteenth XOR arithmetic element 544 may correspond to the datum finally stored in the fourth LFSR 314D (i.e., a datum of the fourth bit of the parity), as described with reference to FIG. 39.

The fifth output datum (the parity[3]) may be generated by operations of fifteenth and sixteenth XOR arithmetic elements 551 and 552. The fifteenth XOR arithmetic element 551 may receive the arbitrary variable "D00" and the arbitrary variable "E00". The sixteenth XOR arithmetic element 552 may receive an output datum of the fifteenth XOR arithmetic element 551 and the arbitrary variable "G00". The fifteenth and sixteenth XOR arithmetic elements 551 and 552 may perform an operation to the XOR equation "D00⊕E00⊕G00". The fifth output datum (the parity[3]) outputted from the sixteenth XOR arithmetic element 552 may correspond to the datum finally stored in the fifth LFSR 315D (i.e., a datum of the fifth bit of the parity), as described with reference to FIG. 39.

The sixth output datum (the parity[2]) may be generated by operations of seventeenth and eighteenth XOR arithmetic elements 561 and 562. The seventeenth XOR arithmetic element 561 may receive the arbitrary variable "C00" and the arbitrary variable "D00". The eighteenth XOR arithmetic element 562 may receive an output datum of the seventh XOR arithmetic element 561 and the arbitrary variable "F00". The seventh and eighteenth XOR arithmetic elements 561 and 562 may perform an operation to the XOR equation "C00⊕D00⊕F00". The sixth output datum (the parity[2]) outputted from the eighteenth XOR arithmetic element 562 may correspond to the datum finally stored in the sixth LFSR 316D (i.e., a datum of the sixth bit of the parity), as described with reference to FIG. 39.

The seventh output datum (the parity[1]) may be generated by operations of nineteenth and twentieth XOR arithmetic elements 571 and 572. The nineteenth XOR arithmetic element 571 may receive the arbitrary variable "B00" and the arbitrary variable "C00". The twentieth XOR arithmetic element 572 may receive an output datum of the nineteenth XOR arithmetic element 571 and the arbitrary variable "E00". The twenty-seventh to thirtieth XOR arithmetic elements 471, 472, 473 and 474 may perform an operation to the XOR equation "B00⊕C00⊕E00". The seventh output datum (the parity[1]) outputted from the twentieth XOR arithmetic element 572 may correspond to the datum finally stored in the seventh LFSR 317D (i.e., a datum of the seventh bit of the parity), as described with reference to FIG. 39.

The eighth output datum (the parity[0]) may be generated by operations of twenty-first and twenty-second XOR arithmetic elements 581 and 582. The twenty-first XOR arithmetic element 581 may receive the arbitrary variable "A00" and the arbitrary variable "B00". The twenty-second XOR arithmetic element 582 may receive an output datum of the twenty-first XOR arithmetic element 581 and the arbitrary variable "D00". The twenty-first and twenty-second XOR arithmetic elements 581 and 582 may perform an operation to the XOR equation "A00⊕B00⊕D00". The eighth output datum (the parity[0]) outputted from the twenty-second XOR arithmetic element 582 may correspond to the datum finally stored in the eighth LFSR 318D (i.e., a datum of the eighth bit of the parity), as described with reference to FIG. 39.

As described above, the ECC decoder 500D according to another embodiment may be realized using a logic circuit based on the simplified XOR equations without duplicate operations. As a result, only twenty two XOR arithmetic elements (e.g., 32 XOR gates) may be required to realize the ECC decoder 500D. Since the ECC encoding operation is performed using only the XOR operations of the arbitrary variables "A00 to G00" inputted in parallel, the output data of the ECC decoder 500D corresponding to the parity bits (parity[7] to parity[0]) of the codeword may also be outputted in parallel. In addition, the ECC encoding operation may be performed in one clock cycle.

According to the embodiments, XOR equations for an ECC encoding operation may be extracted using XOR arithmetic elements (e.g., XOR gates) and linear feedback shift registers (LFSRs). Thus, any one of ECC encoders according to the embodiments may be realized using only XOR arithmetic elements (e.g., XOR gates), and the ECC encoders may perform the ECC encoding operation for one clock cycle.

Figure 42:
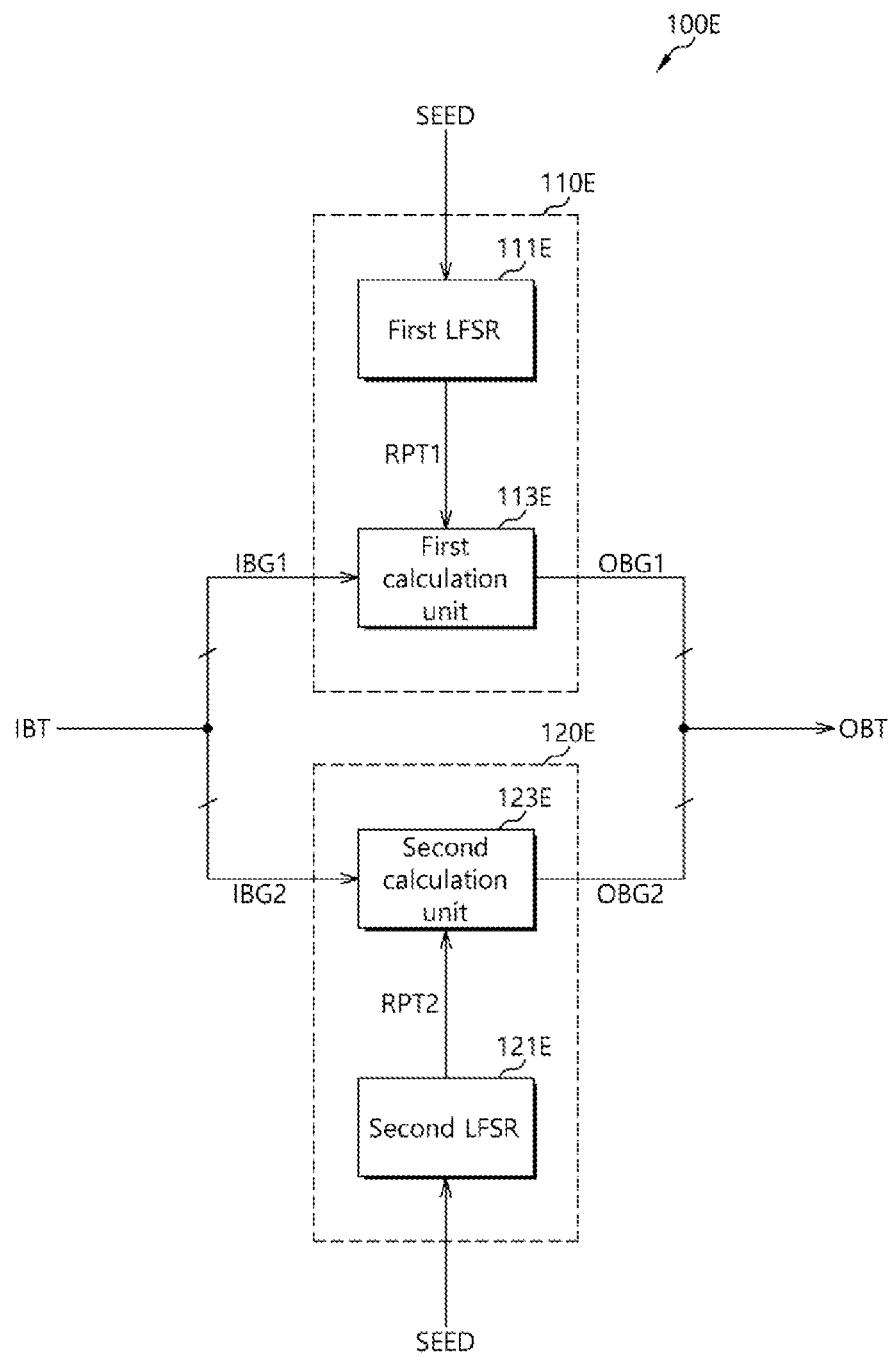
FIG. 42 is a block diagram exemplarily illustrating a data processing circuit in accordance with an embodiment of the present invention.

FIG. 42 is a block diagram exemplarily illustrating a data processing circuit 100E in accordance with an embodiment of the present invention.

Referring to FIG. 42, the data processing circuit 100E may transform a plurality of input bits IBT into a plurality of output bits OBT, and output the output bits OBT. The data processing circuit 100E may generate the output bits OBT by randomizing the input bits IBT. The data processing circuit 100E may generate output data by randomizing a pattern of the input bits IBT in order to minimize data interference and suppress data deformation.

The plurality of input bits IBT may be inputted in parallel to the data processing circuit 100E. For example, the total number of the bits inputted in parallel to the data processing circuit 100E may be 8, 16 or the like.

The plurality of input bits IBT may be grouped into a plurality of input bit groups. For example, upper half bits and lower half bits among the plurality of input bits IBT may be grouped into first and second input bit groups IBG1 and IBG2, respectively. The number of input bit groups are not intended to be a limiting feature.

The data processing circuit 100E may include a plurality of transformation blocks, for example, first and second transformation blocks 110E and 120E. Each of the first and second transformation blocks 110E and 120E may be an embodiment of the transformation unit 110C shown in FIG. 24.

The first and second input bit groups IBG1 and IBG2 may be inputted in parallel to the first and second transformation blocks 110E and 120E. The first input bit group IBG1 may be inputted to the first transformation block 110E, and at substantially the same time, the second input bit group IBG2 may be inputted to the second transformation block 120E. The plurality of input bits IBT comprising the first and second input bit groups IBG1 and IBG2 may be inputted in parallel to the first and second transformation blocks 110E and 120E.

The first and second transformation blocks 110E and 120E may respectively transform the first and second input bit groups IBG1 and IBG2 in parallel into first and second output bit groups OBG1 and OBG2. The first transformation block 110E may transform the first input bit group IBG1 into the first output bit group OBG1, and at substantially the same time, the second transformation block 120E may transform the second input bit group IBG2 into the second output bit group OBG2.

The first and second transformation blocks 110E and 120E may respectively output in parallel the first and second output bit groups OBG1 and OBG2. The first and second transformation blocks 110E and 120E may output in parallel the output bits OBT comprising the first and second output bit groups OBG1 and OBG2.

The first transformation block 110E may include a first random pattern generation unit 111E and a first calculation unit 113E.

The first random pattern generation unit 111E may be an embodiment of the processing unit 111C shown in FIG. 24. The first random pattern generation unit 111E may consist of XOR arithmetic elements. The operation of first random pattern generation unit 111E may be performed in one clock cycle. The first random pattern generation unit 111E may be implemented in a manner substantially similar to a manner in which the sub-processing units 510D~580D are implemented. The first random pattern generation unit 111E may be implemented by XOR gates realizing a simplified logic circuit according to simplified XOR equations.

The first random pattern generation unit 111E may generate a first random pattern RPT1 based on a seed SEED. The first random pattern generation unit 111E may include a first linear feedback shift register (hereinafter, referred to as a 'first LFSR') for generating the first random pattern RPT1 based on the seed SEED.

The first calculation unit 113E may perform a logic operation on the first input bit group IBG1 and the first random pattern RPT1, and generate the first output bit group OBG1. For example, the logic operation of the first calculation unit 113E may be an XOR operation.

The second transformation block 120E may include a second random pattern generation unit 121E and a second calculation unit 123E.

The second random pattern generation unit 121E may generate a second random pattern RPT2 based on the seed SEED. The second random pattern generation unit 121E may include a second linear feedback shift register (hereinafter, referred to as a 'second LFSR') for generating the second random pattern RPT2 based on the seed SEED.

The second random pattern generation unit 121E may be an embodiment of the processing unit 111C shown in FIG.

24. The second random pattern generation unit 121E may consist of XOR arithmetic elements. The operation of second random pattern generation unit 121E may be performed in one clock cycle. The second random pattern generation unit 121E may be implemented in a manner substantially similar to a manner in which the sub-processing units 510D~580D are implemented. The second random pattern generation unit 121E may be implemented by XOR gates realizing a simplified logic circuit according to simplified XOR equations.

The second calculation unit 123E may perform a logic operation on the second input bit group IBG2 and the second random pattern RPT2, and generate the second output bit group OBG2. For example, the logic operation of the second calculation unit 123E may be an XOR operation.

In accordance with the embodiment, the first and second LFSRs 111E and 121E may correspond to different characteristic polynomials. Meanwhile, in accordance with the embodiment, when the data processing circuit 100E includes at least three LFSRs, the LFSRs may correspond to at least two characteristic polynomials.

In accordance with the embodiment, each of the first and second LFSRs 111E and 121E may generate a maximum length sequence.

In accordance with the embodiment, the degrees of the characteristic polynomials of the first and second LFSRs 111E and 121E may be a multiple number of the plurality of input bit groups IBG1 and IBG2 inputted to the first and second transformation blocks 110E and 120E, respectively. In accordance with the embodiment, the degree of each of the characteristic polynomials of the first and second LFSRs 111E and 121E may be a multiple number of the plurality of input bits IBT inputted to the data processing circuit 100E.

In accordance with the embodiment, the data processing circuit 100E may inverse transform the transformed data by performing the above-described data transformation process. When the output bits OBT are inputted in parallel to the first and second transformation blocks 110E and 120E, the first and second transformation blocks 110E and 120E may respectively transform in parallel the first and second output bit groups OBG1 and OBG2 into the first and second input bit groups IBG1 and IBG2. Further, the first and second transformation blocks 110E and 120E may output in parallel the first and second input bit groups IBG1 and IBG2, that is, the input bits IBT.

Even though it is illustrated in FIG. 42 that the data processing circuit 100E includes two transformation blocks 110E and 120E, the number of transformation blocks included in the data processing circuit 100E is not be specifically limited. The number of the transformation blocks included in the data processing circuit 100E may determine the bit number of respective input bit groups. For example, when the number of transformation blocks included in the data processing circuit 100E is L, the bit number of respective input bit groups of the input bits IBT having J number of bits will be J/L. The number of bits of each output bit group may be set to be the same as the number of bits of each input bit group.

Figure 43:
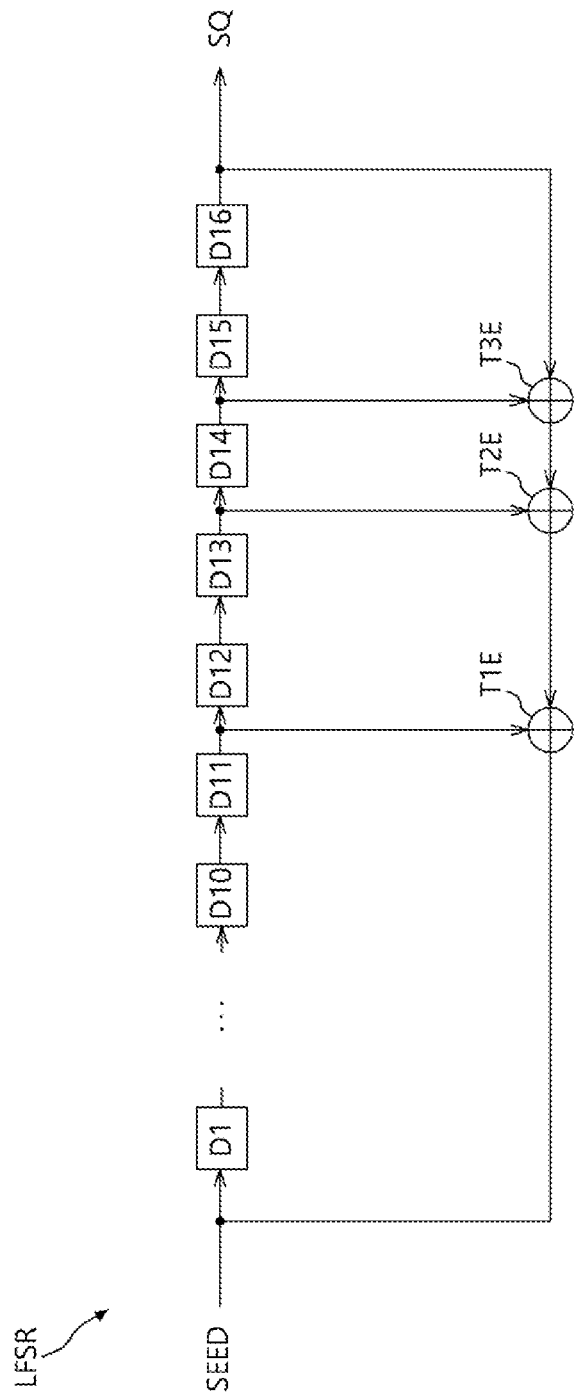
FIG. 43 is a diagram illustrating an example of first and second LFSRs shown in FIG. 42.

FIG. 43 is a diagram illustrating an example of the first and second LFSRs 111E and 123E shown in FIG. 42. FIG. 43 illustrates an LFSR of the Fibonacci implementation, another implementation, for example, an LFSR of the Galois implementation, may also be realized.

Referring to FIG. 43, the LFSR may include 16 registers D1 to D16 which are electrically coupled in series. The seed SEED may be inputted to the first register D1, each of the registers D1 to D15 may shift a stored value to next register each time a clock signal is enabled (not shown), and the last register D16 may output a sequence SQ. FIG. 43 exemplarily shows the outputs of the registers D16, D14, D13 and D11 as the tabs. The tabs may be fed back to the first register D1 after XOR operations through XOR operation units T1E to T3E. The LFSR may be used to generate a random pattern, for example, each of the first and second random patterns RPT1 and RPT2 of FIG. 42. The LFSR may generate a random pattern of K bits based on the values stored in K number of registers selected among N number of total registers in the LSFR each time the clock signal is enabled.

The LFSR comprising N number of total registers may correspond to the following characteristic polynomial.

$$f(x)=x^N+a_{(N-1)}x^{(N-1)}+a_{(N-2)}x^{(N-2)}+\ldots+a_1x+1$$

In the above polynomial, the coefficient $a_i$ may be 0 or 1 according to the positions of the tabs. For example, the LFSR shown in FIG. 43 may correspond to the following characteristic polynomial.

$$f(x)=x^{16}+x^{14}+x^{13}+x^{11}+1$$

The LFSR shown in FIG. 43 may correspond to a tab sequence [16, 14, 13, 11] representing the positions of the tabs.

The sequence SQ outputted from the last register D16 in response to the enablement of the clock signal, that is, the output of the LFSR may be repeated with a predetermined cycle.

When the characteristic polynomial of the LFSR is a primitive polynomial, the LFSR may output the sequence SQ with a maximum length. When the LFSR including the N registers outputs the sequence SQ with a maximum length, the length of the sequence SQ may be $2^N-1$. In other words, when the LFSR outputs the sequence SQ with a maximum length, the sequence SQ may be repeated with a cycle of $2^N-1$. The sequence SQ may be defined as a maximum length sequence or an M-sequence. The M-sequence may be outputted when the N registers have 2N-1 number of states except that all of the N registers have the state of 0.

For example, the tab progressions of the LFSR including 4 tabs and outputting the M-sequence may be as follows:

[16, 15, 13, 4], [16, 15, 12, 10], [16, 15, 12, 1], [16, 15, 10, 4], [16, 15, 9, 6], [16, 15, 9, 4], [16, 15, 7, 2], [16, 15, 4, 2], [16, 14, 13, 11], [16, 14, 13, 5], [16, 14, 12, 7], [16, 14, 11, 7], [16, 14, 9, 7], [16, 14, 9, 4], [16, 14, 8, 3], [16, 13, 12, 11], [16, 13, 12, 7], [16, 13, 11, 6], [16, 13, 9, 6], [16, 13, 6, 4], [16, 12, 9, 7], [16, 12, 9, 6], [16, 11, 10, 5], [16, 11, 9, 8], [16, 11, 9, 7], [16, 10, 9, 6].

As to the representative characteristics of the M-sequence, the M-sequence may have the maximum cycle of $2^N-1$, and the M-sequence may include 2 (N-1) number of 1s and $2^{(N-1)}-1$ number of 0s. Therefore, the random pattern generated from the LFSR, which outputs the M-sequence, may improve randomness of data.

Referring again to FIG. 42, the first and second random pattern generation units 111E and 121E may be the same or different.

In accordance with the embodiment, the first and second LFSRs 111E and 121E may correspond to different characteristic polynomials, in which case the first and second LFSRs 111E and 121E may output different sequences or different random patterns RPT1 and RPT2 based on the same seed SEED.

In accordance with the embodiment, the degree of the characteristic polynomials of the first and second LFSRs 111E and 121E may be a multiple number of the plurality of input bit groups IBG1 and IBG2 inputted to the first and second transformation blocks 110E and 120E, respectively. Each of the first and second LFSRs 111E and 121E may include N number of registers in total, and the N may be a multiple number of each of the plurality of input bit groups IBG1 and IBG2.

In accordance with the embodiment, the degree of each of the characteristic polynomials of the first and second LFSRs 111E and 121E may be a multiple number of the plurality of input bits IBT inputted to the data processing circuit 100E. For example, each of the first and second LFSRs 111E and 121E may include N number of registers in total, and the N may be a multiple number of the plurality of input bits IBT.

In accordance with the embodiment, each of the first and second LFSRs 111E and 121E may output the M-sequence. When each of the first and second LFSRs 111E and 121E includes N number of the registers in total, the first and second LFSRs 111E and 121E may output the sequences SQ or the first and second random patterns RPT1 and RPT2 with the cycle of $2^N-1$, respectively.

Figure 44:
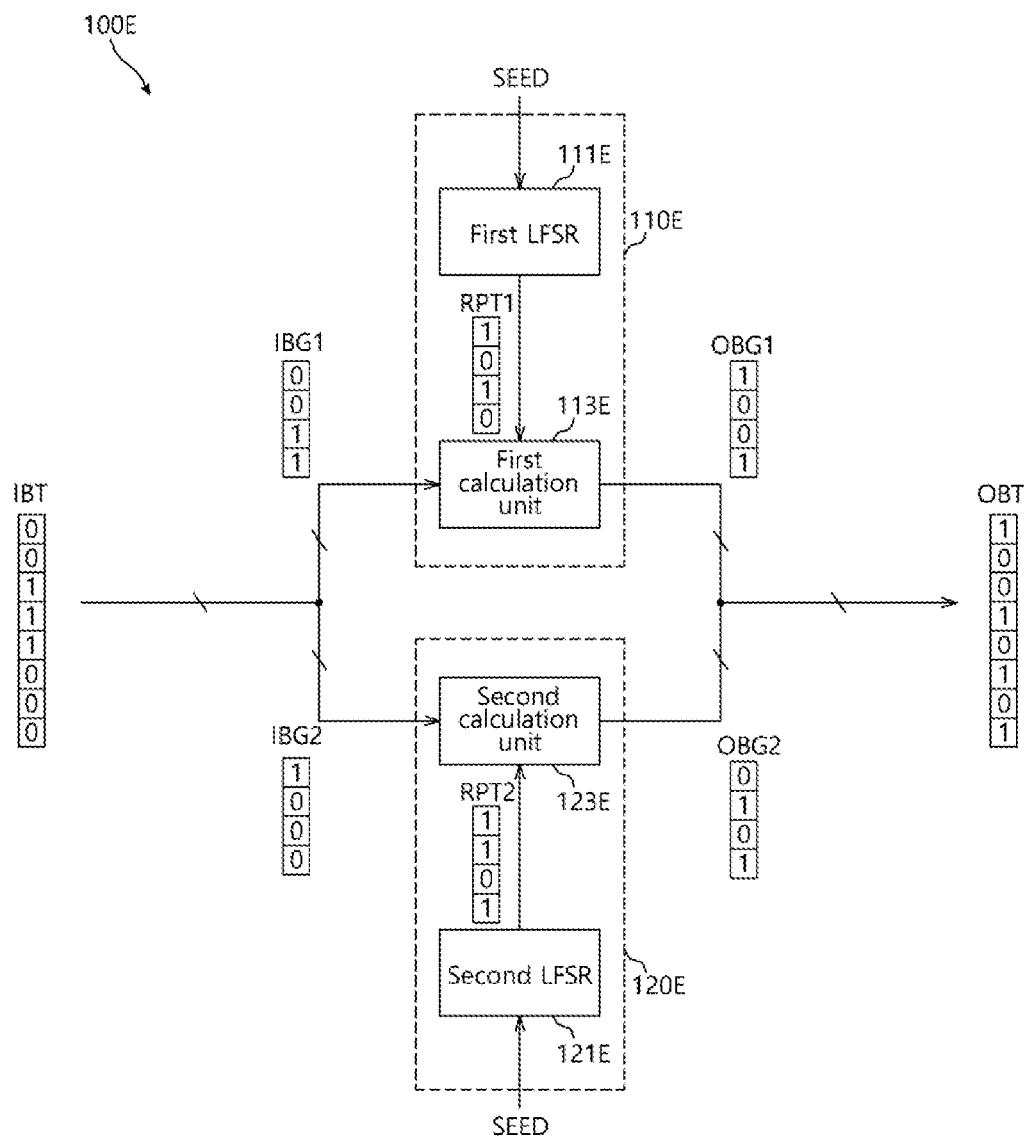
FIG. 44 is a block diagram exemplarily illustrating randomization and de-randomization of a data processing circuit of FIG. 42 in accordance with an embodiment of the present invention.

FIG. 44 is a block diagram exemplarily illustrating randomization and de-randomization of the data processing circuit 100E of FIG. 42 in accordance with an embodiment of the present invention. FIG. 44 exemplarily shows upper 4 bits and lower 4 bits, among the input bits IBT of 8 bits, that are grouped into the first and second input bit groups IBG1 and IBG2, respectively.

The input bits IBT may be inputted in parallel to the data processing circuit 100E. The first and second input bit groups IBG1 and IBG2 may be respectively inputted in parallel to the first and second transformation blocks 110E and 120E.

The first and second LFSRs 111E and 121E may generate the different first and second random patterns RPT1 and RPT2 based on the seed SEED due to the different characteristic polynomials. The first calculation unit 113E may generate the first output bit group OBG1 by performing an XOR operation on corresponding bits of the first input bit group IBG1 and the first random pattern RPT1, and at substantially the same time, the second calculation unit 123E may generate the second output bit group OBG2 by performing an XOR operation on corresponding bits of the second input bit group IBG2 and the second random pattern RPT2.

The first and second output bit groups OBG1 and OBG2 may be outputted in parallel from the first and second transformation blocks 110E and 120E. The output bits OBT comprising the first and second output bit groups OBG1 and OBG2 may be outputted in parallel from the data processing circuit 100E.

Figure 45:
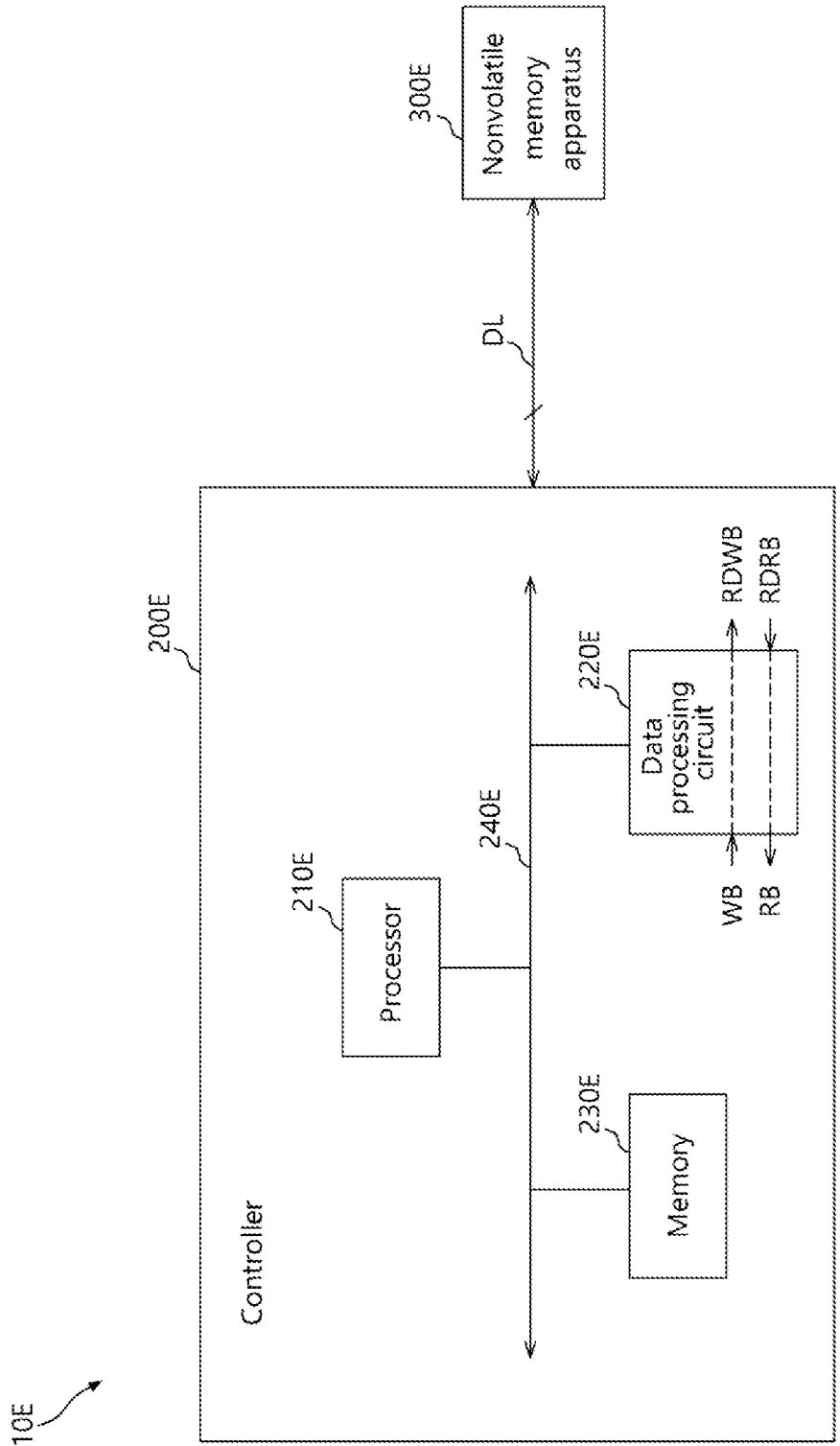
FIG. 45 is a block diagram exemplarily illustrating a data storage device in accordance with an embodiment of the present invention.

FIG. 45 is a block diagram exemplarily illustrating the data storage device 100E in accordance with an embodiment of the present invention.

The data storage device 10E may include a controller 200E and a nonvolatile memory apparatus 300E. The controller 200E may be an embodiment of the memory controller 100C shown in FIG. 24.

The controller 200E may include a processor 210E, a data processing circuit 220E, and a memory 230E, which may be electrically coupled and communicate with one another through an internal bus 240E.

The processor 210E may control the general operations of the data storage device 10E. The processor 210E may control the components of the controller 200E to perform predetermined functions. The processor 210E may control the write operation or the read operation of the nonvolatile memory apparatus 300E in response to a write request or a read request from an external device.

The data processing circuit 220E may transform write bits WB to be stored in the nonvolatile memory apparatus 300E into transformed write bits RDWB, and may inverse transform the read bits RDRB, which are read from the nonvolatile memory apparatus 300E, into inverse-transformed read bits RB. When the transformed write bits RDWB have the same value as the read bits RDRB, the inverse-transformed read bits RB may have the same values as the write bits WB, which means that the write bits WB may be restored to have the original value through the transformation process as described above with reference to FIGS. 42 to 44 when the write bits WB are stored in and then read from the nonvolatile memory apparatus 300E. The data processing circuit 220E may transform the write bits WB received from the memory 230 into transformed the write bits RDWB to be transferred to an ECC encoder (not shown), the memory 230, or a buffer (not shown). The data processing circuit 220E may transform the read bits RDRB received from the nonvolatile memory apparatus 300E into read bits RB to be transferred to an ECC decoder (not shown), the memory 230, or a buffer (not shown).

The data processing circuit 220E may include a plurality of transformation blocks (not shown). The plurality of transformation blocks may respectively transform in parallel a plurality of write bit groups included in the write bits WB into a plurality of transformed write bit groups, and may respectively output in parallel the plurality of transformed write bit groups. The transformed write bits RDWB may comprise the plurality of transformed write bit groups.

Further, the data processing circuit 220E may inverse transform in parallel a plurality of read bit groups included in the read bits RDRB into a plurality of inverse-transformed read bit groups. The inverse-transformed read bits RB may comprise the plurality of inverse-transformed read bit groups. The data processing circuit 220E may inverse transform the read bits RDRB into the plurality of inverse-transformed read bits RB by performing a transformation process to the plurality of read bits RDRB in substantially the same manner as the transformation process to the plurality of write bits WB.

The data processing circuit 220E may be the same as the data processing circuit 100E described with reference to FIGS. 42 to 44. In this case, for example, the write bits WB and the transformed write bits RDWB may be the plurality of input bits IBT and the plurality of output bits OBT described with reference to FIGS. 42 to 44, respectively.

The seed inputted to the data processing circuit 220E may correspond to a memory region of the nonvolatile memory apparatus 300E, in or from which data are to be stored or read. For example, the seed may be provided to the data processing circuit 220E according to the address offset of the corresponding memory region of the nonvolatile memory apparatus 300E. Accordingly, the seed corresponding to each memory region is fixed, and thus the data may be restored to have the original value through the same seed where the data is stored in and then read from the corresponding memory region of the nonvolatile memory apparatus 300E through the transformation process as described above with reference to FIGS. 42 to 44.

The memory 230E may serve as a working memory, a buffer memory or a cache memory of the processor 210E. The memory 230E as a working memory may store software programs and various program data for driving the processor 210E. The memory 230E as a buffer memory may buffer the data transmitted between the external device and the nonvolatile memory apparatus 300E. The memory 230E as a cache memory may temporarily store cache data.

The nonvolatile memory apparatus 300E may be provided in parallel with the plurality of transformed write bits RDWB, and store the plurality of transformed write bits RDWB through a write operation. The nonvolatile memory apparatus 300E may read the plurality of transformed write bits RDWB stored therein, as the plurality of read bits RDRB, and output in parallel the plurality of read bits RDRB. The nonvolatile memory apparatus 300E may transmit and receive data in parallel to and from the controller 200E through a plurality of data lines DL.

While FIG. 45 shows an example in which the data storage device 10E includes one nonvolatile memory apparatus 300E, the embodiment is not limited to such an example, and it is to be noted that the data storage device 10E may include a plurality of nonvolatile memory apparatus 300E.

According to an embodiment, the data processing circuit 220E may be disposed in the nonvolatile memory apparatus 300E instead of the controller 200E. In this case, the data processing circuit 220E may transform the plurality of write bits WB transmitted from the controller 200E, and may inverse transform the read bits RDRB into the inverse-transformed read bits RB and transmit the inverse-transformed read bits RB to the controller 200E.

According to an embodiment, the data processing circuit 220E may be integrated into a separate chip and be disposed between the controller 200E and the nonvolatile memory apparatus 300E, and may transmit transformed/inverse-transformed data between the controller 200E and the nonvolatile memory apparatus 300E.

FIG. 46 is a flow chart exemplarily illustrating an operation of the data storage device 10E of FIG. 45 in accordance with an embodiment of the present invention. FIG. 46 shows a process of transforming data to be stored in the nonvolatile memory apparatus 300E.

Referring to FIGS. 45 and 46, at step S110E, the data processing circuit 220E may receive in parallel the plurality of write bit groups included in the plurality of write bits WB. The plurality of write bits WB may be inputted in parallel to the data processing circuit 220E.

At step S120E, the plurality of transformation blocks included in the data processing circuit 220E may transform in parallel the plurality of write bit groups into the transformed write bit groups through different random patterns, respectively.

At step S130E, the controller 200E may transmit in parallel the plurality of transformed write bit groups to the nonvolatile memory apparatus 300E. The plurality of transformed write bits RDWB may comprise the plurality of transformed write bit groups.

At step S140E, the nonvolatile memory apparatus 300E may store the transformed write bit groups through a write operation.

FIG. 47 is a flow chart exemplarily illustrating an operation of the data processing circuit 220E of FIG. 45 in accordance with an embodiment of the present invention. FIG. 47 exemplarily shows step S120E described with reference to FIG. 46.

Referring to FIGS. 45 and 47, at step S111E, the plurality of random pattern generation units included in the data processing circuit 220E may generate a plurality of different random patterns based on a seed. The plurality of random pattern generation units may be the random pattern generation units 111E and 121E described with reference to FIGS. 1 to 3.

At step S112E, the plurality of calculation units included in the data processing circuit 220E may perform logic operations on the plurality of write bit groups and the plurality of random patterns, and generate the plurality of transformed write bit groups. The plurality of calculation units may be the calculation units 113E and 123E described with reference to FIGS. 42 to 44.

Figure 48:
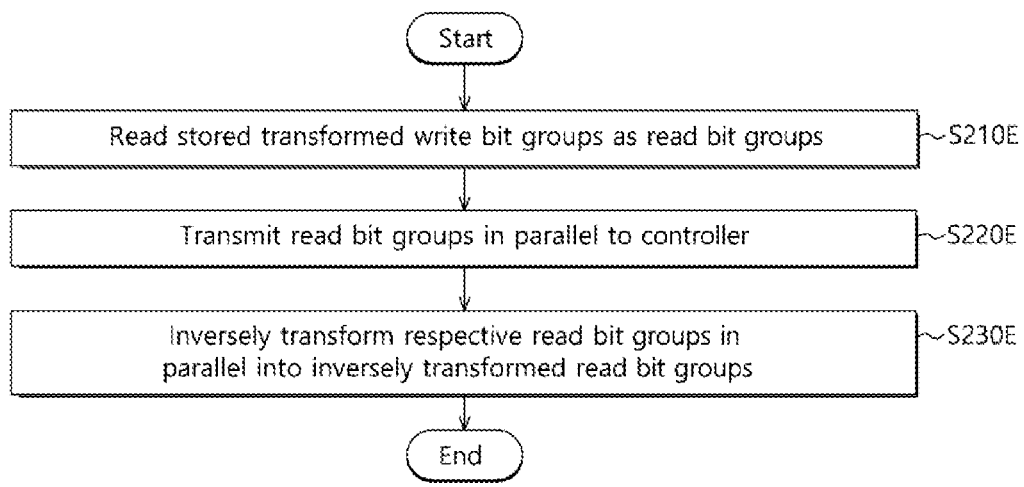
FIG. 48 is a flow chart exemplarily illustrating an operation of a data storage device of FIG. 45 in accordance with an embodiment of the present invention.

FIG. 48 is a flow chart exemplarily illustrating an operation of the data storage device 10E of FIG. 45 in accordance with an embodiment of the present invention. FIG. 48 shows a process of inverse-transforming the data read from the nonvolatile memory apparatus 300E.

Referring to FIGS. 45 and 48, at step S210E, the nonvolatile memory apparatus 300E may read the plurality of transformed write bit groups stored therein, as the plurality of read bit groups. The plurality of read bits RDRB may comprise the plurality of read bit groups.

At step S220E, the nonvolatile memory apparatus 300E may transmit in parallel the plurality of read bit groups to the controller 200E.

At step S230E, the plurality of transformation blocks included in the data processing circuit 220E may respectively inverse-transform in parallel the plurality of read bit groups to generate the plurality of inverse-transformed read bit groups. The plurality of inverse-transformed read bits RB may comprise the plurality of inverse-transformed read bit groups.

According to the embodiments, it is possible to effectively improve the randomness of data to be stored in the nonvolatile memory apparatus 300E through data processing by the plurality of transformation blocks disposed in parallel. Accordingly, it is possible to secure data reliability. Moreover, the rate of increase in the hardware size of the data processing circuit 220E for the parallel process of the plurality of transformation blocks is significantly smaller than the increase rate in hardware size for increasing the degree of the LFSR in order to lengthen the sequence. Therefore an advantage may be provided in retaining price competitiveness.

While various embodiments have been described above, it will be understood to those skilled in the art that the embodiments are examples of the invention only and that the invention is not intended to be limited to these embodiments. Many other embodiments and variations of the invention may be envisioned by those skilled in the art to which the invention pertains without departing from the spirit and scope of the invention as defined by the appended claims.

What is claimed is:

1. A memory device comprising:
   a transformation unit having a processing unit configured to perform an operation of generating second bit values in parallel, based on first bit values inputted in parallel, the first bit values having relationship to a memory region, and output data consisting of the second bit values; and
   an error correcting unit configured to perform an error correcting operation on the data read from the memory region,
   wherein the error correcting unit operates without performing normal decoding when a fast decoding condition is satisfied,
   and wherein the fast decoding condition is satisfied when an early termination of Low Density Parity Check (LDPC) decoding is activated.

2. The memory device according to claim 1, wherein the error correcting unit includes a syndrome checker.

3. The memory device according to claim 2, wherein the syndrome checker outputs decoding information.

4. The memory device according to claim 2, wherein the syndrome checker checks a syndrome of a codeword in the data.

5. The memory device according to claim 4, wherein the syndrome represents a checksum of the codeword.

6. The memory device according to claim 4, wherein the fast decoding condition is satisfied when the syndrome is greater than a checksum threshold.

7. The memory device according to claim 6, wherein the fast decoding condition is determined after comparing the syndrome and the checksum threshold.

8. The memory device according to claim 1, wherein the early termination of LDPC decoding is activated according to a result of a decoding on previous data.

9. The memory device according to claim 4, wherein the early termination is activated after comparing the syndrome and a checksum threshold.

10. The memory device according to claim 1, wherein, when the early termination is activated, the error correcting unit operates a fast decoding.

11. The memory device according to claim 10, wherein the error correcting unit changes a decoding mode from the normal decoding to the fast decoding when an inefficient decoding is expected.

12. The memory device according to claim 11, wherein the inefficient decoding includes a decoding having at least one of long execution time and a decoding ending in failure.

13. The memory device according to claim 10, wherein the error correcting unit changes a decoding mode from the normal decoding to the fast decoding in response to decoding information stored in a decoding information memory.

14. The memory device according to claim 10, wherein the error correcting unit changes a decoding mode from the normal decoding to the fast decoding in response to a result of a previous decoding.

15. The memory device according to claim 1, wherein, when the fast decoding condition is satisfied, the data is transmitted to a memory by bypassing the error correcting unit.

16. The memory device according to claim 15, wherein, when the fast decoding condition is satisfied, the error correcting unit processes the data in the bypass mode.

17. The memory device according to claim 15, wherein, when the fast decoding condition is satisfied, the data is transmitted directly to the memory through an input/output circuit without passing the error correcting unit.

18. The memory device according to claim 1, further including a syndrome checker.

19. The memory device according to claim 18, wherein the syndrome checker checks a syndrome of a codeword in the data.

20. The memory device according to claim 19, wherein the syndrome represents a checksum of the codeword.

21. The memory device according to claim 19, wherein the fast decoding condition is satisfied when the syndrome is greater than a checksum threshold.

22. The memory device according to claim 21, wherein the fast decoding condition is determined after comparing the syndrome and the checksum threshold.

23. The memory device according to claim 21, wherein the error correcting unit determines a decoding mode after comparing the syndrome and the checksum threshold.

24. The memory device according to claim 19, wherein the early termination is activated when the syndrome is greater than a checksum threshold.

25. The memory device according to claim 1, wherein, when the early termination is activated, the error correcting unit changes a decoding mode from a first decoding mode to a second decoding mode.

26. The memory device according to claim 1, wherein, when the early termination is activated, the error correcting unit sets a second decoding mode.

27. The memory device according to claim 1, wherein, when the early termination is activated, the data is retained at a buffer for a time period.

28. The memory device according to claim 27, wherein the data is transmitted to a second decoder after the time period has elapsed and the second decoder performs an additional decoding for the data.

29. The memory device according to claim 1, wherein, when the early termination is not activated, the data is transmitted to a first decoder and the first decoder performs the normal decoding for the data.

\* \* \* \* \*